(12) United States Patent
Mechi

(10) Patent No.: US 7,535,737 B2
(45) Date of Patent: May 19, 2009

(54) AC/AC MULTIPLE-PHASE POWER CONVERTER CONFIGURED TO BE MOUNTED ON A SUBSTRATE

(75) Inventor: Abdallah Mechi, Kusatsu (JP)

(73) Assignee: Daikin Industries, Ltd., Osaka (JP)

( * ) Notice: Subject to any disclaimer, the term of this patent is extended or adjusted under 35 U.S.C. 154(b) by 348 days.

(21) Appl. No.: 10/522,708

(22) PCT Filed: Jul. 30, 2003

(86) PCT No.: PCT/JP03/09623

§ 371 (c)(1),
(2), (4) Date: Aug. 19, 2005

(87) PCT Pub. No.: WO2004/012325

PCT Pub. Date: Feb. 5, 2004

(65) Prior Publication Data

US 2006/0126318 A1    Jun. 15, 2006

(30) Foreign Application Priority Data

Jul. 30, 2002  (JP) .............................. 2002-221916
Apr. 25, 2003  (JP) .............................. 2003-121038

(51) Int. Cl.
*H02M 5/458*  (2006.01)
(52) U.S. Cl. .................................. 363/37; 363/147
(58) Field of Classification Search .................. 363/34, 363/37, 147
See application file for complete search history.

(56) References Cited

U.S. PATENT DOCUMENTS 5,610,493 A * 3/1997 Wieloch ...................... 318/801
5,623,191 A * 4/1997 Wieloch ...................... 318/801
6,266,258 B1 * 7/2001 Babinski .................. 363/56.02
2002/0034089 A1   3/2002 Mori et al.
2003/0039134 A1   2/2003 Kolar
2007/0139978 A1 * 6/2007 Maeda et al. ................. 363/37

FOREIGN PATENT DOCUMENTS

JP         07-226660 A        8/1995

(Continued)

OTHER PUBLICATIONS

Olaf Simon, "Modern Solution for Industrial Matrix-Converter Applications", IEEE Transaction on Industrial Electronics, vol. 49, No. 2, Apr. 2002, p. 401-406.

(Continued)

*Primary Examiner*—Jeffrey L Sterrett
(74) *Attorney, Agent, or Firm*—Global IP Counselors

(57) ABSTRACT

An arrangement is provided a converter, an inverter, a smoothing condenser connected between the converter and the inverter, and reactors each connected between the connection point of each pair of IGBT switches of the converter and the output terminal of each phase of the AC power source. The converter has three pairs of IGBT switches for three phases that are serially connected to one another and connected in parallel to one another. First diodes are each connected in reversed polarity and in parallel to each IGBT switch. The inverter has three pairs of IGBT switches that are serially connected to one another and connected in parallel to one another. Each diode is connected in reversed polarity and in parallel to each IGBT switch.

9 Claims, 54 Drawing Sheets

FOREIGN PATENT DOCUMENTS

| | | |
|---|---|---|
| JP | 10-225138 A | 8/1998 |
| JP | 11-069774 A | 3/1999 |
| JP | 11-196576 A | 7/1999 |
| JP | 11-235051 A | 8/1999 |
| JP | 2000-102253 A | 4/2000 |
| JP | 2000-175462 A | 6/2000 |
| JP | 2001-314086 A | 11/2001 |
| JP | 202-238260 A | 8/2002 |
| WO | WO-98/10508 A1 | 3/1998 |
| WO | WO-01/50583 A1 | 7/2001 |

OTHER PUBLICATIONS

Patrick W. Wheeler, "Matrix converter; A Technology Review", IEEE Transaction on Industrial Ele.ctronics. vol. 49, No. 2, Apr. 2002, p. 276-288.

* cited by examiner

AC/AC MULTIPLE-PHASE POWER CONVERTER CONFIGURED TO BE MOUNTED ON A SUBSTRATE

FIELD OF THE INVENTION

The present invention relates to a power module for AC/AC power conversion. More particularly, the present invention relates to a power module for converting an AC voltage to a desired AC voltage using a converter and an inverter.

BACKGROUND INFORMATION

For long years, a power module with two switches or a power module with four switches was a device only which has been used excessively within the power conversion field. Main reasons for standardizing those power modules are for simplicity and for universal application. Such type of power modules are commercially supplied under various names such as an integrated gate bipolar transistor module "IGBT MOD", an intelligent module "ASIPM" for specific application, and a dual inline package intelligent power module "DIP-IPM". All the above example are developed to improve only conditions of load-side application. But, grid-side was always ignored because of lack of the reason for severe competition.

In recent years, EMC regulation and worldwide market economy have changed their conditions very rapidly. And, a new type of power module has introduced in the market.

First, a matrix module was introduced from Olaf Simon, et al, "Modern Solution for Industrial Matrix-Converter Applications", IEEE Transactions on Industrial Electronics pp/401-406, V61.49, No. 2, April 2002 and Patrick W. Wheeler, et al, "Matrix converter: A Technology Review", IEEE Transactions on Industrial Electronics pp/276-288, V61.49, No. 2, April 2002. As is illustrated in FIG. 1, this module intends AC-AC conversion in three phase.

Second, an active-filter intelligent power module "A/F IPM" was proposed from G Mjumdar, et al, "Intelligent power module applications", IEEJ Technical Report No. 842, pp. 13-19, June 2001. As is illustrated in FIG. 2, "A/F IPM" intends power factor correction on grid-side for single phase application.

Problems of prior power modules are as follows:

1) In general, due to the standard design, external circuits are required for a specific application such as power factor correction on grid-side;

2) The design should be changed according to each of application categories such as a power supply type (200V, 100V, 400V, . . . , or the like) and a load type such as a motor for 200V, or a motor for 400V. This results in increase in model types. This means the increase in cost of final products.

3) The proposed matrix module has advantage in that realization of three phase-three phase system can serve all systems. But, it cannot be applied to single phase/three phase system. Because the application is restricted only to three phase/three phase system and three phase/single phase system.

4) "A/F IPM" cannot be applied for three phase-three phase conversion for the purpose of specific applications.

The present invention was made in view of the above problems.

It is an object of the present invention to provide a power module which can easily be dealt with various types of power modules.

SUMMARY OF THE INVENTION

A power module for AC/AC power conversion of a first aspect is a power module in which multiple converter components constituting a multiple phase converter, multiple smoothing capacitors, and multiple inverter components constituting a multiple phase inverter can be mounted on a substrate which has been formed necessary wirings, the power module is arranged in that at least a part of converter components, at least a part of smoothing capacitors, and at least a part of inverter components complying with required specification of the power module are mounted on the substrate, and that necessary jumper means are provided.

A power module for AC/AC power conversion of a second aspect employs a three phase converter as the multiple phase converter, determines the number of smoothing capacitors to be 2, and employs a three phase inverter as the multiple phase inverter.

In a power module for AC/AC power conversion of a third aspect, the three phase converter comprises a pair of transistors serially connected to one another for each phase, and diodes each connected in parallel to each transistor, at least a part of diodes and/or at least a part of transistors and diodes complying with the required specification of the power module are mounted on the substrate, and necessary jumper means are provided. In a power module for AC/AC power conversion of a fourth aspect, the three phase converter comprises a pair of transistors serially connected to one another for each phase, and reflux diodes each connected in parallel to each of the transistors, at least a part of diodes and/or at least a part of transistors and diodes complying with the required specification of the power module are mounted on the substrate, and necessary jumper means are provided.

In a power module for AC/AC power conversion of a fifth aspect, the three phase converter comprises transistors serially connected to one another and a pair of first diodes reversely connected for each phase, and a diode bridge having a pair of connection points opposing to one another, each of the connection points being connected to the emitter terminal of the transistor and the collector terminal of the transistor, and having another pair of connection points which are determined to be input and output points, at least a part of transistors, the diode bridge, and the first diodes complying with the required specification of the power module are mounted on the substrate, and necessary jumper means are provided.

In a power module for AC/AC power conversion of a sixth aspect, the three phase converter comprises transistors serially connected to one another and a pair of first diodes reversely connected for each phase, and a diode bridge having a pair of connection points opposing to one another, each of the connection points being connected to the emitter terminal of the transistor and the collector terminal of the transistor, and having another pair of connection points which are determined to be input and output points, only at least a part of first diodes complying with the required specification of the power module are mounted on the substrate, and necessary jumper means are provided.

In a power module for AC/AC power conversion of a seventh aspect, the three phase converter comprises transistors serially connected to one another and a pair of first diodes reversely connected for each phase, and a diode bridge having a pair of connection points opposing to one another, each of the connection points being connected to the emitter terminal of the transistor and the collector terminal of the transistor, and having another pair of connection points which are determined to be input and output points, at least a part of transistors and the diode bridge complying with the required specification of the power module are mounted on the substrate, at least a part of first diodes complying with the required specification of the power module are mounted on the substrate, and necessary jumper means are provided.

In a power module for AC/AC power conversion of an eighth aspect, the three phase converter comprises transistors serially connected to one another and a pair of first diodes forwardly connected for each phase, and pairs of second diodes each reversely connected between the emitter terminal of the transistor and the collector terminal of the transistor, each pair of second diodes being serially connected to one another, at least a part of transistors and second diodes complying with the required specification of the power module are mounted on the substrate, at least a part of first diodes complying with the required specification of the power module are mounted on the substrate, and necessary jumper means are provided.

In a power module for AC/AC power conversion of a ninth aspect, the three phase converter comprises transistors serially connected to one another and a pair of first diodes forwardly connected for each phase, and pairs of second diodes each reversely connected between the emitter terminal of the transistor and the collector terminal of the transistor, each pair of second diodes being serially connected to one another, only at least a part of first diodes complying with the required specification of the power module are mounted on the substrate, and necessary jumper means are provided.

In a power module for AC/AC power conversion of a tenth aspect, only at least a part of diodes are mounted on the substrate, and a reactor is connected outside of the exterior between the converter and the smoothing capacitor.

In a power module for AC/AC power conversion of an eleventh aspect, only at least a part of first diodes are mounted on the substrate, and a reactor is connected outside of the exterior between the converter and the smoothing capacitor. In a power module for AC/AC power conversion of a twelfth aspect, a reactor is connected in parallel to the converter, and a third diode is reversely connected between the reactor and the smoothing capacitor. In a power module for AC/AC power conversion of a thirteenth aspect, a fourth diode is forwardly connected in parallel to the converter, and a reactor is connected between the fourth diode and the smoothing capacitor. A power module for AC/AC power conversion of a fourteenth aspect is a power module in which multiple converter components constituting a multiple phase converter, and multiple inverter components constituting a multiple phase inverter can be mounted on a substrate which has been formed necessary wirings, the power module is arranged in that at least a part of converter components, at least a part of smoothing capacitors, and at least a part of inverter components complying with required specification of the power module are mounted on the substrate, and that necessary jumper means are provided.

A power module for AC/AC power conversion of a fifteenth aspect further comprises junction means to which a smoothing capacitor can be connected.

A power module for AC/AC power conversion of a sixteenth aspect employs a three phase converter as the multiple phase converter which can be mounted on the substrate, and employs a three phase inverter as the multiple phase inverter which can be mounted on the substrate. In a power module for AC/AC power conversion of a seventeenth aspect, a three phase converter comprising a pair of transistors serially connected to one another for each phase, and diodes each connected in parallel to each transistor, is employed as the three phase converter, at least a part of diodes and/or at least a part of transistors and diodes complying with required specification of the power module are mounted on the substrate, and necessary jumper means are provided.

In a power module for AC/AC power conversion of an eighteenth aspect, a three phase converter comprising a pair of transistors serially connected to one another for each phase, and diodes each connected in parallel to each transistor, is employed as the three phase inverter, at least a part of transistors and diodes complying with required specification of the power module are mounted on the substrate, and necessary jumper means are provided.

In a power module for AC/AC power conversion of a nineteenth aspect, a three phase converter comprising transistors serially connected to one another and a pair of first diodes reversely connected for each phase, and a diode bridge having a pair of connection points opposing to one another, each of the connection points being connected to the emitter terminal of the transistor and the collector terminal of the transistor, and having another pair of connection points which are determined to be input and output points, is employed as the three phase converter, at least a part of transistors, the diode bridge, and the first diodes complying with the required specification of the power module are mounted on the substrate, and necessary jumper means are provided.

In a power module for AC/AC power conversion of a twentieth aspect, a three phase converter comprising transistors serially connected to one another and a pair of first diodes reversely connected for each phase, and a diode bridge having a pair of connection points opposing to one another, each of the connection points being connected to the emitter terminal of the transistor and the collector terminal of the transistor, and having another pair of connection points which are determined to be input and output points, is employed as the three phase converter, only at least a part of first diodes complying with the required specification of the power module are mounted on the substrate, and necessary jumper means are provided.

In a power module for AC/AC power conversion of a 21 st aspect, a three phase converter comprising transistors serially connected to one another and a pair of first diodes reversely connected for each phase, and a diode bridge having a pair of connection points opposing to one another, each of the connection points being connected to the emitter terminal of the transistor and the collector terminal of the transistor, and having another pair of connection points which are determined to be input and output points, is employed as the three phase converter, at least a part of transistors and the diode bridge complying with the required specification of the power module are mounted on the substrate, at least a part of first diodes complying with the required specification of the power module are mounted on the substrate, and necessary jumper means are provided.

In a power module for AC/AC power conversion of a 22nd aspect, a three phase converter comprises transistors serially connected to one another and a pair of first diodes forwardly connected for each phase, and pairs of second diodes each reversely connected between the emitter terminal of the transistor and the collector terminal of the transistor, each pair of second diodes being serially connected to one another, is employed as the three phase converter, at least a part of transistors and second diodes complying with the required specification of the power module are mounted on the substrate, at least a part of first diodes complying with the required specification of the power module are mounted on the substrate, and necessary jumper means are provided.

In a power module for AC/AC power conversion of a 23rd aspect, a three phase converter comprising transistors serially connected to one another and a pair of first diodes forwardly connected for each phase, and pairs of second diodes each reversely connected between the emitter terminal of the transistor and the collector terminal of the transistor, each pair of second diodes being serially connected to one another, is employed as the three phase converter, only at least a part of first diodes complying with the required specification of the power module are mounted on the substrate, and necessary jumper means are provided.

In a power module for AC/AC power conversion of a 24th or 25th aspect, only at least a part of diodes are mounted on the substrate, and junction means are provided for allowing the reactor being connected between the converter and the smoothing capacitor.

In a power module for AC/AC power conversion of a 26th aspect, only at least a part of first diodes are mounted on the substrate, and junction means are provided for allowing the reactor being connected between the converter and the smoothing capacitor.

In a power module for AC/AC power conversion of a 27th aspect, a reactor is connected in parallel to the converter, and a third diode is reversely connected between the reactor and the smoothing capacitor.

In a power module for AC/AC power conversion of a 28th aspect, a fourth diode is forwardly connected in parallel to the converter, and a reactor is connected between the fourth diode and the smoothing capacitor. In the power module for AC/AC power conversion of the first aspect, multiple converter components constituting the multiple phase converter, multiple smoothing capacitors, and multiple inverter components constituting the multiple phase inverter can be mounted on the substrate which has been formed necessary wirings, and the power module is arranged in that at least a part of converter components, at least a part of smoothing capacitors, and at least a part of inverter components complying with required specification of the power module are mounted on the substrate, and that necessary jumper means are provided. Therefore, various power modules such as a power module for multiple phase-multiple phase conversion, a power module for single phase-multiple phase conversion, and the like, can easily be realized.

In the power module for AC/AC power conversion of the second aspect, the three phase converter is employed as the multiple phase converter, the number of smoothing capacitors is determined to be 2, and the three phase inverter is employed as the multiple phase inverter. Therefore, various power modules such as a power module for three phase-three phase conversion, a power module for single phase-three phase conversion, and the like, can easily be realized.

In the power module for AC/AC power conversion of the third aspect, the three phase converter comprises the pair of transistors serially connected to one another for each phase, and diodes each connected in parallel to each transistor, at least a part of diodes and/or at least a part of transistors and diodes complying with the required specification of the power module are mounted on the substrate, and necessary jumper means are provided. Therefore, various power modules such as a power module for three phase-three phase conversion, a power module for single phase-three phase conversion, and the like, can easily be realized.

In the power module for AC/AC power conversion of the fourth aspect, the three phase converter comprises the pair of transistors serially connected to one another for each phase, and reflux diodes each connected in parallel to each of the transistors, at least a part of diodes and/or at least a part of transistors and diodes complying with the required specification of the power module are mounted on the substrate, and necessary jumper means are provided. Therefore, various power module can also and easily be realized which can satisfy the IEC regulation for harmonic current emissions.

In the power module for AC/AC power conversion of the fifth aspect, the three phase converter comprises transistors serially connected to one another and the pair of first diodes reversely connected for each phase, and the diode bridge having the pair of connection points opposing to one another, each of the connection points being connected to the emitter terminal of the transistor and the collector terminal of the transistor, and having another pair of connection points which are determined to be input and output points, at least a part of transistors, the diode bridge, and the first diodes complying with the required specification of the power module are mounted on the substrate, and necessary jumper means are provided. Therefore, various power module can also and easily be realized which can satisfy the IEC regulation for harmonic current emissions.

In the power module for AC/AC power conversion of the sixth aspect, the three phase converter comprises transistors serially connected to one another and the pair of first diodes reversely connected for each phase, and the diode bridge having the pair of connection points opposing to one another, each of the connection points being connected to the emitter terminal of the transistor and the collector terminal of the transistor, and having another pair of connection points which are determined to be input and output points, only at least a part of first diodes complying with the required specification of the power module are mounted on the substrate, and necessary jumper means are provided. Therefore, various power modules such as a power module for three phase-three phase conversion, a power module for single phase-three phase conversion, and the like, can easily be realized.

In the power module for AC/AC power conversion of the seventh aspect, the three phase converter comprises transistors serially connected to one another and the pair of first diodes reversely connected for each phase, and the diode bridge having the pair of connection points opposing to one another, each of the connection points being connected to the emitter terminal of the transistor and the collector terminal of the transistor, and having another pair of connection points which are determined to be input and output points, at least a part of transistors and the diode bridge complying with the required specification of the power module are mounted on the substrate, at least a part of first diodes complying with the required specification of the power module are mounted on the substrate, and necessary jumper means are provided. Therefore, various power module can also and easily be realized which can satisfy the IEC regulation for harmonic current emissions.

In the power module for AC/AC power conversion of the eighth aspect, the three phase converter comprises transistors serially connected to one another and the pair of first diodes forwardly connected for each phase, and pairs of second diodes each reversely connected between the emitter terminal of the transistor and the collector terminal of the transistor, each pair of second diodes being serially connected to one another, at least a part of transistors and second diodes complying with the required specification of the power module are mounted on the substrate, at least a part of first diodes complying with the required specification of the power module are mounted on the substrate, and necessary jumper means are provided. Therefore, various power module can also and easily be realized which can satisfy the IEC regulation for harmonic current emissions.

In the power module for AC/AC power conversion of the ninth aspect, the three phase converter comprises transistors serially connected to one another and the pair of first diodes forwardly connected for each phase, and pairs of second diodes each reversely connected between the emitter terminal of the transistor and the collector terminal of the transistor, each pair of second diodes being serially connected to one another, only at least a part of first diodes complying with the required specification of the power module are mounted on the substrate, and necessary jumper means are provided. Therefore, various power modules such as a power module for three phase-three phase conversion, a power module for single phase-three phase conversion, and the like, can easily be realized.

In the power module for AC/AC power conversion of the tenth aspect, only at least a part of diodes are mounted on the substrate, and the reactor is connected outside of the exterior between the converter and the smoothing capacitor. Therefore, harmonic components of power source are reduced by the reactor. Also, operations and effects similar to those of the third aspect and sixth aspect can be realized.

In the power module for AC/AC power conversion of the eleventh aspect, only at least a part of first diodes are mounted on the substrate, and the reactor is connected outside of the exterior between the converter and the smoothing capacitor. Therefore, harmonic components of power source are reduced by the reactor. Also, operations and effects similar to those of the ninth aspect can be realized.

In the power module for AC/AC power conversion of the twelfth aspect, the reactor is connected in parallel to the converter, and the third diode is reversely connected between the reactor and the smoothing capacitor. Therefore, step up-down in voltage can be realized. Also, operations and effects similar to those of the eighth aspect can be realized.

In the power module for AC/AC power conversion of the thirteenth aspect, the fourth diode is forwardly connected in parallel to the converter, and the reactor is connected between the fourth diode and the smoothing capacitor. Therefore, stepping-down in voltage can be realized. Also, operations and effects similar to those of the eighth aspect can be realized.

In the power module for AC/AC power conversion of the fourteenth aspect, multiple converter components constituting a multiple phase converter, and multiple inverter components constituting a multiple phase inverter can be mounted on the substrate which has been formed necessary wirings, and at least a part of converter components, at least a part of smoothing capacitors, and at least a part of inverter components complying with required specification of the power module are mounted on the substrate, and the necessary jumper means are provided. Therefore, various power modules such as a power module for multiple phase-multiple phase conversion, a power module for single phase-multiple phase conversion, and the like, can easily be realized.

In the power module for AC/AC power conversion of the fifteenth aspect, the junction means is further comprised to which a smoothing capacitor can be connected. Therefore, the power module can be dealt with a case where a smoothing capacitor is required. Also, operations and effects similar to those of the fourteenth aspect can be realized.

In the power module for AC/AC power conversion of the sixteenth aspect, the three phase converter is employed as the multiple phase converter which can be mounted on the substrate, and the three phase inverter is employed as the multiple phase inverter which can be mounted on the substrate. Therefore, various power modules such as a power module for three phase-three phase conversion, a power module for single phase-three phase conversion, and the like, can easily be realized.

In the power module for AC/AC power conversion of the seventeenth aspect, the three phase converter comprising the pair of transistors serially connected to one another for each phase, and the diodes each connected in parallel to each transistor, is employed as the three phase converter, at least a part of diodes and/or at least a part of transistors and diodes complying with required specification of the power module are mounted on the substrate, and necessary jumper means are provided. Therefore, various power modules such as a power module for three phase-three phase conversion, a power module for single phase-three phase conversion, and the like, can easily be realized.

In the power module for AC/AC power conversion of the eighteenth aspect, a three phase converter comprising the pair of transistors serially connected to one another for each phase, and diodes each connected in parallel to each transistor, is employed as the three phase inverter, at least a part of transistors and diodes complying with required specification of the power module are mounted on the substrate, and necessary jumper means are provided. Therefore, various power module can also and easily be realized which can satisfy the IEC regulation for harmonic current emissions.

In the power module for AC/AC power conversion of the nineteenth aspect, the three phase converter comprising transistors serially connected to one another and the pair of first diodes reversely connected for each phase, and the diode bridge having the pair of connection points opposing to one another, each of the connection points being connected to the emitter terminal of the transistor and the collector terminal of the transistor, and having another pair of connection points which are determined to be input and output points, is employed as the three phase converter, at least a part of transistors, the diode bridge, and the first diodes complying with the required specification of the power module are mounted on the substrate, and necessary jumper means are provided. Therefore, various power module can also and easily be realized which can satisfy the IEC regulation for harmonic current emissions.

In the power module for AC/AC power conversion of the twentieth aspect, the three phase converter comprising transistors serially connected to one another and the pair of first diodes reversely connected for each phase, and the diode bridge having the pair of connection points opposing to one another, each of the connection points being connected to the emitter terminal of the transistor and the collector terminal of the transistor, and having another pair of connection points which are determined to be input and output points, is employed as the three phase converter, only at least a part of first diodes complying with the required specification of the power module are mounted on the substrate, and necessary jumper means are provided. Therefore, various power modules such as a power module for three phase-three phase conversion, a power module for single phase-three phase conversion, and the like, can easily be realized.

In the power module for AC/AC power conversion of the 21st aspect, the three phase converter comprising transistors serially connected to one another and the pair of first diodes reversely connected for each phase, and the diode bridge having the pair of connection points opposing to one another, each of the connection points being connected to the emitter terminal of the transistor and the collector terminal of the transistor, and having another pair of connection points which are determined to be input and output points, is employed as the three phase converter, at least a part of transistors and the diode bridge complying with the required specification of the power module are mounted on the substrate, at least a part of first diodes complying with the required specification of the power module are mounted on the substrate, and necessary jumper means are provided. Therefore, various power module can also and easily be realized which can satisfy the IEC regulation for harmonic current emissions.

In the power module for AC/AC power conversion of the 22nd aspect, the three phase converter comprises transistors serially connected to one another and the pair of first diodes forwardly connected for each phase, and pairs of second diodes each reversely connected between the emitter terminal of the transistor and the collector terminal of the transistor, each pair of second diodes being serially connected to one another, is employed as the three phase converter, at least a part of transistors and second diodes complying with the required specification of the power module are mounted on the substrate, at least a part of first diodes complying with the required specification of the power module are mounted on the substrate, and necessary jumper means are provided. Therefore, various power module can also and easily be realized which can satisfy the IEC regulation for harmonic current emissions.

In the power module for AC/AC power conversion of the 23rd aspect, the three phase converter comprising transistors serially connected to one another and the pair of first diodes forwardly connected for each phase, and pairs of second diodes each reversely connected between the emitter terminal of the transistor and the collector terminal of the transistor, each pair of second diodes being serially connected to one another, is employed as the three phase converter, only at least a part of first diodes complying with the required specification of the power module are mounted on the substrate, and necessary jumper means are provided. Therefore, various power modules such as a power module for three phase-three phase conversion, a power module for single phase-three phase conversion, and the like, can easily be realized.

In the power module for AC/AC power conversion of the 24th or 25th aspect, only at least a part of diodes are mounted on the substrate, and, junction means are provided for allowing the reactor being connected between the converter and the smoothing capacitor. Therefore, harmonic components of power source are reduced by the reactor. Also, operations and effects similar to those of the seventeenth aspect and twentieth aspect can be realized.

In the power module for AC/AC power conversion of the 26th aspect, only at least a part of first diodes are mounted on the substrate, and junction means are provided for allowing the reactor being connected between the converter and the smoothing capacitor. Therefore, harmonic components of power source are reduced by the reactor. Also, operations and effects similar to those of the 23rd aspect can be realized.

In the power module for AC/AC power conversion of the 27th aspect, the reactor is connected in parallel to the converter, and the third diode is reversely connected between the reactor and the smoothing capacitor. Therefore, step up-down in voltage can be realized. Also, operations and effects similar to those of the 22nd aspect can be realized.

In the power module for AC/AC power conversion of the 28th aspect, the fourth diode is forwardly connected in parallel to the converter, and the reactor is connected between the fourth diode and the smoothing capacitor. Therefore, stepping-down in voltage can be realized. Also, operations and effects similar to those of the 22nd aspect can be realized.

DETAILED DESCRIPTION OF THE PREFERRED EMBODIMENTS

Hereinafter, referring to the attached drawings, we describe in detail a power module for AC/AC power conversion of an embodiment according to the present invention.

The present invention comprises three types of power modules for AC/AC power conversion.

(A) A first type of power module is based upon boost type topology.

(B) A second type of power module is based upon boost three level type topology.

(C) A third type of power module is based upon buck/boost current source type topology.

Each of the proposed three power modules can be used in different situation by adding/removing respective necessary/unnecessary individual device.

Figure 1:
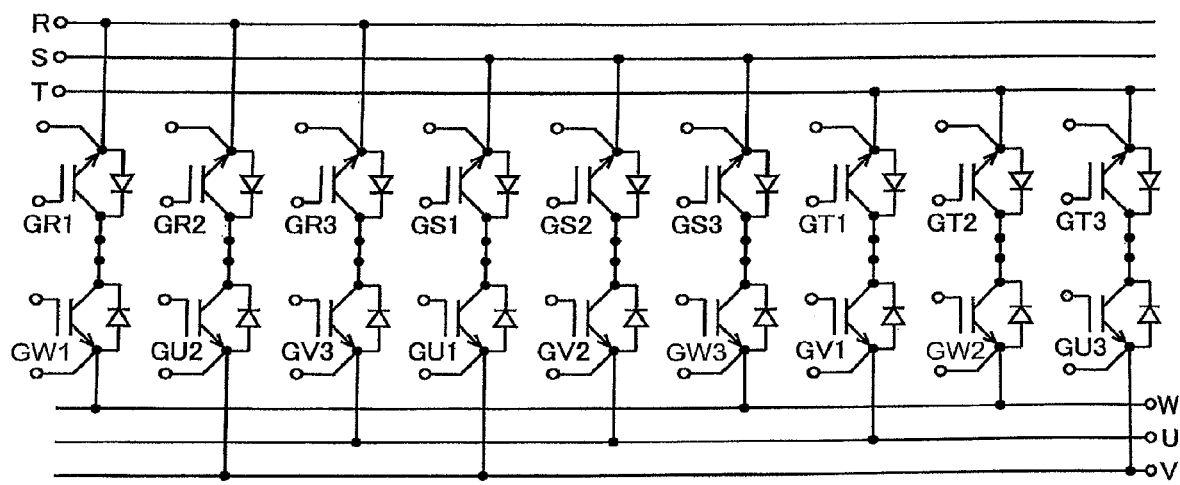
FIG. 1 is an electric circuit diagram illustrating a conventional three phase-three phase power module.
Figure 2:
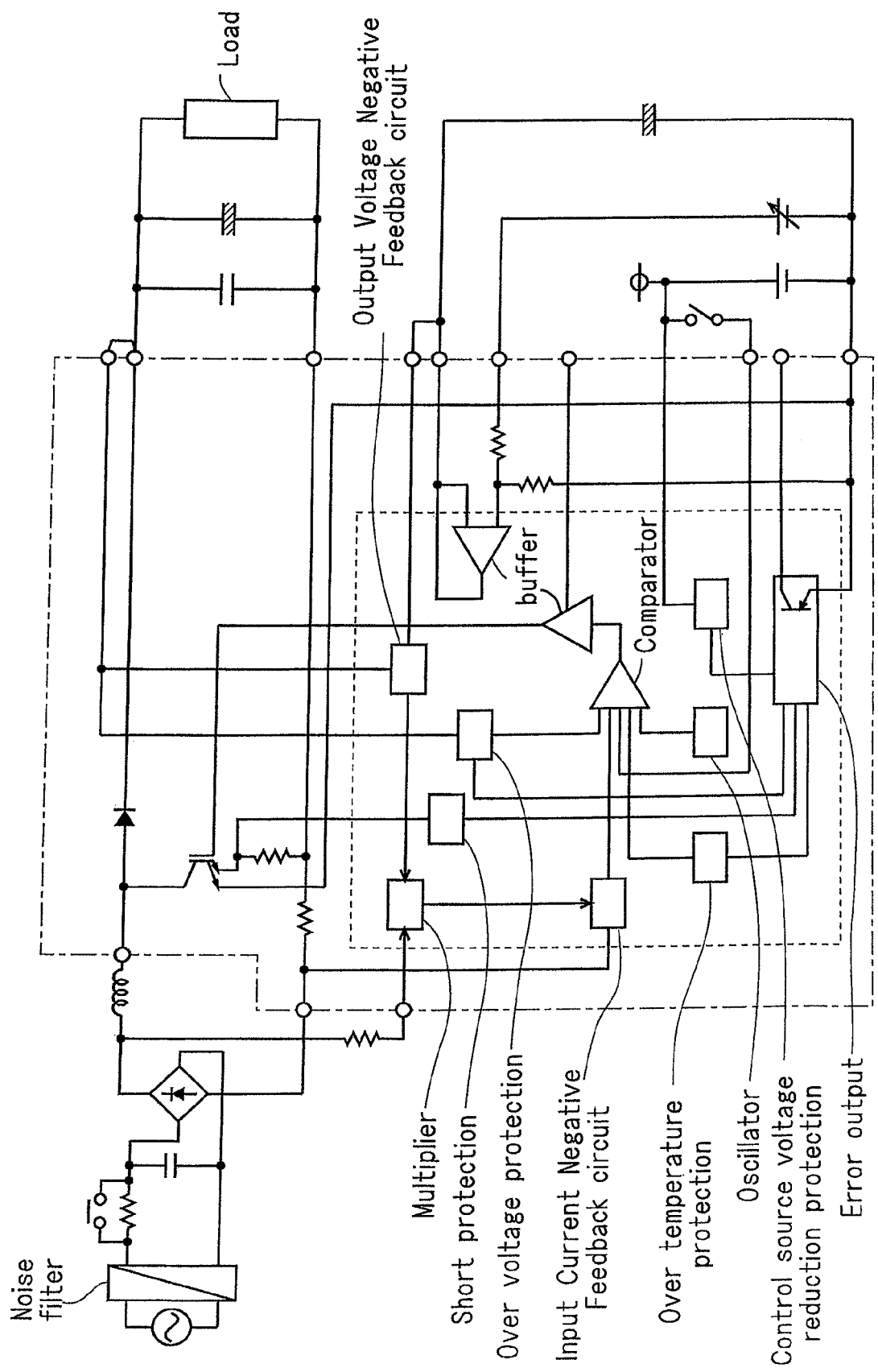
FIG. 2 is a block diagram illustrating a conventional active filter power module.
Figure 3:
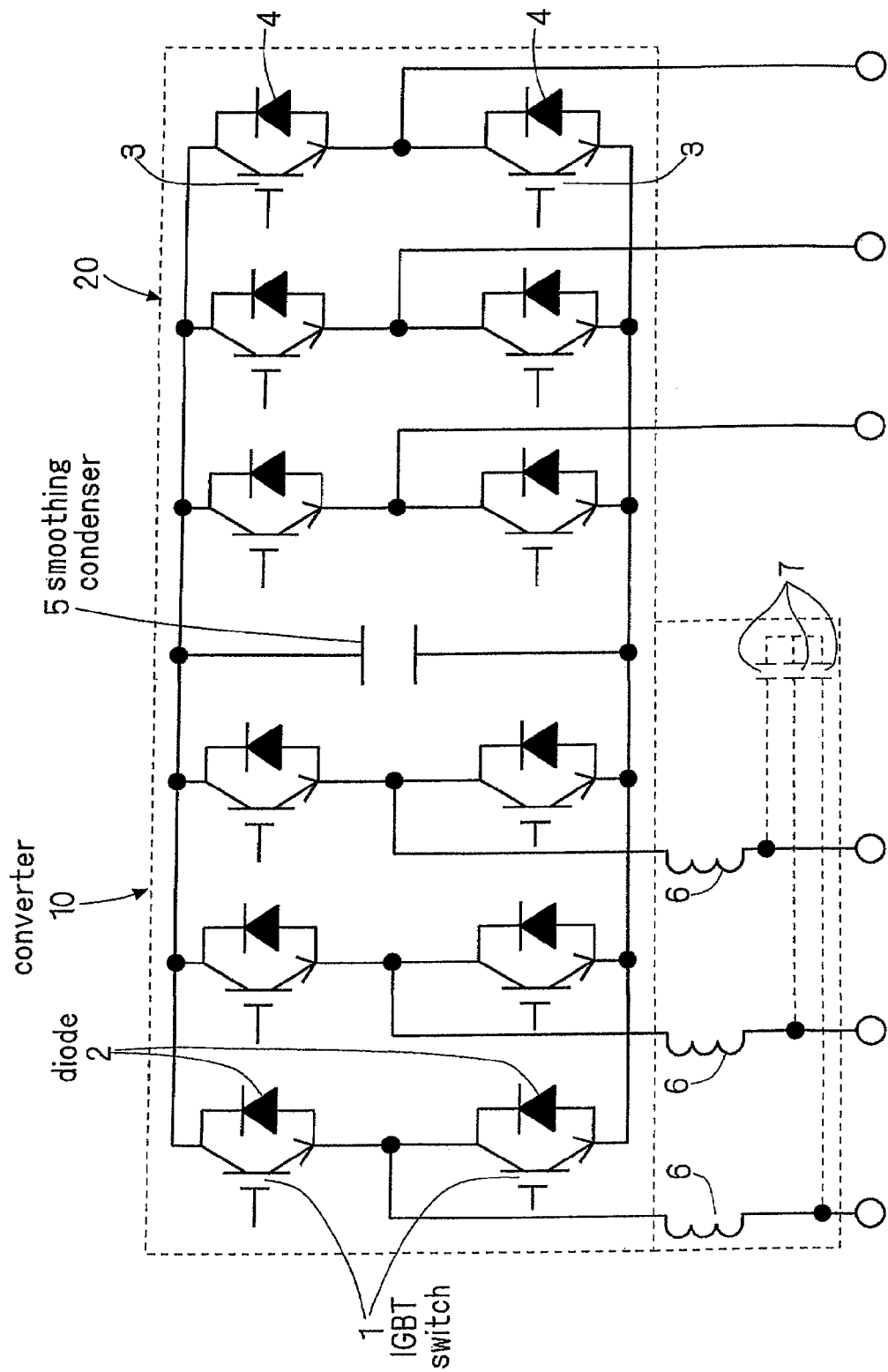
FIG. 3 is an electric circuit diagram illustrating a basic topology of a first type of a power module.

(A) The First Type:

FIG. 3 illustrates a basic power conversion module for converting a three phase AC power source with a constant voltage and constant frequency into a three phase AC output power source with a variable voltage and variable frequency control system. The basic power conversion module comprises an AC/DC conversion section (converter) 10, a DC/AC conversion section (inverter) 20, a smoothing capacitor 5 connected between the converter 10 and the inverter 20, and reactors 6 each connected between the connection point of each pair of IGBT switches 1 of the converter 10 and the output terminal of each phase of the AC power source. And, a capacitor 7 is connected between the input terminals, as it is required.

The AC/DC conversion section (converter) 10 comprises three pairs of IGBT switches 1, each pair of IGBT switches being serially connected to one another and each pair of IGBT switches being connected in parallel to one another, and first diodes 2 each being connected in reversed polarity and in parallel to each IGBT switch 1.

The DC/AC conversion section (inverter) 20 comprises three pairs of IGBT switches 3, each pair of IGBT switches being serially connected to one another and each pair of IGBT switches being connected in parallel to one another, and diodes 4 each being connected in reversed polarity and in parallel to each IGBT switch 3.

Figure 4:
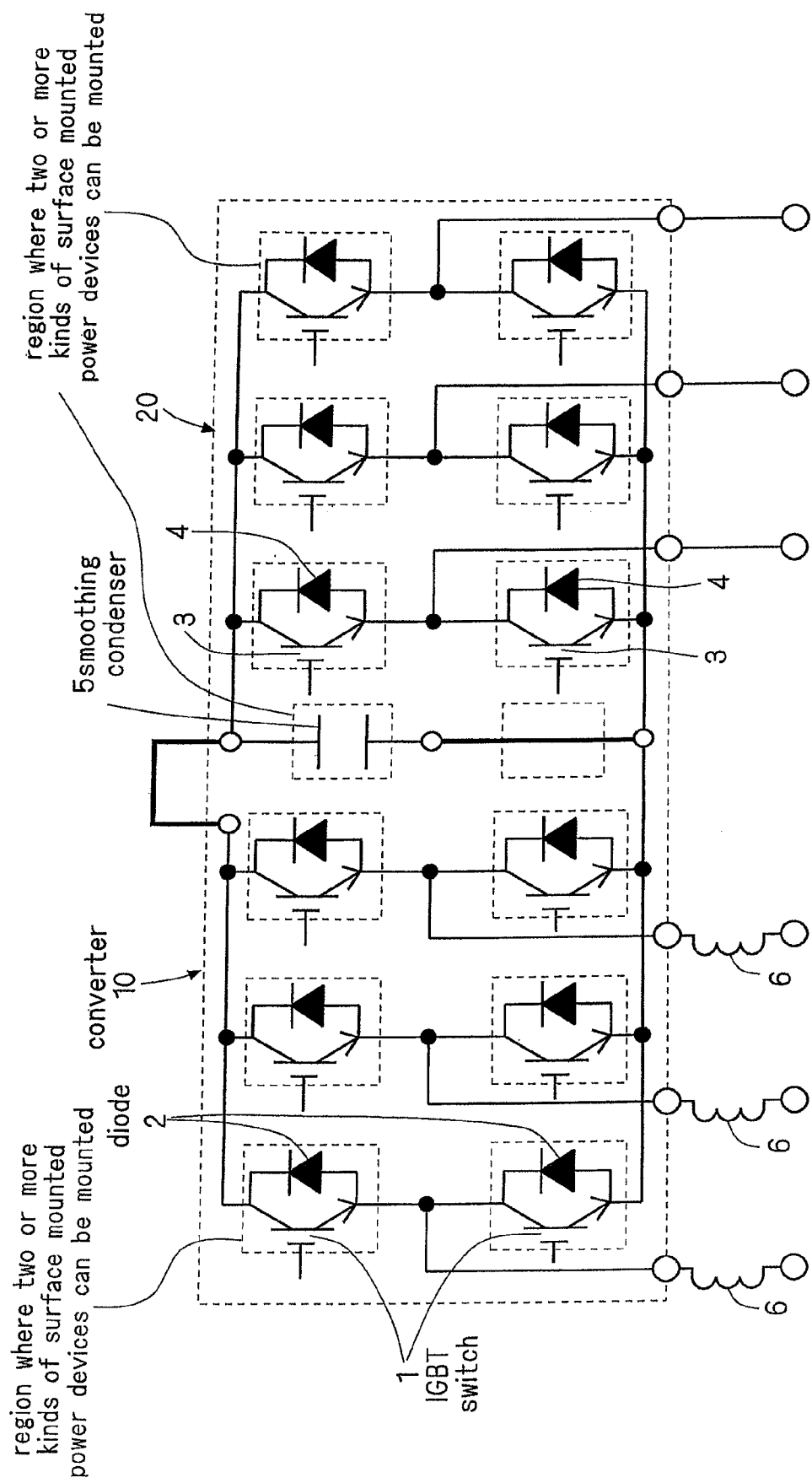
FIG. 4 is a schematic diagram of an arrangement example of a first type of a power module.

As is illustrated in FIG. 4, the proposed three phase-three phase system is integrated into one module using surface mounted IGBT devices similar to the integrated IGBT standard module. The surface mounted IGBT device is designed according to the input and output requirements indicated in Table 1.

|                    | Load side   |            |
| ------------------ | ----------- | ---------- |
| Power source side  | 200 V       | 400 V      |
| 200 V (Japan)      | Possible    | Possible   |
| 400 V (Europe)     | Impossible  | Possible   |

The proposed three phase-three phase power module can be modified by changing only the type of a surface mounted power device according to the requirement of the following specific applications. A thick solid line represents a jumper line in each of the following figures.

(1) A three phase-three phase power module of FIG. 4 is constituted of 12 surface mounted diodes 2, 4 and surface mounted IGBT switches 1, 3. A surface mounted smoothing capacitor 5 on one side is omitted. By controlling the IGBT switches 1, 3, the harmonic component currents in grid side is reduced, the DC link voltage is controlled, and the power is regenerated from the load to the power source.

Figure 32:
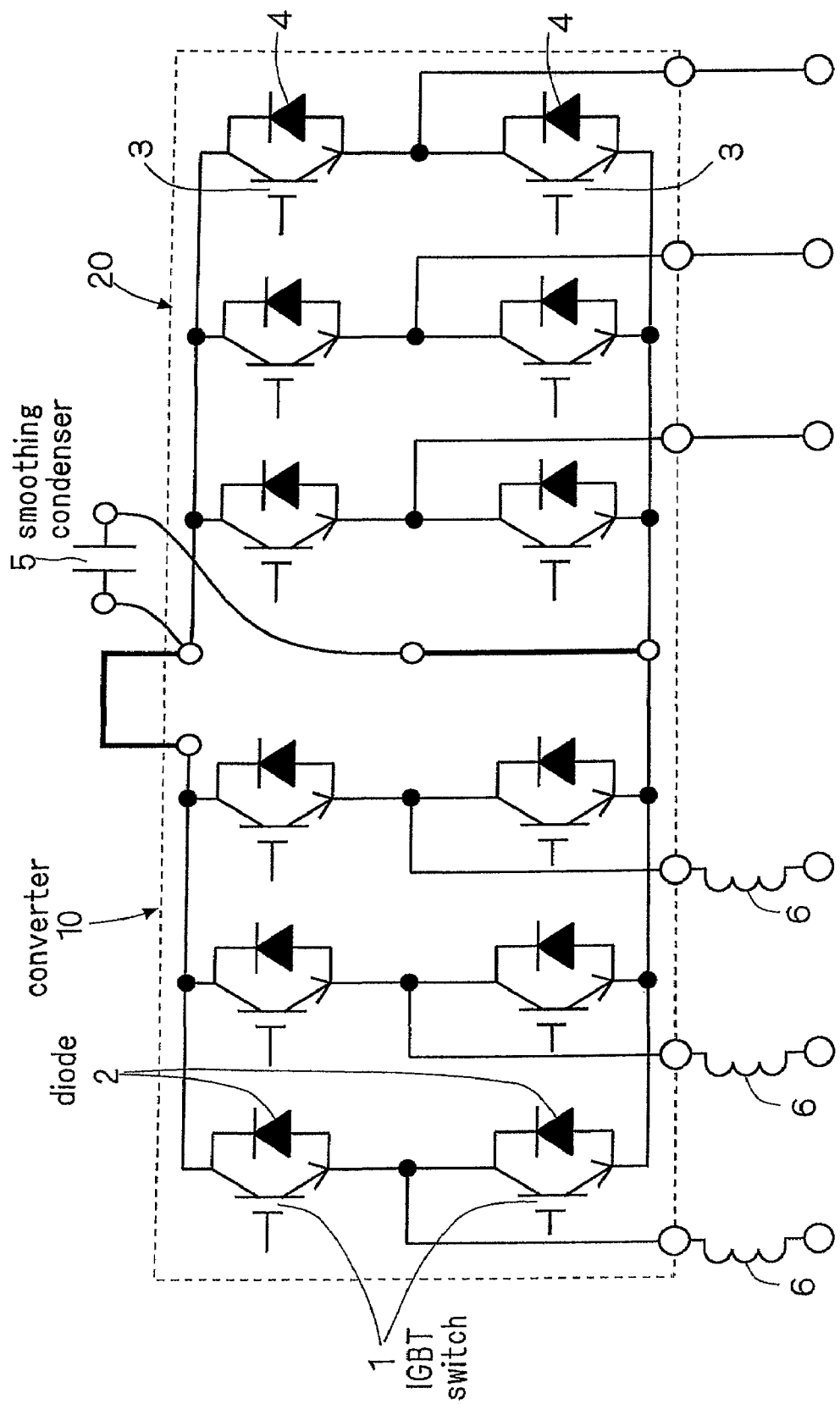
FIG. 32 is a schematic diagram of a modified example of the power module illustrated in FIG. 4.

A three phase-three phase power module of FIG. 32 is different from the three phase-three phase power module of FIG. 4 only in that the smoothing capacitor 5 is connected from outside through junction sections (lead wires). Therefore, by controlling the IGBT switches 1, 3, the harmonic component currents in grid side is reduced, the DC link voltage is controlled, and the power is regenerated from the load to the power source.

Figure 7:
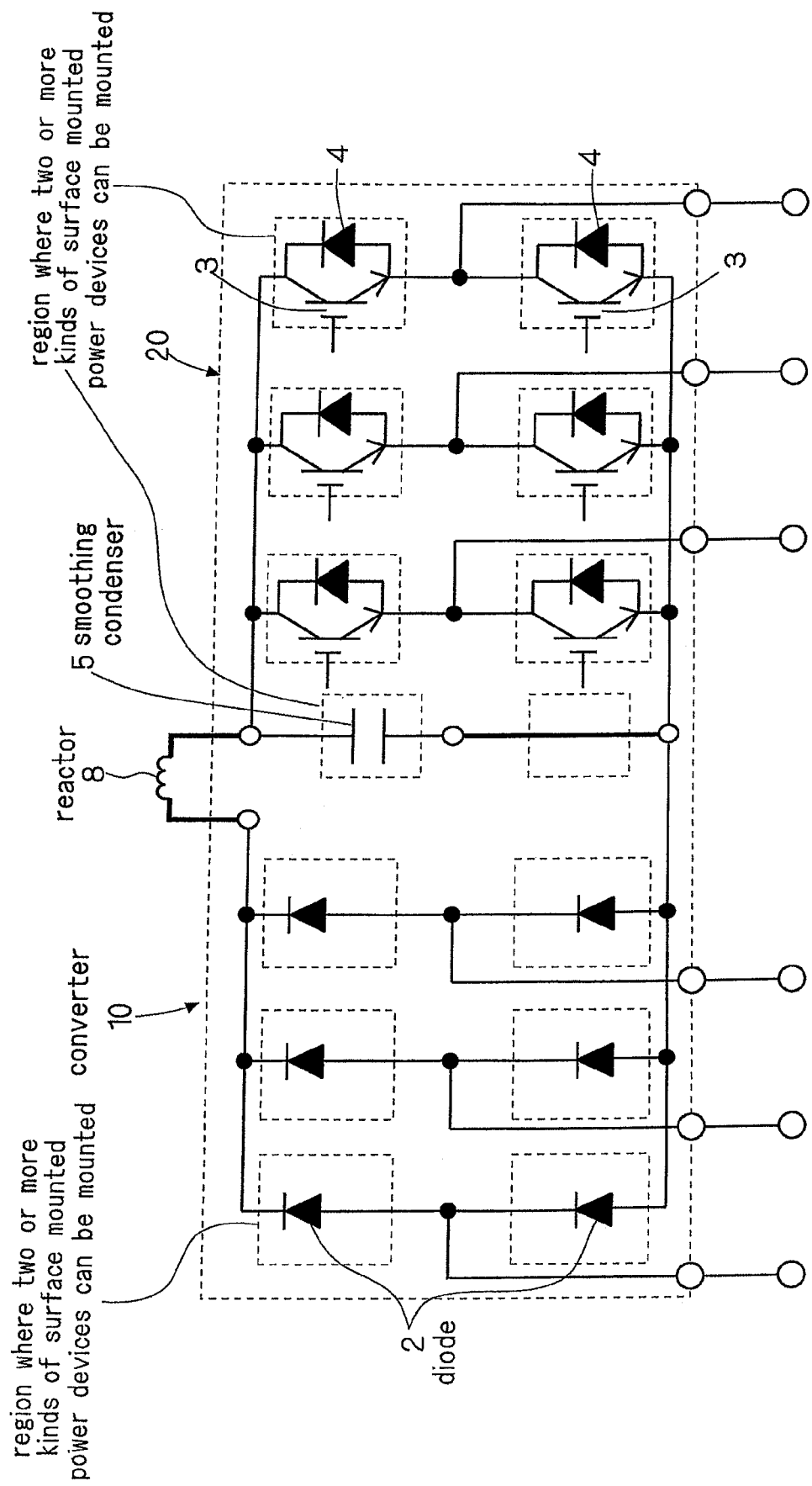
FIG. 7 is a schematic diagram of a further arrangement example of a first type of a power module.

(2) A three phase-three phase power module of FIG. 7 is consisted of 6 surface mounted diodes 2 on grid side as a converter 10, and 4 surface mounted diodes 4 and surface mounted IGBT switches 3 on load side as an inverter 20. The arrangement is employed for applications which take only efficiency into consideration. A reactor 8 is connected from outside between the converter 10 and the smoothing capacitor 5 instead connecting the reactor 6 on the input side of the converter 10.

Figure 35:
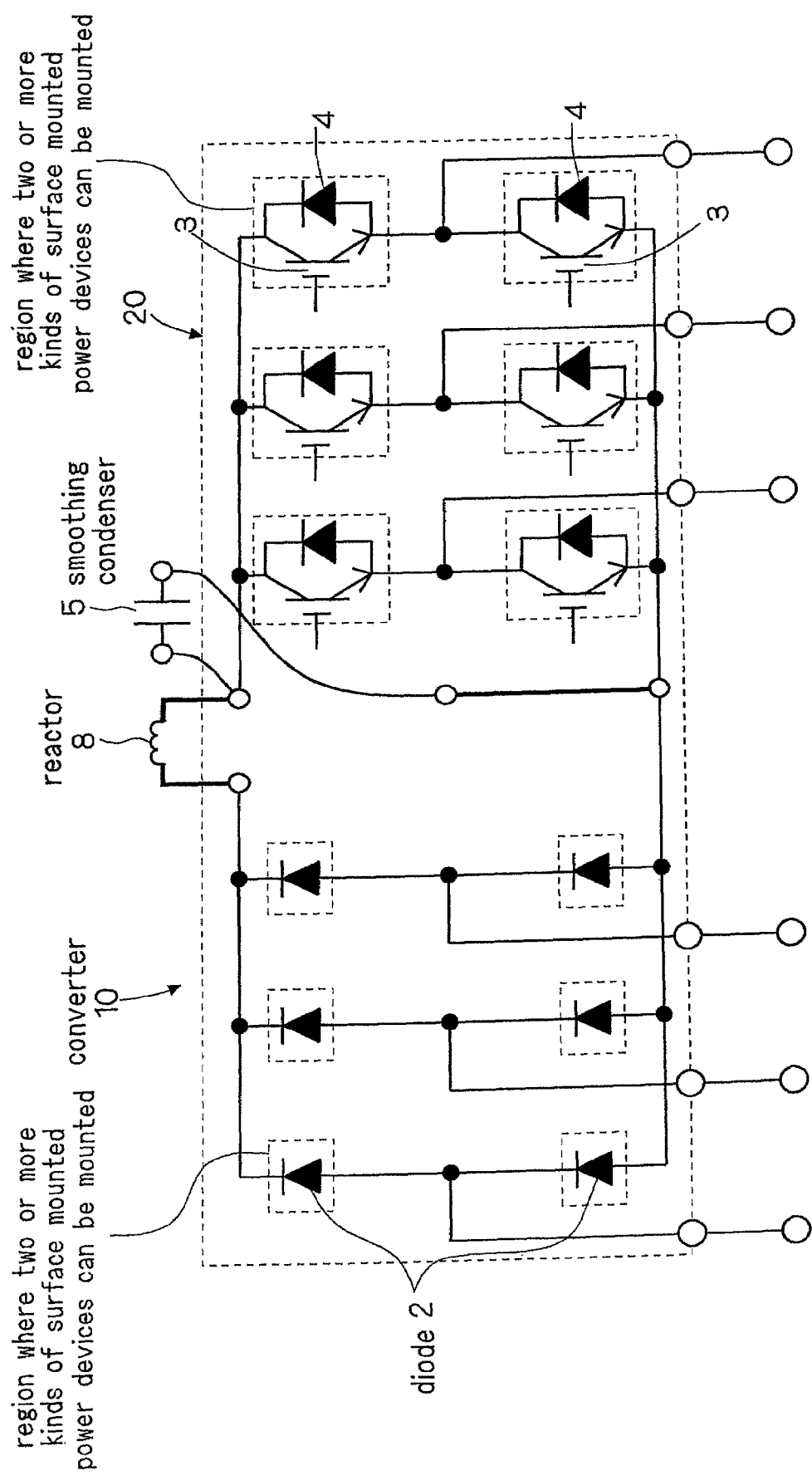
FIG. 35 is a schematic diagram of a modified example of the power module illustrated in FIG. 7.

A three phase-three phase power module of FIG. 35 is different from the three phase-three phase power module of FIG. 7 only in that the smoothing capacitor 5 is connected from outside through junction sections (lead wires). Therefore, the arrangement is also employed for applications which take only efficiency into consideration.

Figure 5:
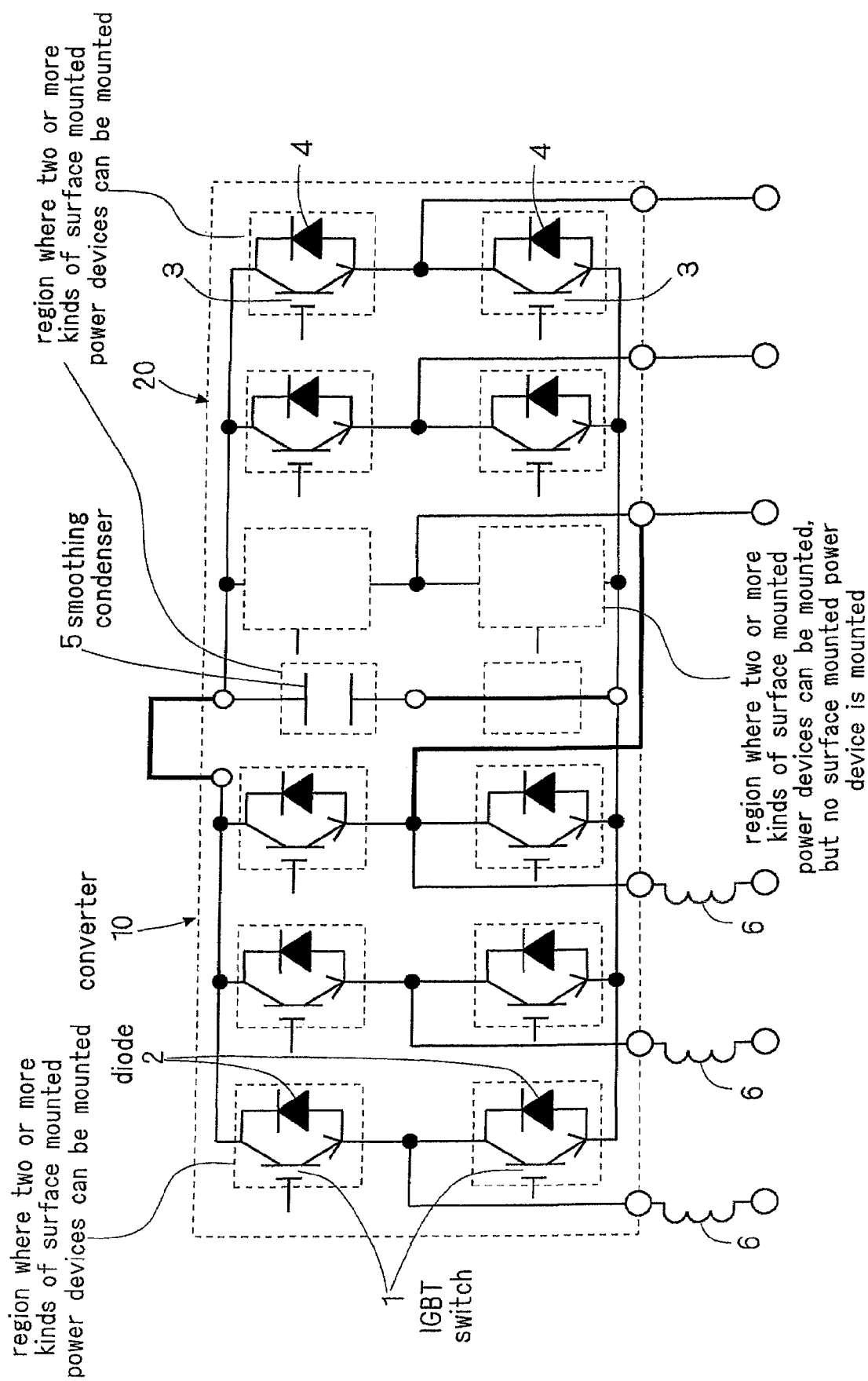
FIG. 5 is a schematic diagram of another arrangement example of a first type of a power module.

(3) A three phase-three phase power module of FIG. 5 is consisted of 10 surface mounted IGBT switches 1, 3. 6 IGBT switches among 10 IGBT switches are in a converter 10 on grid side, while remaining 4 IGBT switches 3 are in an inverter 20 on load side. By controlling the IGBT switches 1, 3, the harmonic component currents in grid side is reduced, the DC link voltage is controlled, and the power is regenerated from the load to the power source.

Also, the switching loss is reduced and the efficiency is increased by decreasing the IGBT switches 3 on load side by 2.

Figure 33:
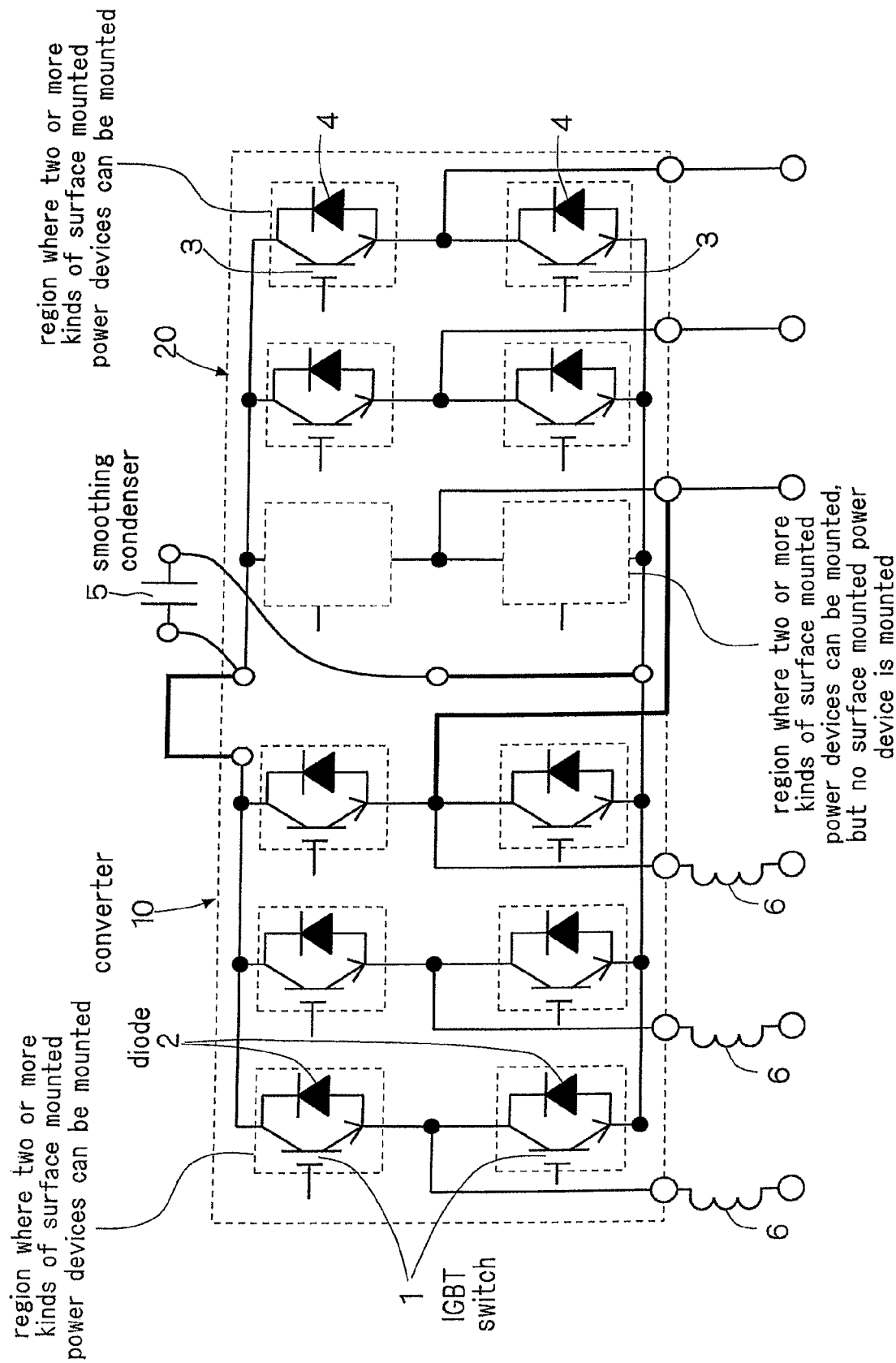
FIG. 33 is a schematic diagram of a modified example of the power module illustrated in FIG. 5.

A three phase-three phase power module of FIG. 33 is different from the three phase-three phase power module of FIG. 5 only in that the smoothing capacitor 5 is connected from outside through junction sections (lead wires).

Therefore, by controlling the IGBT switches 1, 3, the harmonic component currents in grid side is reduced, the DC link voltage is controlled, and the power is regenerated from the load to the power source.

Also, the switching loss is reduced and the efficiency is increased by decreasing the IGBT switches 3 on load side by 2.

Figure 6:
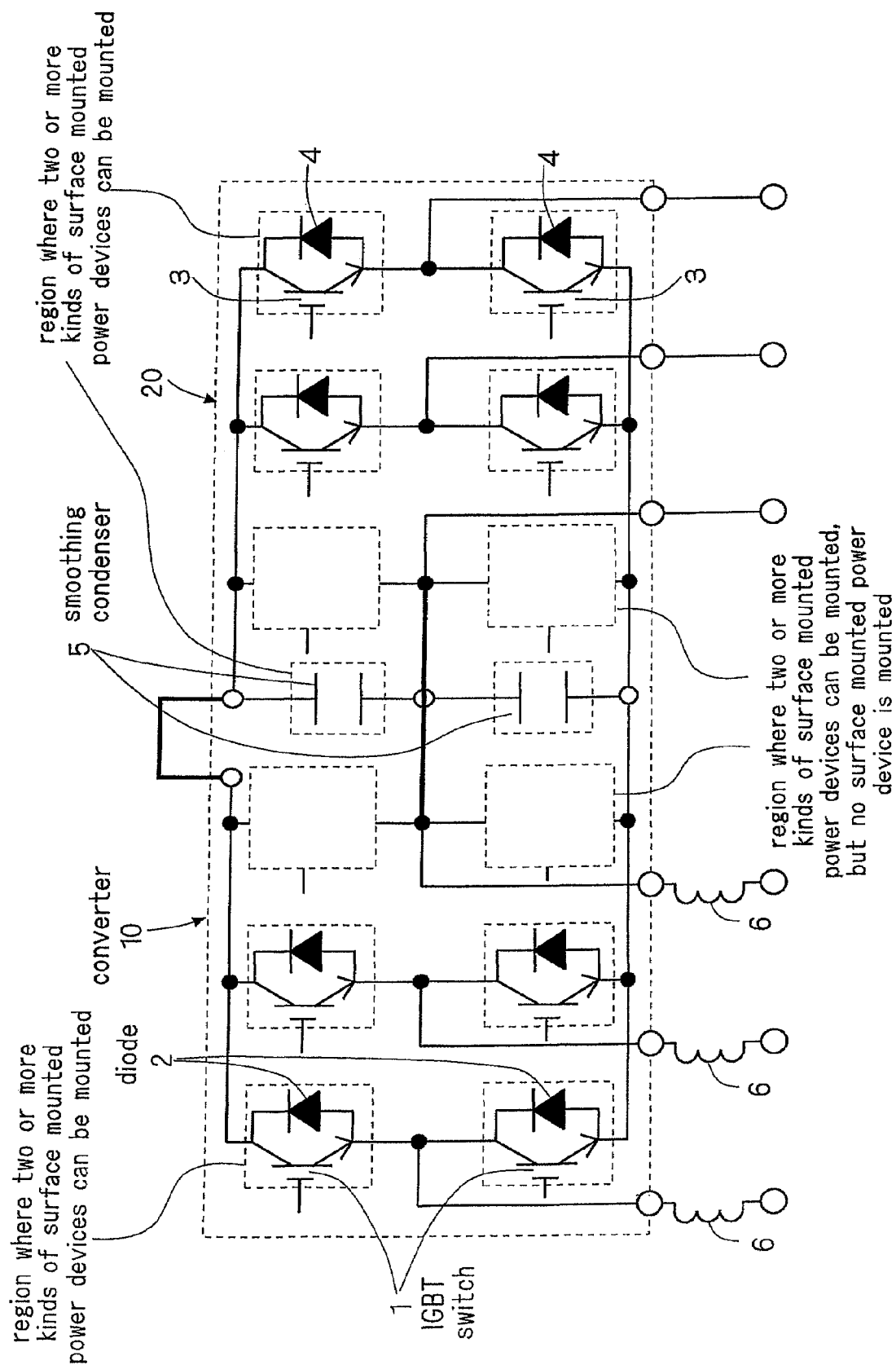
FIG. 6 is a schematic diagram of a further arrangement example of a first type of a power module.

(4) A three phase-three phase power module of FIG. 6 is consisted of 8 surface mounted IGBT switches 1, 3. 4 IGBT switches among 8 IGBT switches are in a converter 10 on grid side, while remaining 4 IGBT switches 3 are in an inverter 20 on load side. The voltage multiplying operation can be carried out because 2 smoothing capacitors 5 are serially connected to one another.

By controlling the IGBT switches 1, 3, the harmonic component currents in grid side is reduced, the DC link voltage is controlled, and the power is regenerated from the load to the power source.

Figure 34:
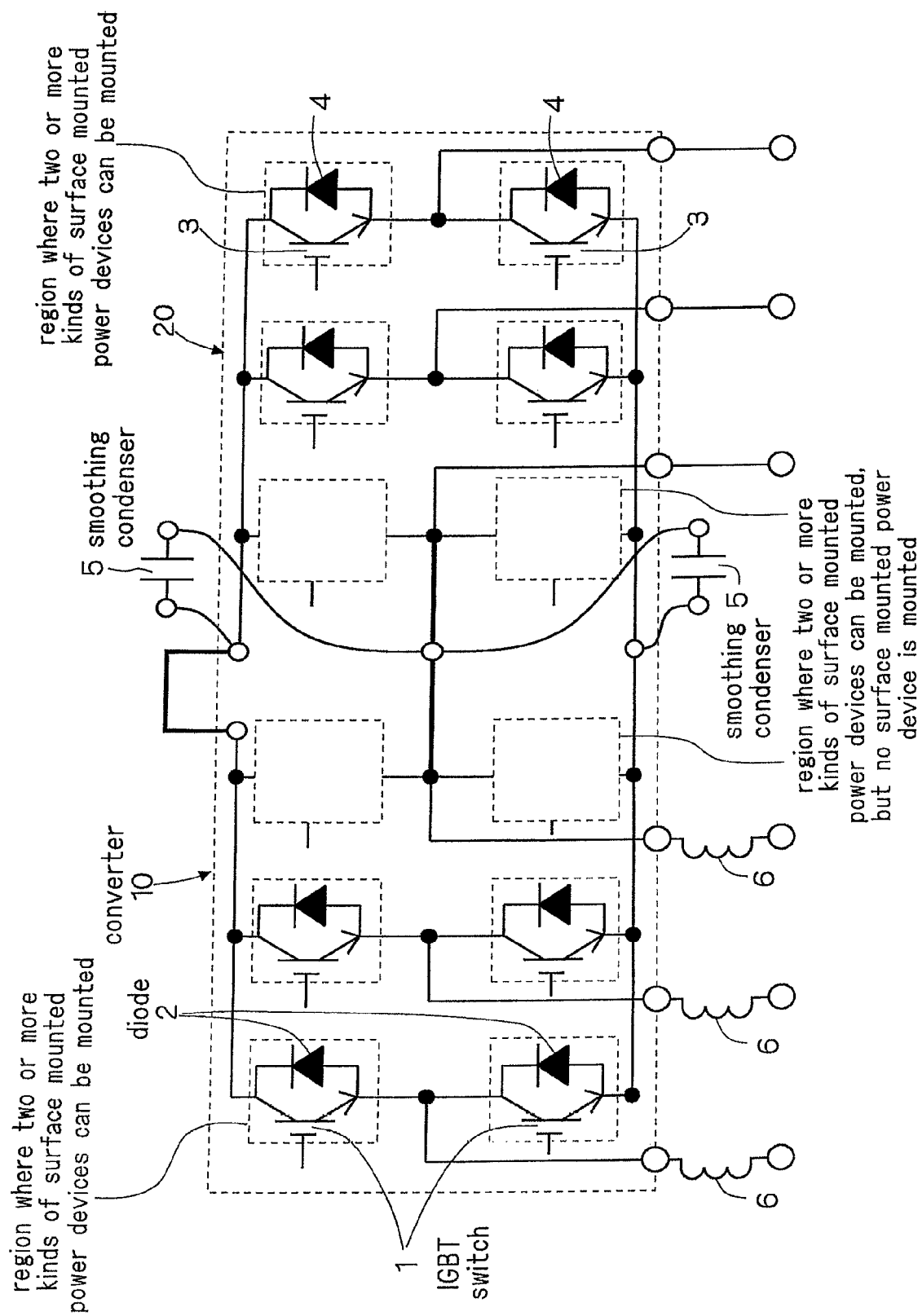
FIG. 34 is a schematic diagram of a modified example of the power module illustrated in FIG. 6.

Also, the switching loss is reduced and the efficiency is increased by decreasing the IGBT switches 3 on load side and load side by 4. A three phase-three phase power module of FIG. 34 is different from the three phase-three phase power module of FIG. 6 only in that the smoothing capacitor 5 is connected from outside through junction sections (lead wires).

Therefore, by controlling the IGBT switches 1, 3, the harmonic component currents in grid side is reduced, the DC link voltage is controlled, and the power is regenerated from the load to the power source.

Also, the switching loss is reduced and the efficiency is increased by decreasing the IGBT switches 3 on load side and load side by 4.

The above three phase-three phase power module can be modified into a single phase-three phase power module by changing only the type of a surface mounted power device according to the requirement of the following specific applications.

Figure 8:
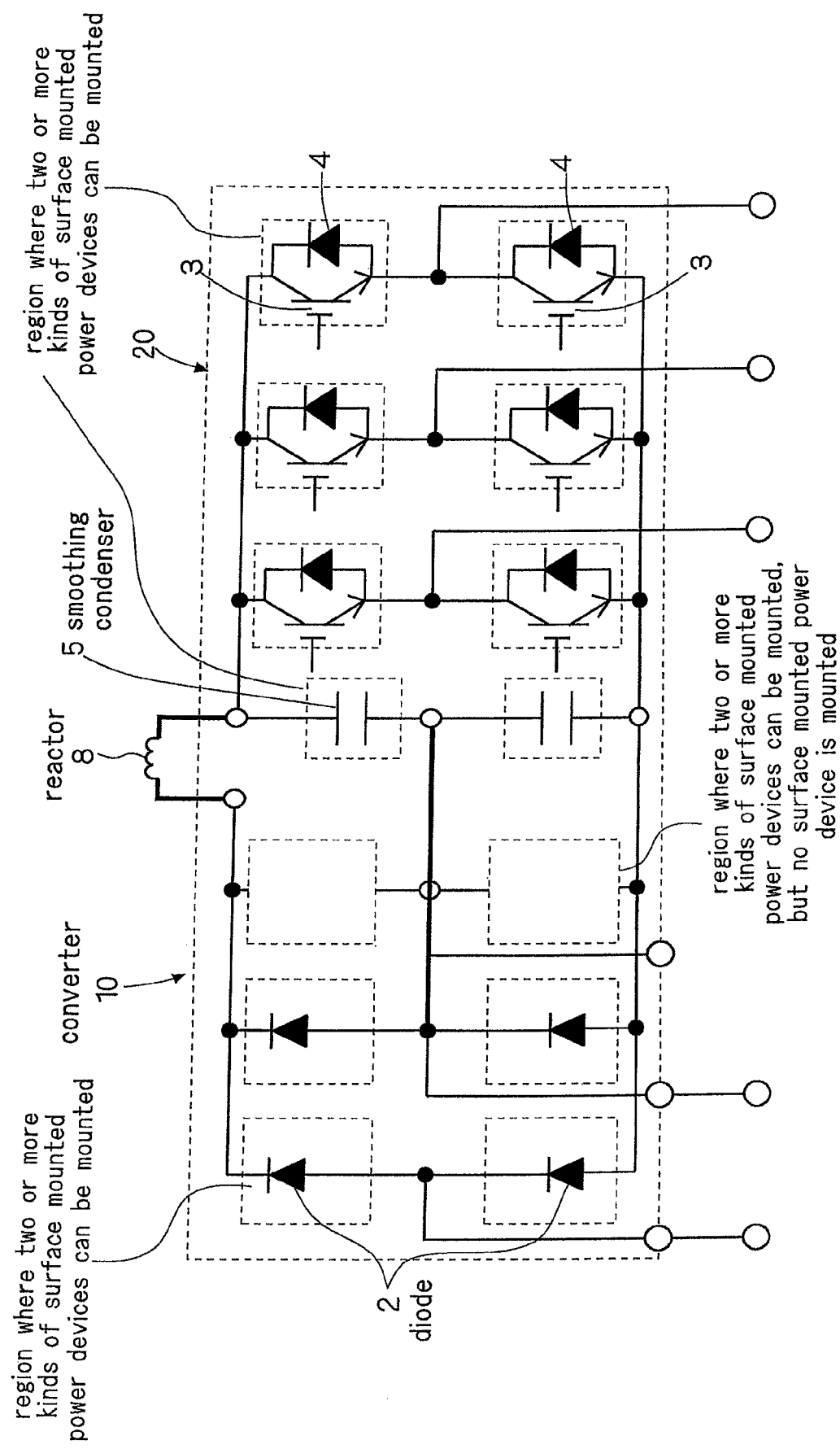
FIG. 8 is a schematic diagram of a further arrangement example of a first type of a power module.

(1) A single phase-three phase power module of FIG. 8 is constituted of 4 surface mounted diodes 2 of a converter 10 on grid side, and 6 surface mounted diodes 4 and 6 surface mounted IGBT switches 3 of an inverter 20 on load side. As is illustrated in FIG. 8, the power module uses the voltage doubling topology to increase the output voltage (a pair of surface mounted smoothing capacitors 5 are serially connected to one another). The single phase-three phase power module is employed for applications in which input power source is low (for example, 100V in Japan) and the IEC regulation is not effective. A reactor 8 is connected from outside between the converter 10 and the smoothing capacitor 5 instead connecting the reactor 6 on the input side of the converter 10.

Figure 36:
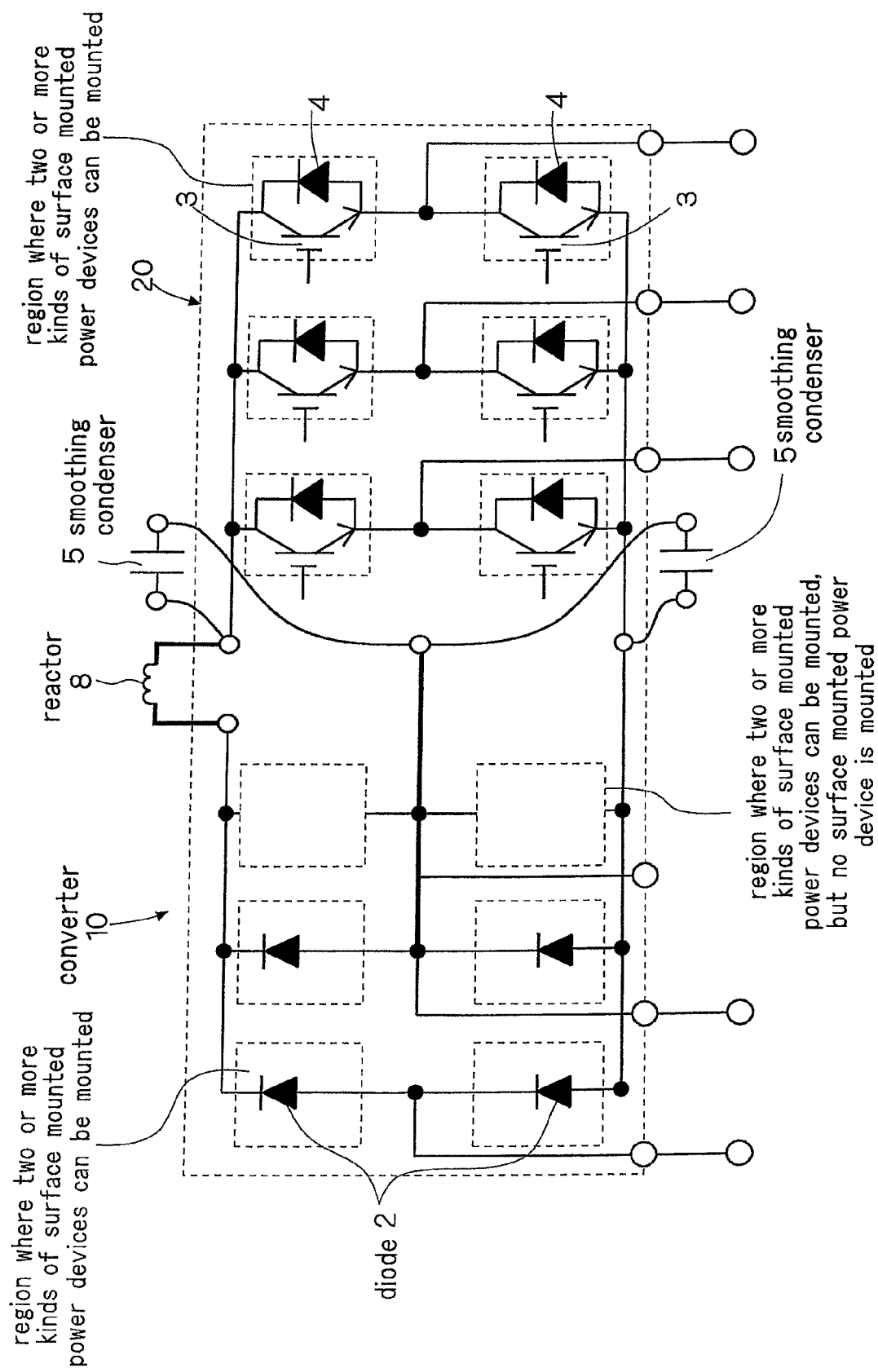
FIG. 36 is a schematic diagram of a modified example of the power module illustrated in FIG. 8.

A single phase-three phase power module of FIG. 36 is different from the single phase-three phase power module of FIG. 8 only in that the smoothing capacitor 5 is connected from outside through junction sections (lead wires). Therefore, the single phase-three phase power module is employed for applications in which input power source is low (for example, 100V in Japan) and the IEC regulation is not effective.

Figure 9:
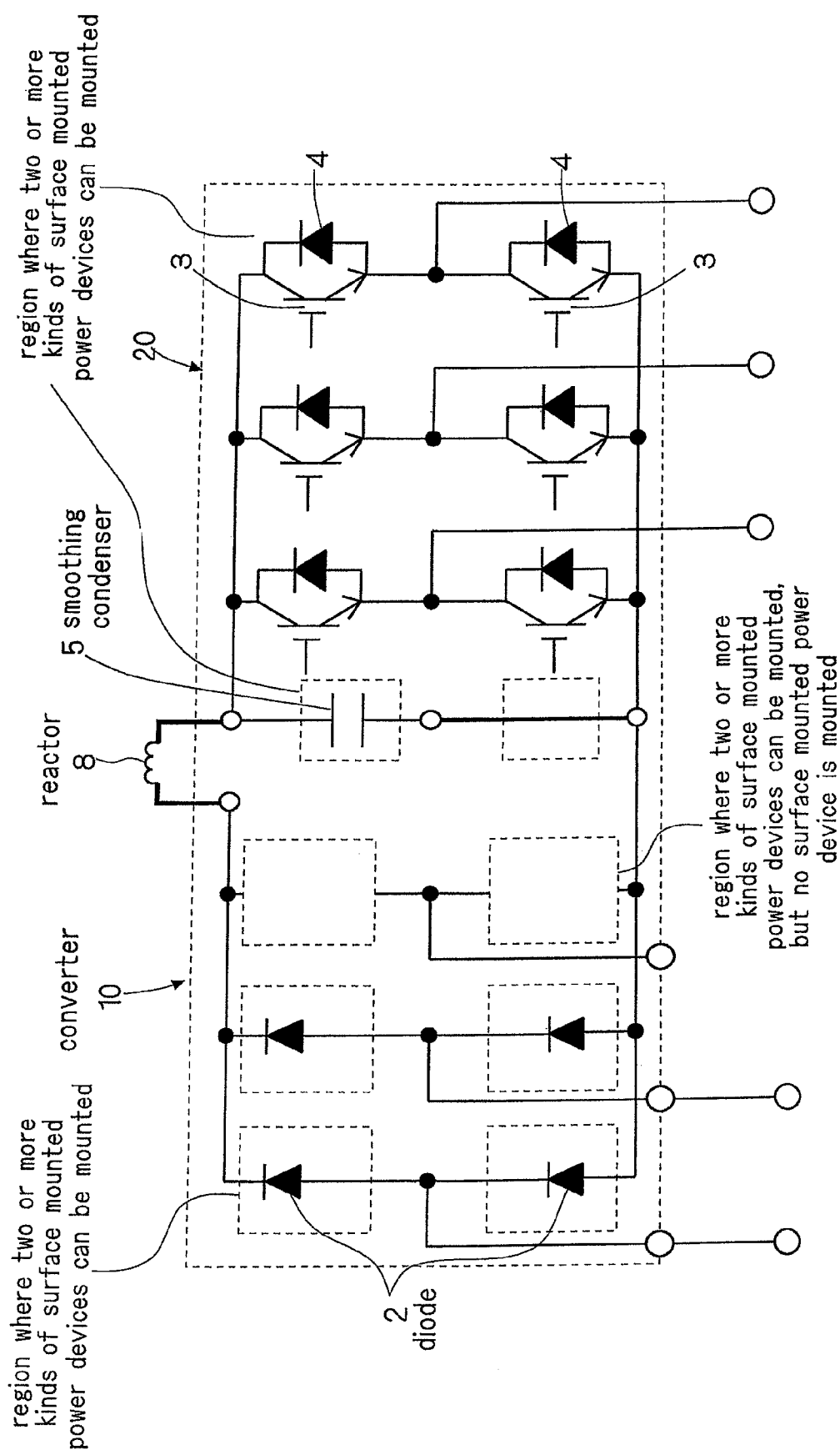
FIG. 9 is a schematic diagram of a further arrangement example of a first type of a power module.

(2) A single phase-three phase power module of FIG. 9 is constituted of 4 surface mounted diodes 2 of a converter 10 on grid side, and 6 surface mounted diodes 4 and 6 surface mounted IGBT switches 3 of an inverter 20 on load side.

Therefore, the single phase-three phase power module is employed for applications in which the IEC regulation is not effective. A reactor 8 is connected from outside between the converter 10 and the smoothing capacitor 5 instead connecting the reactor 6 on the input side of the converter 10.

Figure 37:
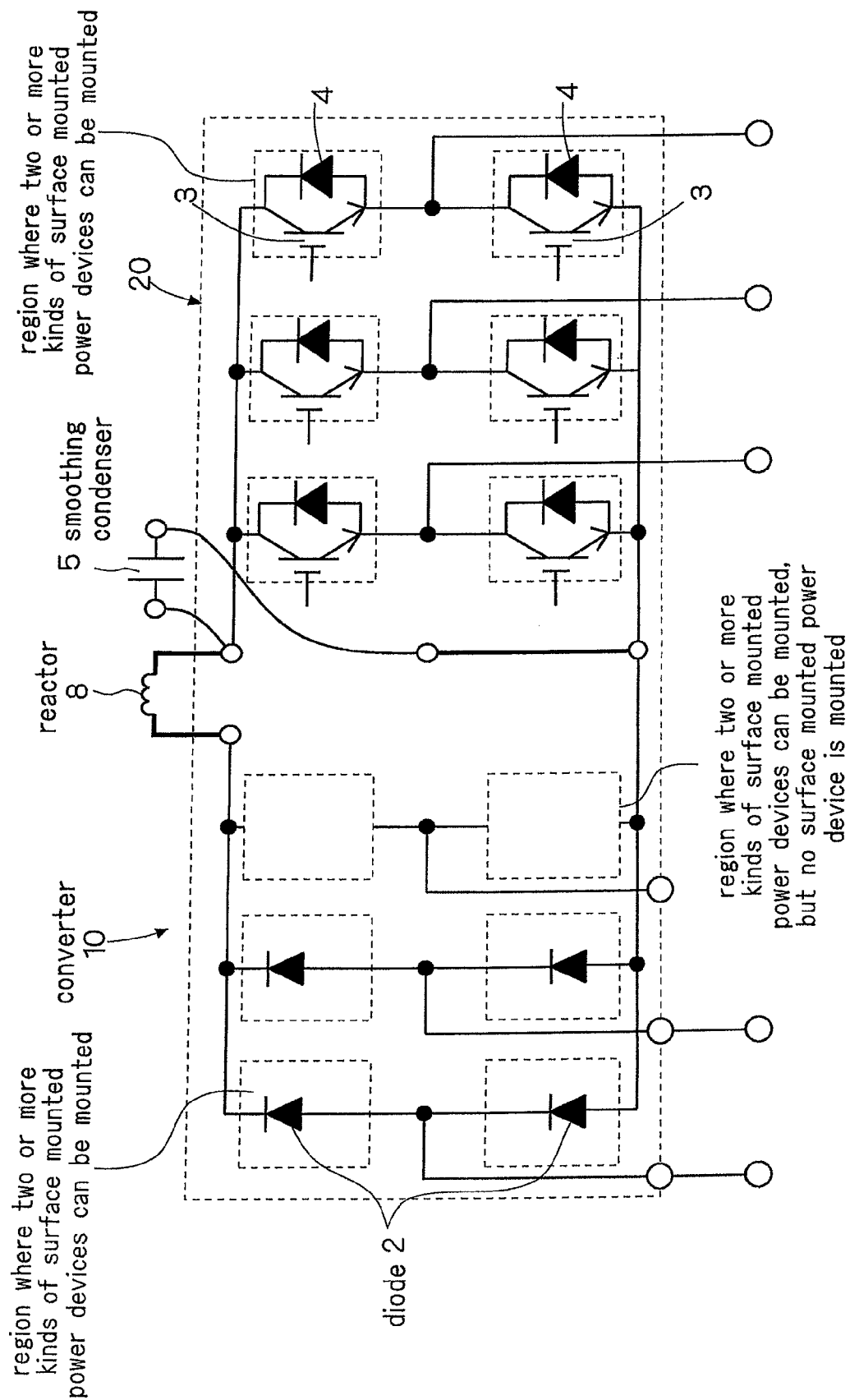
FIG. 37 is a schematic diagram of a modified example of the power module illustrated in FIG. 9.

A single phase-three phase power module of FIG. 37 is different from the single phase-three phase power module of FIG. 9 only in that the smoothing capacitor 5 is connected from outside through junction sections (lead wires). Therefore, the single phase-three phase power module is employed for applications in which the IEC regulation is not effective. A reactor 8 is connected from outside between the converter 10 and the smoothing capacitor 5 instead connecting the reactor 6 on the input side of the converter 10.

Figure 10:
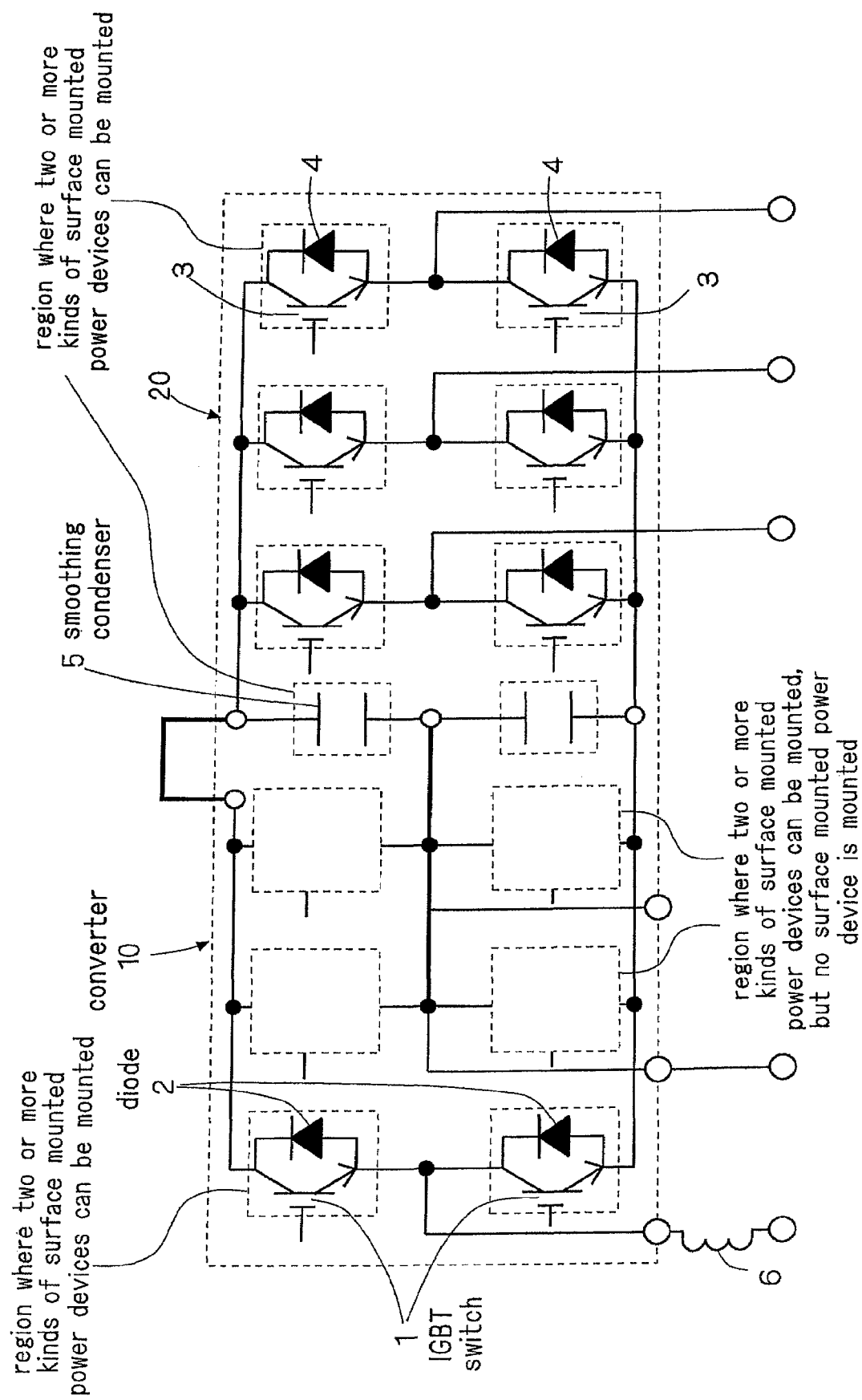
FIG. 10 is a schematic diagram of a further arrangement example of a first type of a power module.

(3) A single phase-three phase power module of FIG. 10 is constituted of 2 surface mounted diodes 2 and 2 surface mounted IGBT switches 1 of a converter 10 on grid side, and 6 surface mounted diodes 4 and 6 surface mounted IGBT switches 3 of an inverter 20 on load side. As is illustrated in FIG. 10, the power module uses the voltage doubling topology to increase the output voltage (a pair of surface mounted smoothing capacitors 5 are serially connected to one another). The single phase-three phase power module is employed for applications in which input power source is low (for example, 100V in Japan) and the IEC regulation is effective.

Figure 38:
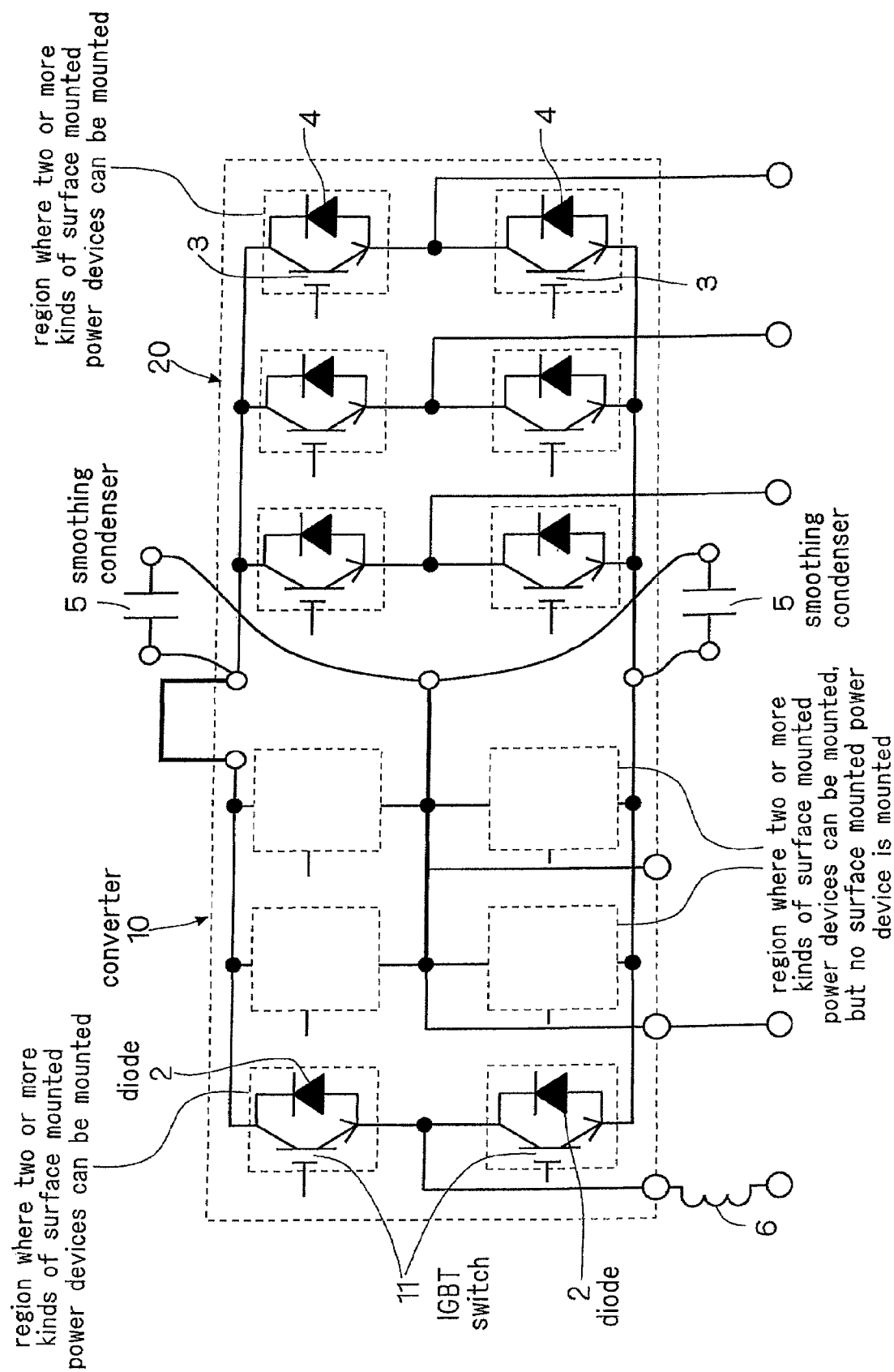
FIG. 38 is a schematic diagram of a modified example of the power module illustrated in FIG. 10.

A single phase-three phase power module of FIG. 38 is different from the single phase-three phase power module of FIG. 10 only in that the smoothing capacitor 5 is connected from outside through junction sections (lead wires). Therefore, the single phase-three phase power module is employed for applications in which input power source is low (for example, 100V in Japan) and the IEC regulation is effective.

Figure 11:
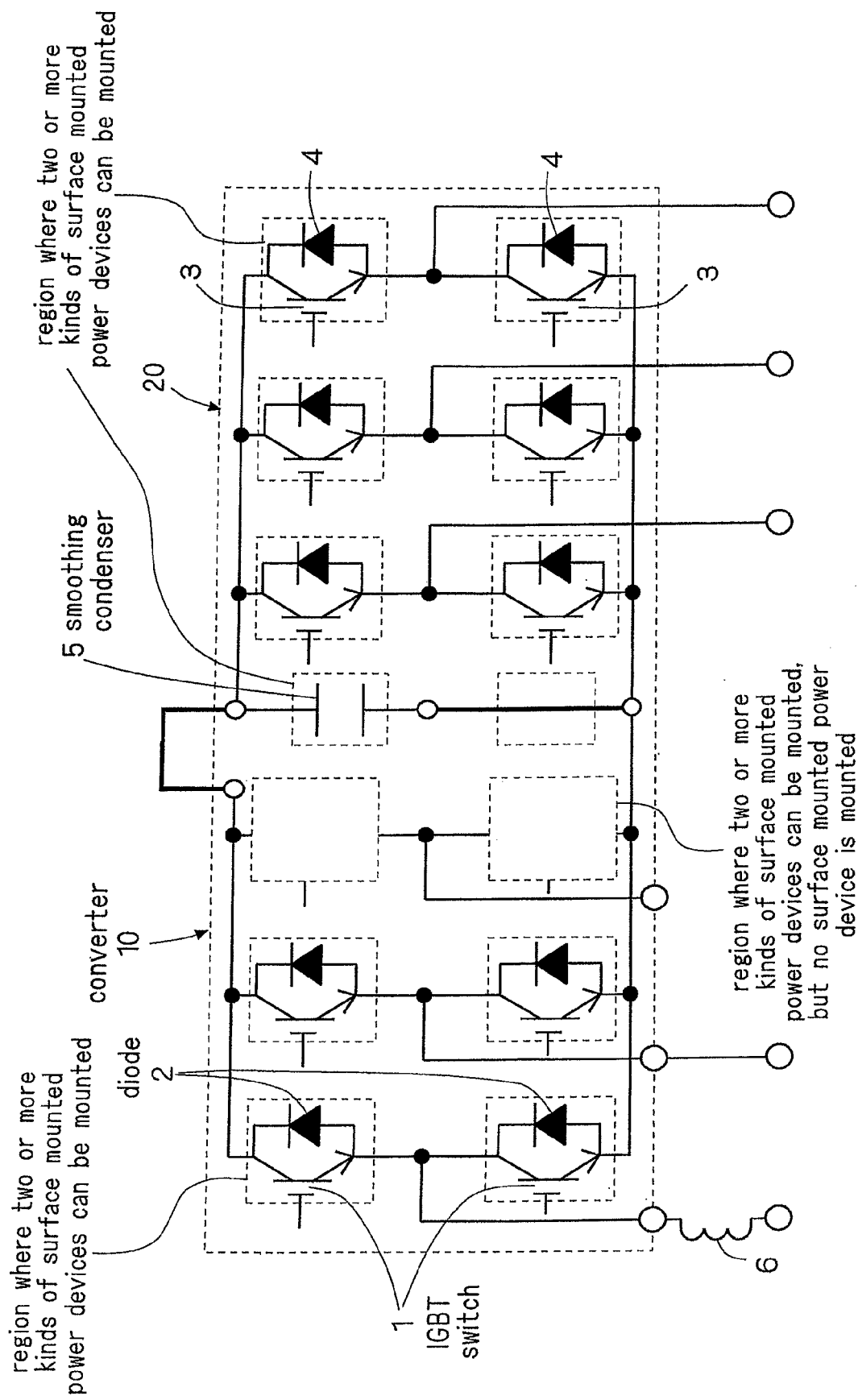
FIG. 11 is a schematic diagram of a further arrangement example of a first type of a power module.

(4) A single phase-three phase power module of FIG. 11 is constituted of 4 surface mounted IGBT switches 1 and 4 surface mounted diodes 2 of a converter 10 on grid side, and 6 surface mounted diodes 4 and 6 surface mounted IGBT switches 3 of an inverter 20 on load side.

Therefore, the single phase-three phase power module is employed for applications in which the IEC regulation is not effective.

Figure 39:
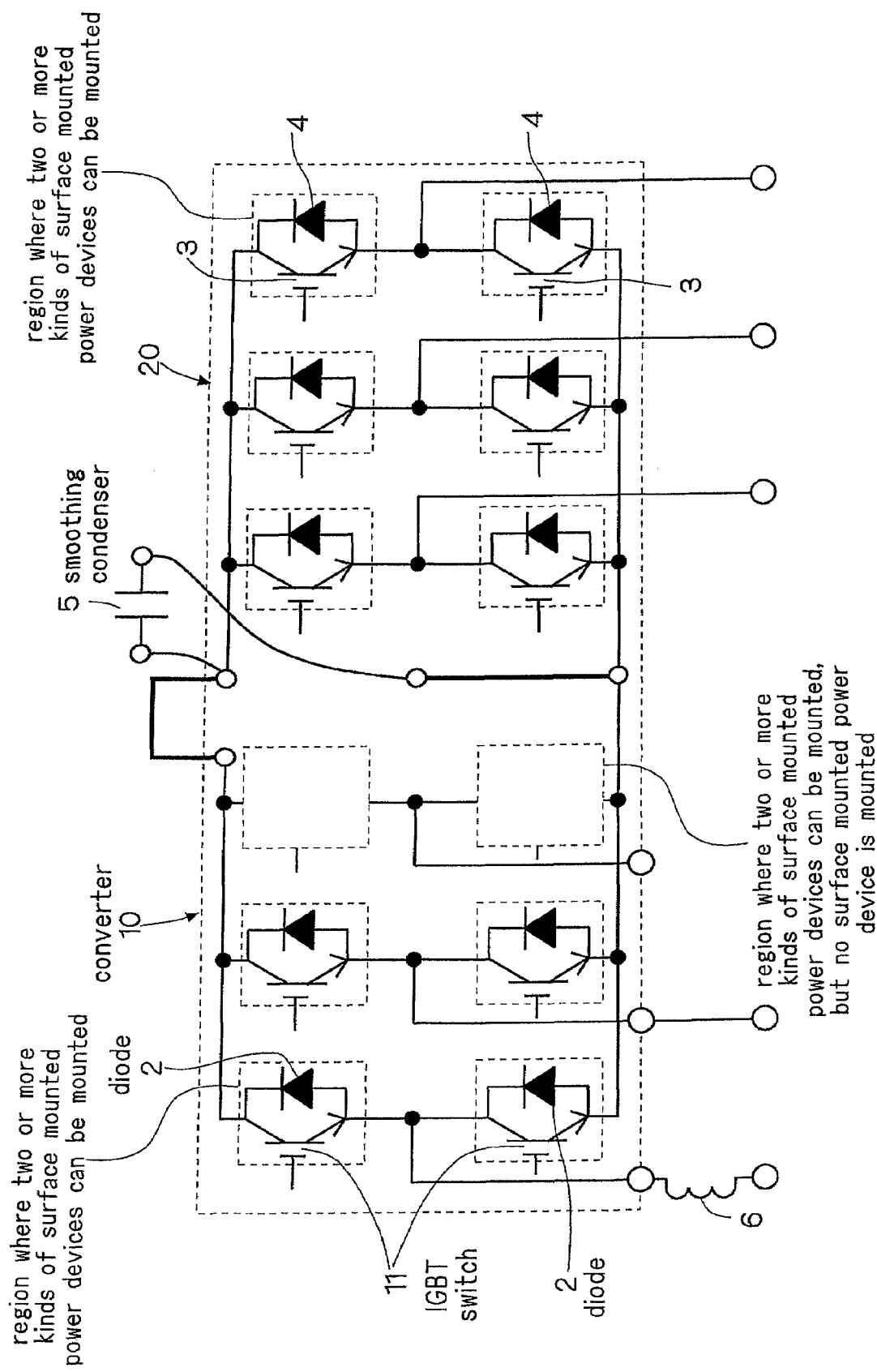
FIG. 39 is a schematic diagram of a modified example of the power module illustrated in FIG. 11.

A single phase-three phase power module of FIG. 39 is different from the single phase-three phase power module of FIG. 11 only in that the smoothing capacitor 5 is connected from outside through junction sections (lead wires). Therefore, the single phase-three phase power module is employed for applications in which the IEC regulation is not effective.

Figure 12:
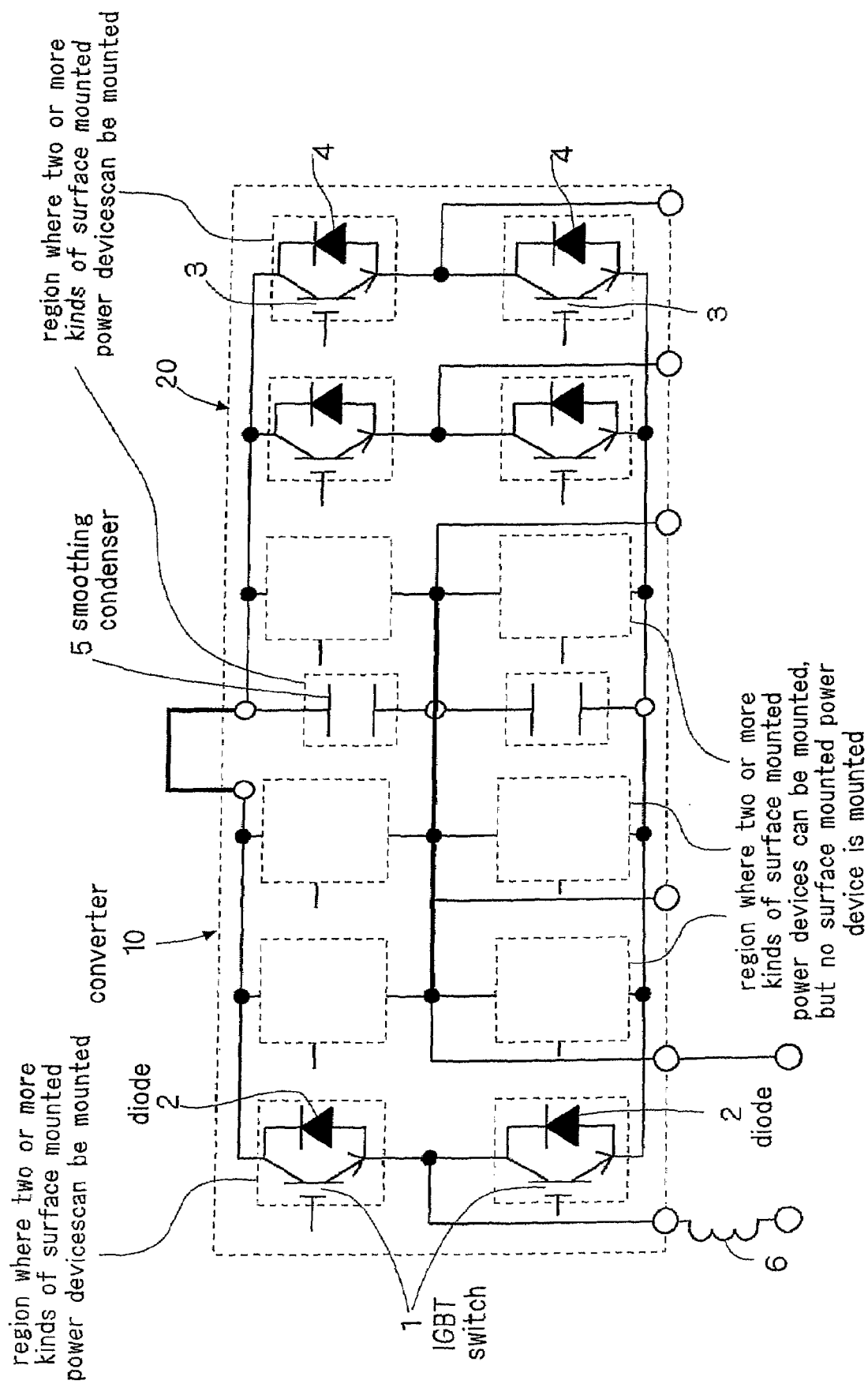
FIG. 12 is a schematic diagram of a further arrangement example of a first type of a power module.

(5) A single phase-three phase power module of FIG. 12 is constituted of 2 surface mounted diodes 2 and 2 surface mounted IGBT switches 1 of a converter 10 on grid side, and 4 surface mounted diodes 4 and 4 surface mounted IGBT switches 3 of an inverter 20 on load side. As is illustrated in FIG. 12, the power module uses the voltage doubling topology to increase the output voltage (a pair of surface mounted smoothing capacitors 5 are serially connected to one another). The single phase-three phase power module is employed for applications in which input power source is low (for example, 100V in Japan) and the IEC regulation is effective.

Figure 40:
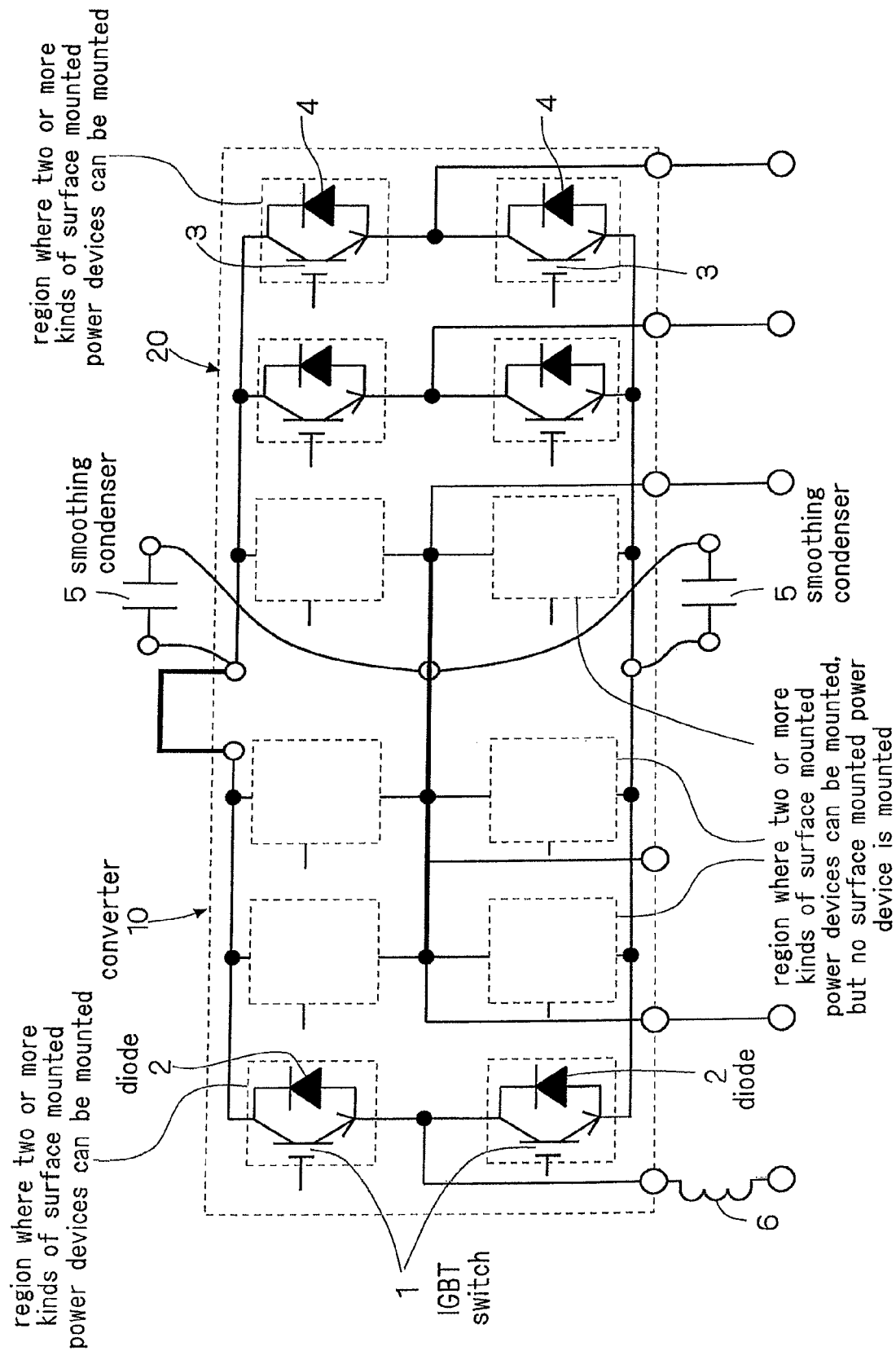
FIG. 40 is a schematic diagram of a modified example of the power module illustrated in FIG. 12.

A single phase-three phase power module of FIG. 40 is different from the single phase-three phase power module of FIG. 12 only in that the smoothing capacitor 5 is connected from outside through junction sections (lead wires). Therefore, the single phase-three phase power module is employed for applications in which input power source is low (for example, 100V in Japan) and the IEC regulation is effective.

Figure 13:
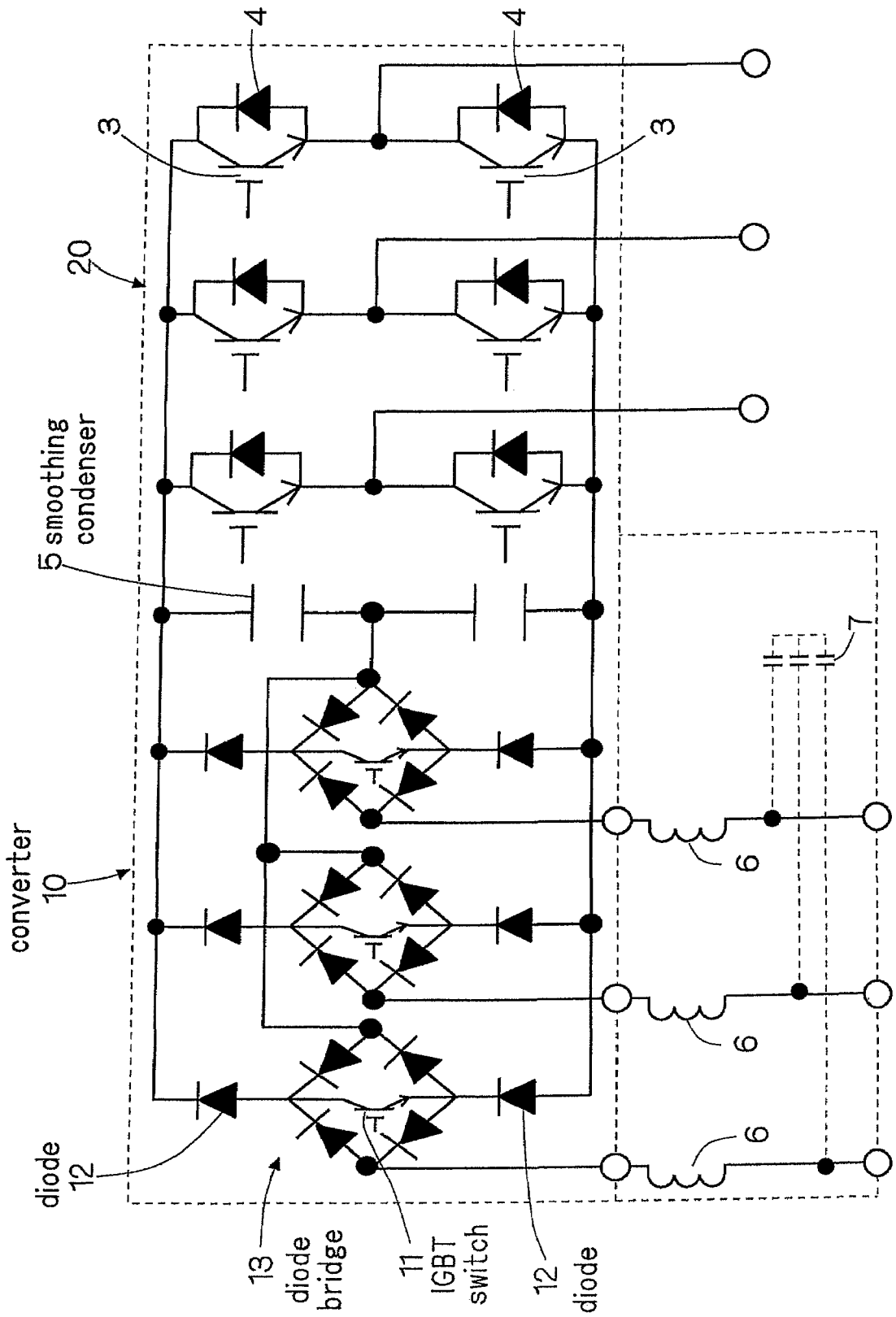
FIG. 13 is an electric circuit diagram illustrating a basic topology of a second type of a power module.

FIG. 13 illustrates a basic power conversion module for converting a three phase AC power source with a constant voltage and constant frequency into a three phase AC output power source with a variable voltage and variable frequency control system. In the basic power conversion module, a converter 10 on grid side is constituted of serially connection of one IGBT switch 11 and two reverse connection diodes 12 for each phase, and providing a diode bridge 13 which is connected its one pair of opposing connection points to the emitter terminal, collector terminal of the IGBT switch 11 and is determined its another pair of opposing connection points to be an input terminal, output terminal. And, a pair of smoothing capacitors 5 are serially connected to one another for carrying out the voltage multiplying operation. An arrangement of an inverter 20 on load side is the same as that of the power module of FIG. 4. Therefore, description of the inverter 20 is omitted.

Figure 14:
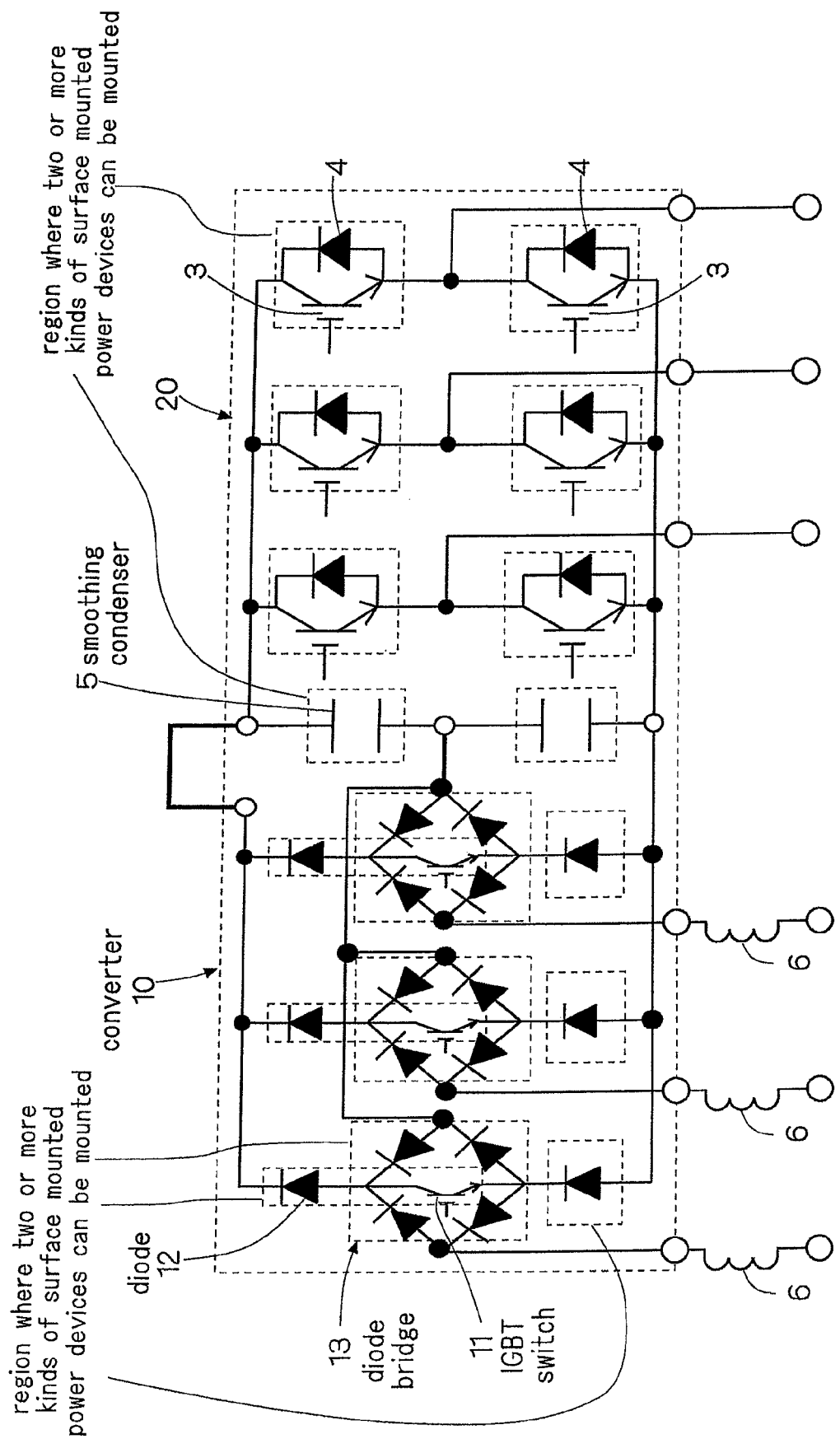
FIG. 14 is a schematic diagram of an arrangement example of a second type of a power module.

As is illustrated in FIG. 14, the proposed three phase-three phase system is integrated into one module using surface mounted IGBT devices similar to the integrated IGBT standard module. The surface mounted IGBT device is designed according to the input and output requirements indicated in Table 2.

|  | Load side | |
| --- | --- | --- |
| Power source side | 200 V motor | 400 V motor |
| 200 V (Japan) | Possible | Possible |
| 400 V (Europe) | Possible | Possible |

The proposed three phase-three phase power module can be modified by changing only the type of a surface mounted power device according to the requirement of the following specific applications.

Figure 41:
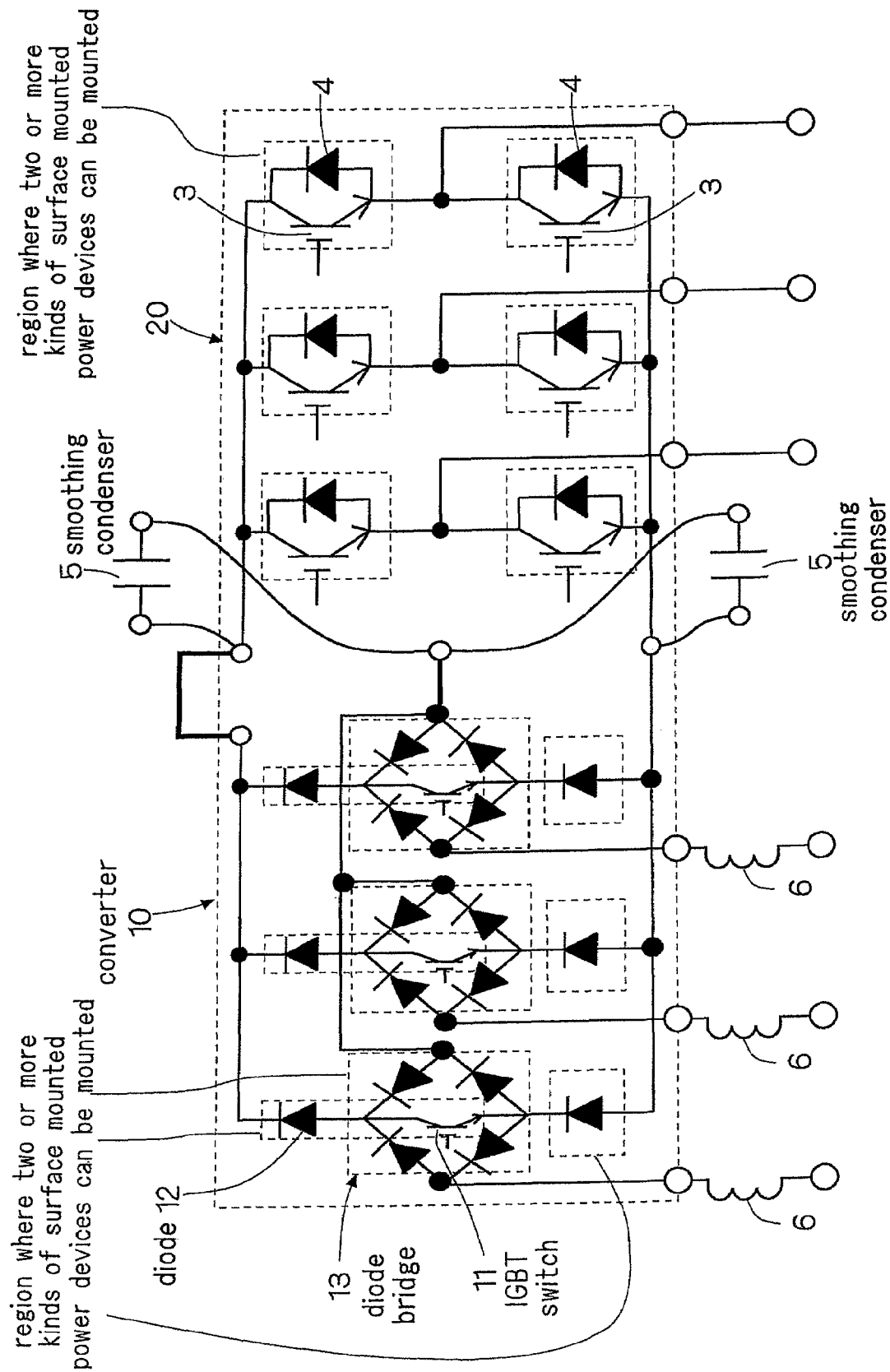
FIG. 41 is a schematic diagram of a modified example of the power module illustrated in FIG. 14.

(1) A three phase-three phase power module of FIG. 14 is constituted of 18 surface mounted diodes 12, 13 and 3 surface mounted IGBT switches 11 of a converter on grid side, and 6 surface mounted diodes 4 and 6 surface mounted IGBT switches 3 of an inverter 20 on load side. By controlling the surface mounted IGBT 11, the harmonic component currents on grid side are reduced, and the DC link voltage is controlled to reduce the rated current of the IGBT switch 11 of the inverter 20 on load side. A three phase-three phase power module of FIG. 41 is different from the three phase-three phase power module of FIG. 14 only in that the smoothing capacitor 5 is connected from outside through junction sections (lead wires). Therefore, by controlling the surface mounted IGBT 11, the harmonic component currents on grid side are reduced, and the DC link voltage is controlled to reduce the rated current of the IGBT switch 11 of the inverter 20 on load side.

Figure 15:
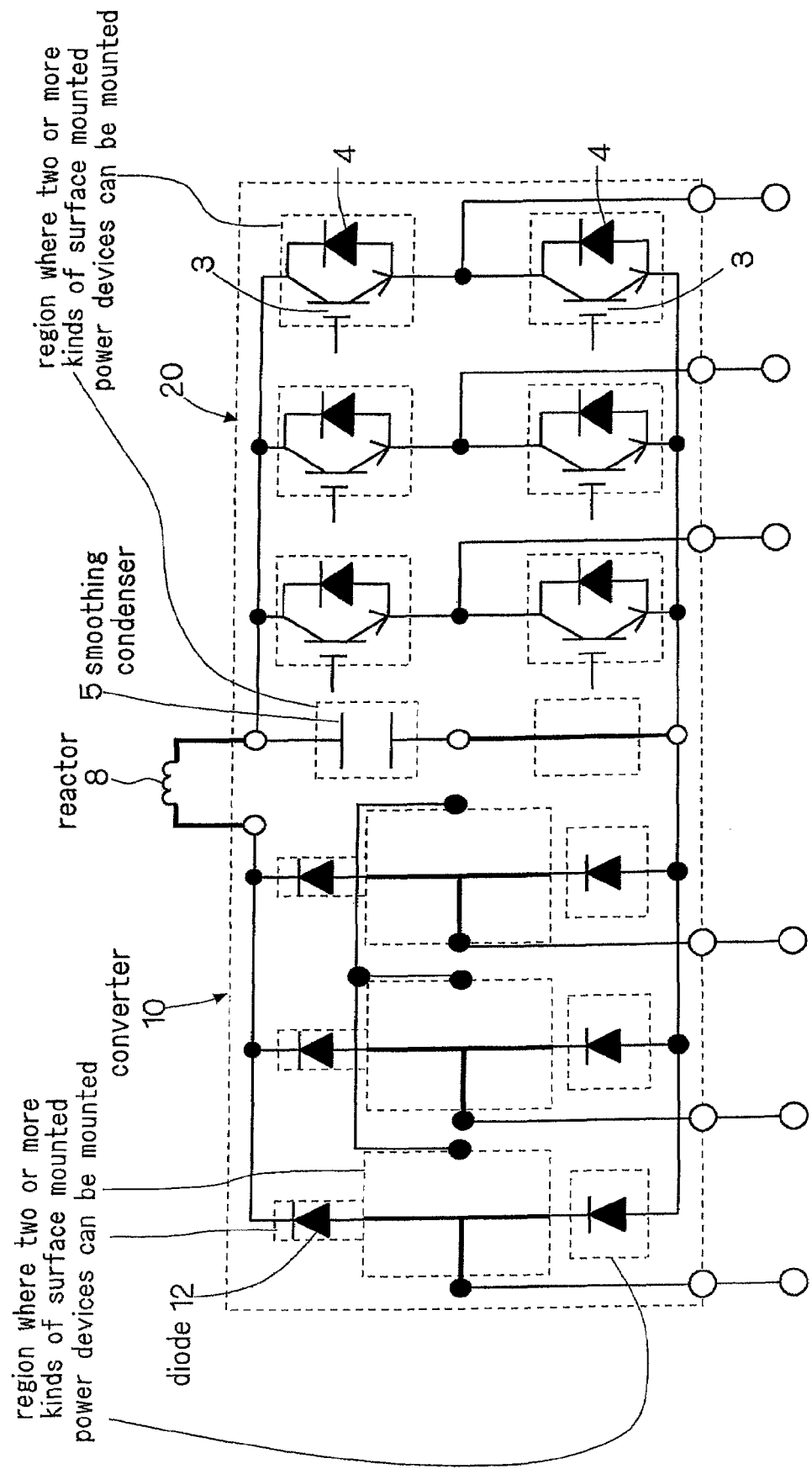
FIG. 15 is a schematic diagram of another arrangement example of a second type of a power module.

(2) A three phase_three phase power module of FIG. 15 is constituted of 6 surface mounted diodes 2 of a converter 10 on grid side, and 6 surface mounted diodes 4 and 6 surface mounted IGBT switches 3 of an inverter 20 on load side. The three phase-three phase power module is employed for applications which take only efficiency into consideration. A reactor 8 is connected from outside between the converter 10 and the smoothing capacitor 5 instead connecting the reactor 6 on the input side of the converter 10.

Figure 42:
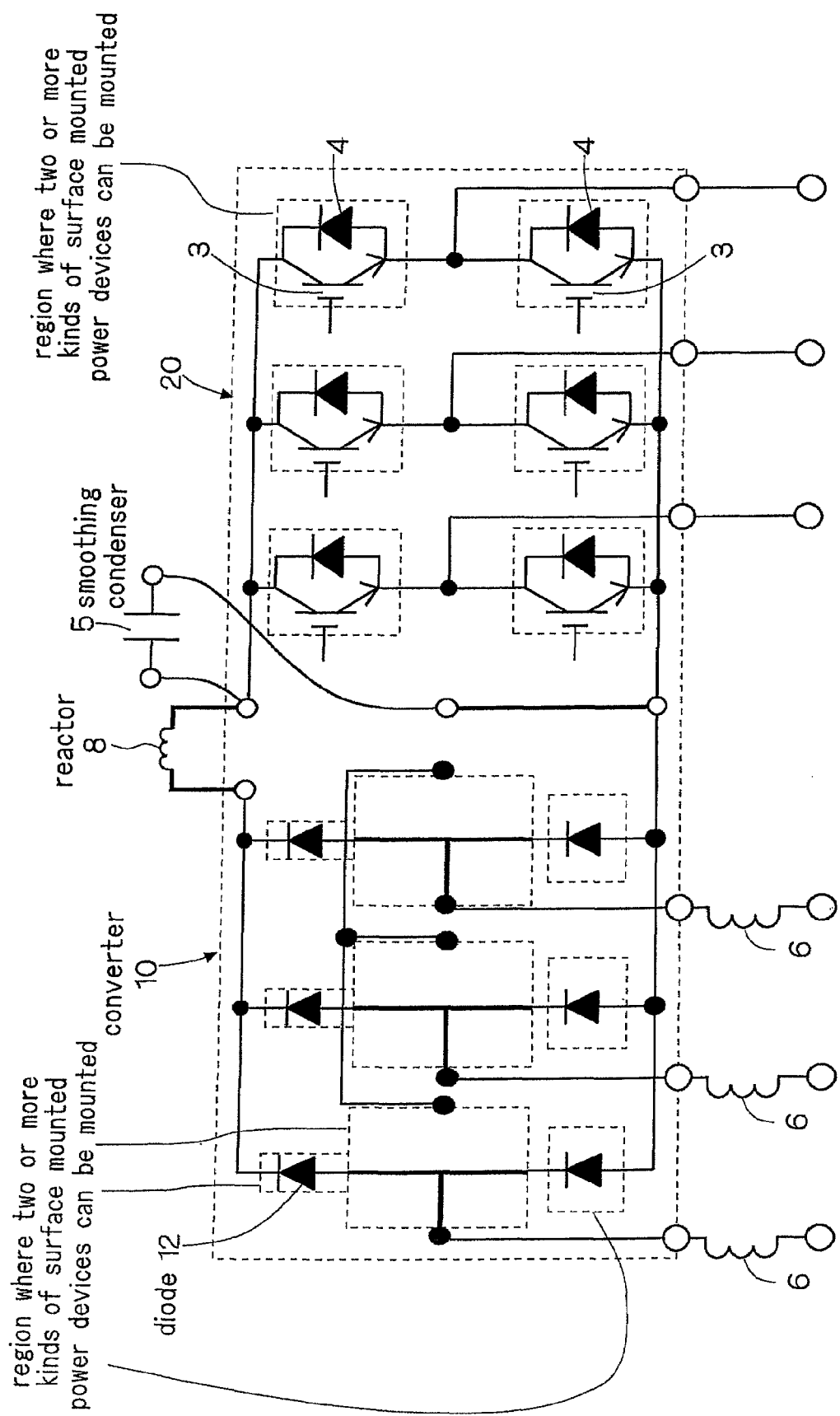
FIG. 42 is a schematic diagram of a modified example of the power module illustrated in FIG. 15.

A three phase-three phase power module of FIG. 42 is different from the three phase-three phase power module of FIG. 15 only in that the smoothing capacitor 5 is connected from outside through junction sections (lead wires). Therefore, the three phase-three phase power module is employed for applications which take only efficiency into consideration. A reactor 8 is connected from outside between the converter 10 and the smoothing capacitor 5 instead connecting the reactor 6 on the input side of the converter 10.

Figure 16:
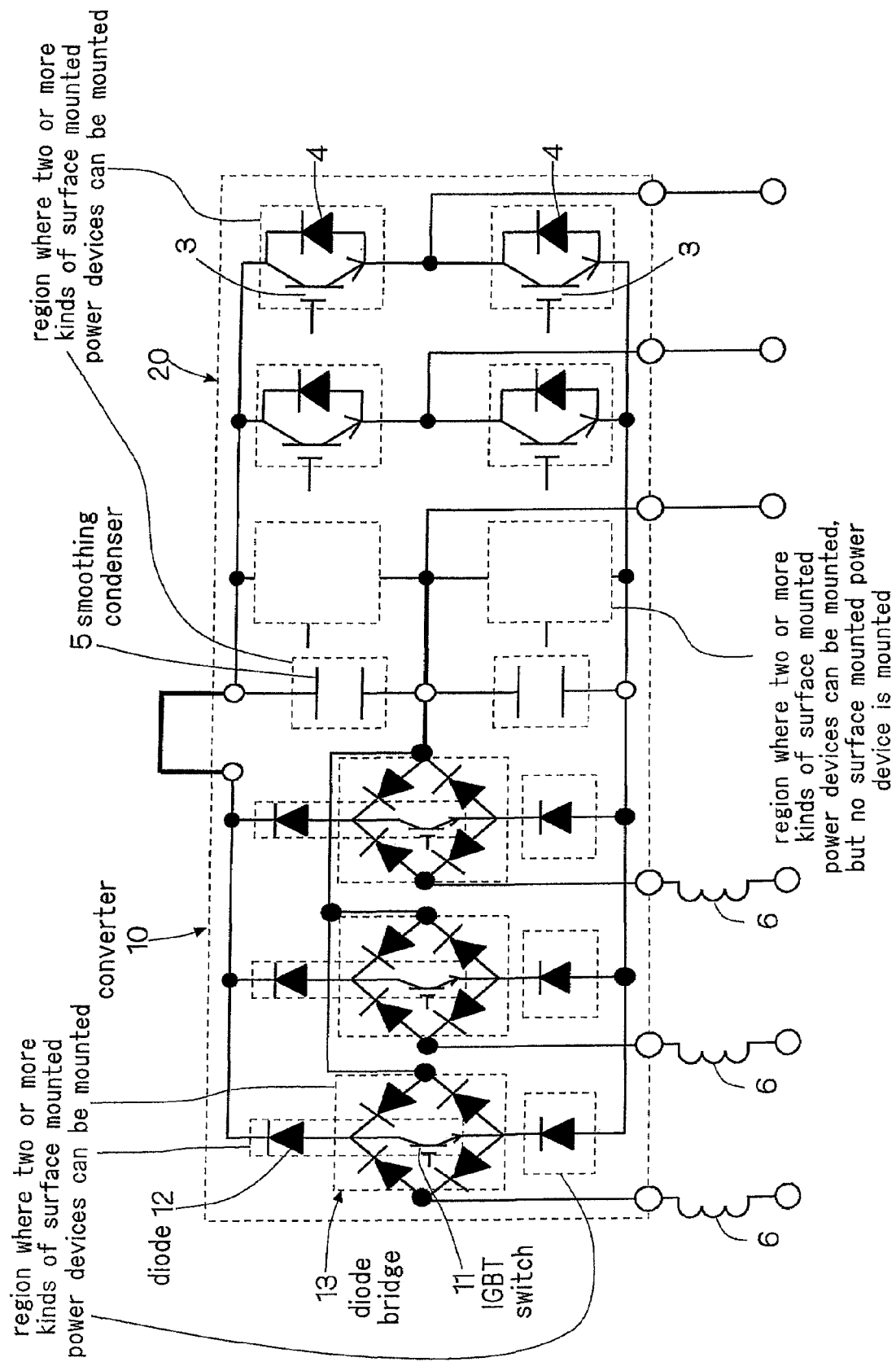
FIG. 16 is a schematic diagram of a further arrangement example of a second type of a power module.

(3) A three phase-three phase power module of FIG. 16 is constituted of 18 surface mounted diodes 12, 13 and 3 surface mounted IGBT switches 11 of a converter 10 on grid side, and 4 surface mounted diodes 4 and 4 surface mounted IGBT switches 3 of an inverter 20 on load side, and a pair of smoothing capacitors 5 for voltage doubling. By controlling 3 surface mounted IGBT 11, the harmonic component currents on grid side are reduced, and the DC link voltage is controlled to reduce the rated current of the IGBT switch of the inverter 20 on load side. And, the switching loss is reduced and the efficiency is increased by reducing the number of IGBT switches 3 of the inverter 20 on load side.

Figure 43:
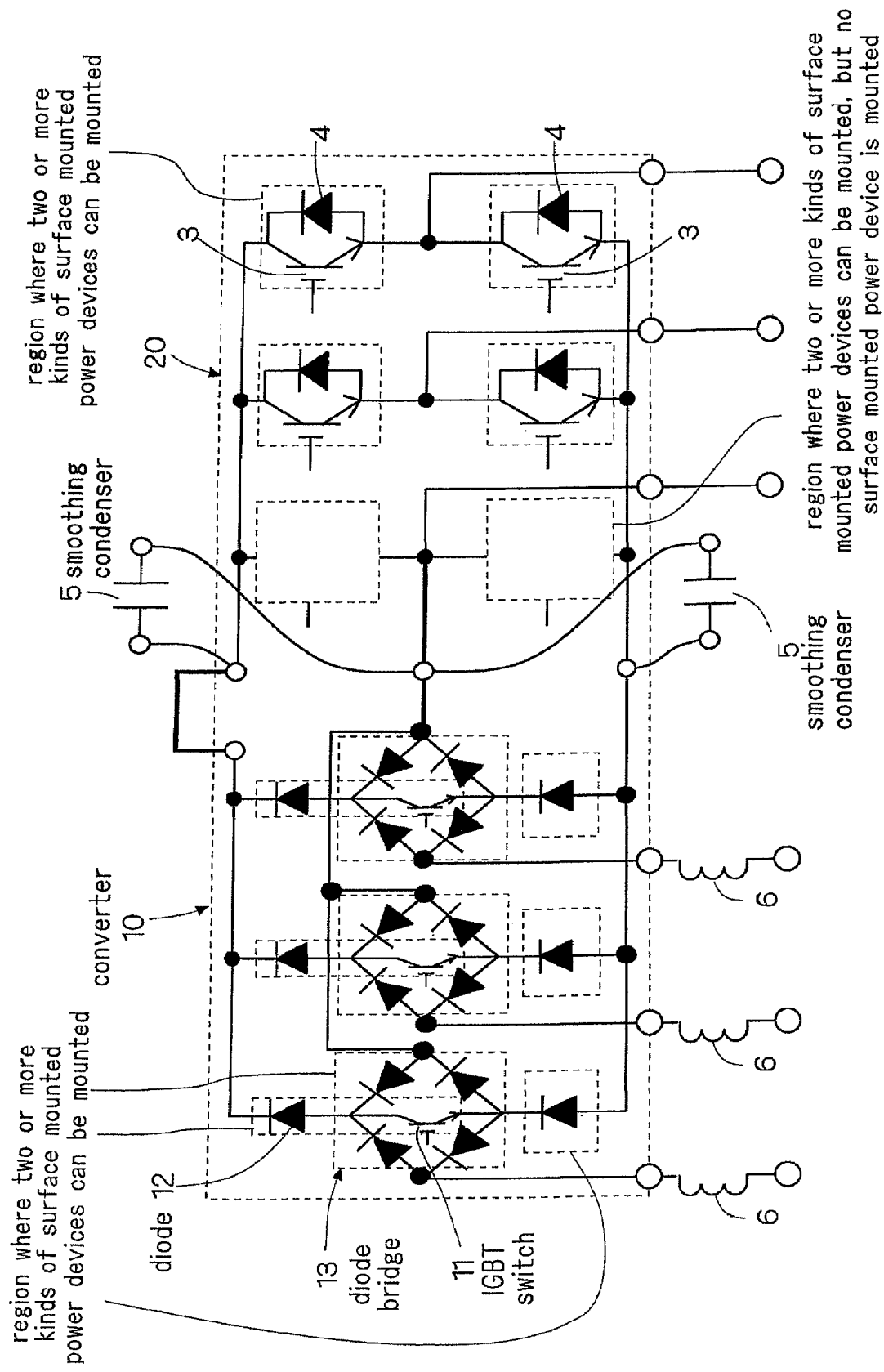
FIG. 43 is a schematic diagram of a modified example of the power module illustrated in FIG. 16.

A three phase-three phase power module of FIG. 43 is different from the three phase-three phase power module of FIG. 16 only in that the smoothing capacitor 5 is connected from outside through junction sections (lead wires). Therefore, by controlling 3 surface mounted IGBT 11, the harmonic component currents on grid side are reduced, and the DC link voltage is controlled to reduce the rated current of the IGBT switch of the inverter 20 on load side.

Figure 17:
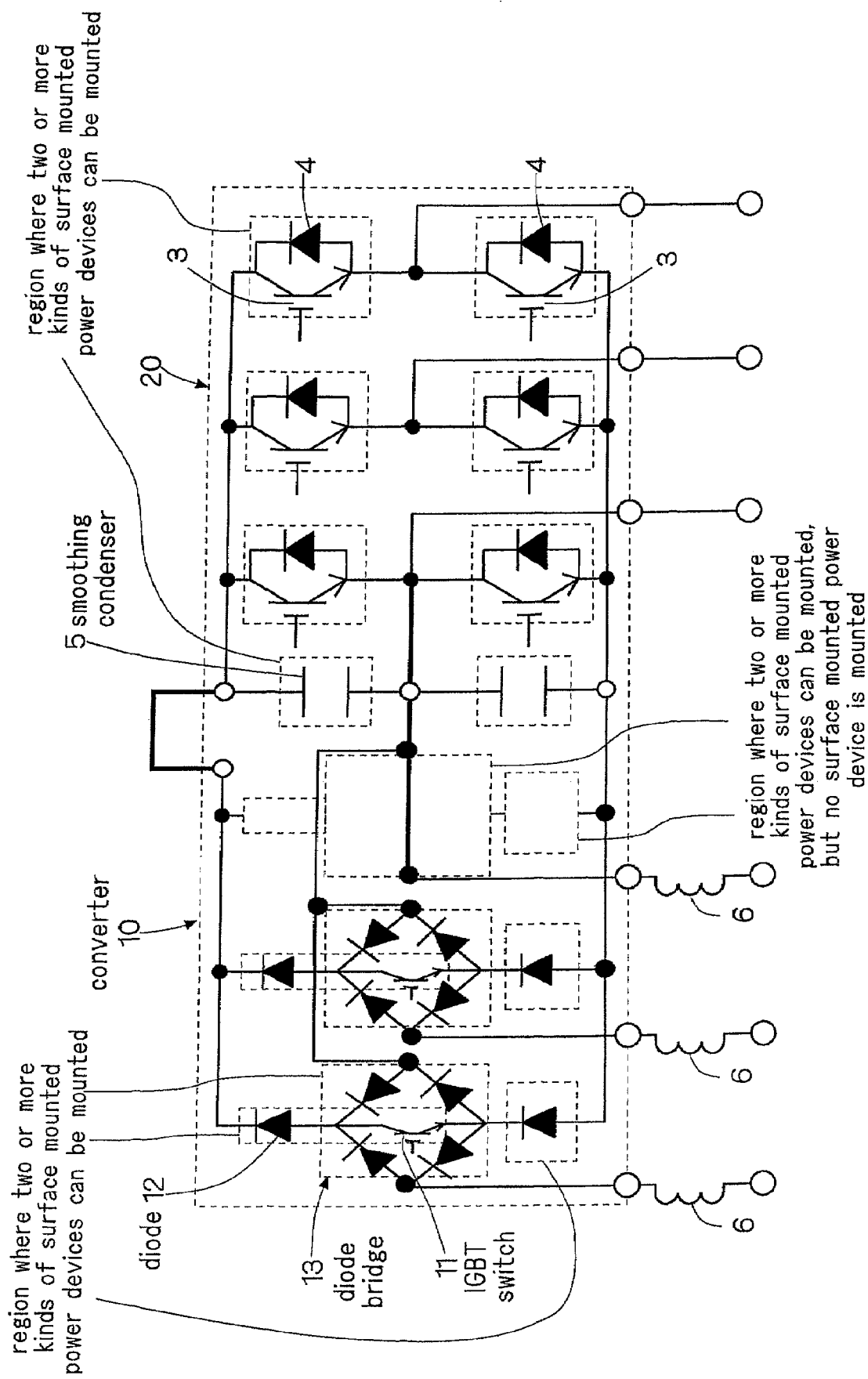
FIG. 17 is a schematic diagram of a further arrangement example of a second type of a power module.

(4) A three phase-three phase power module of FIG. 17 is constituted of 12 surface mounted diodes 12, 13 and 2 surface mounted IGBT switches 11 of a converter 10 on grid side, and 6 surface mounted diodes 4 and 6 surface mounted IGBT switches 3 of an inverter 20 on load side, and a pair of smoothing capacitors 5 for voltage doubling. By controlling 2 surface mounted IGBT 11, the harmonic component currents on grid side are reduced, and the DC link voltage is controlled to reduce the rated current of the IGBT switch of the inverter 20 on load side. And, the switching loss is reduced and the efficiency is increased by reducing the total number of active switches of the converter 10 on grid side.

Figure 44:
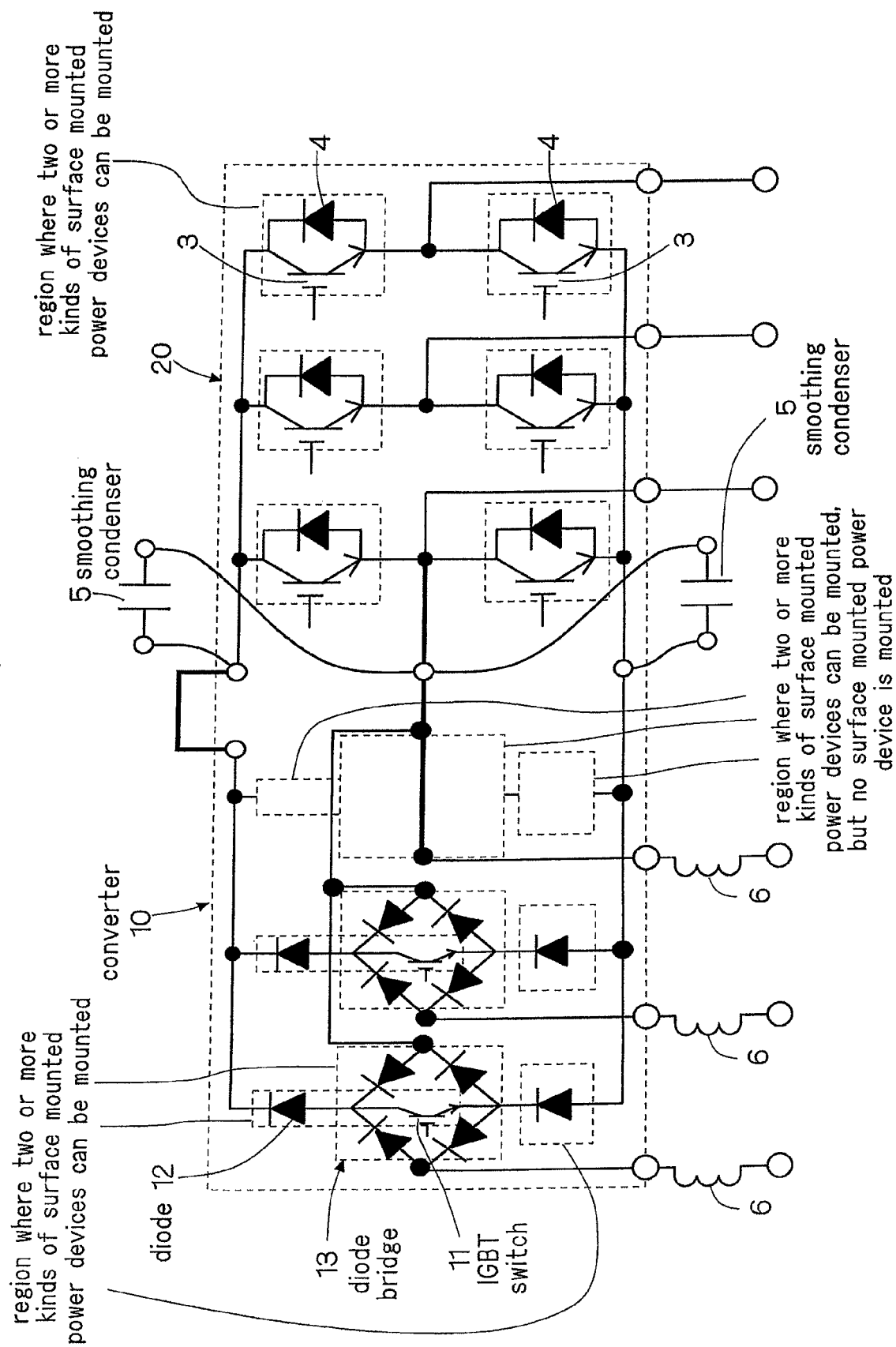
FIG. 44 is a schematic diagram of a modified example of the power module illustrated in FIG. 17.

A three phase-three phase power module of FIG. 44 is different from the three phase-three phase power module of FIG. 17 only in that the smoothing capacitor 5 is connected from outside through junction sections (lead wires). Therefore, by controlling 2 surface mounted IGBT 11, the harmonic component currents on grid side are reduced, and the DC link voltage is controlled to reduce the rated current of the IGBT switch of the inverter 20 on load side. And, the switching loss is reduced and the efficiency is increased by reducing the total number of active switches of the converter 10 on grid side.

The three phase-three phase power module can be modified into a single phase-three phase power module by changing only the type of a surface mounted power device according to the requirement of the following specific applications.

Figure 18:
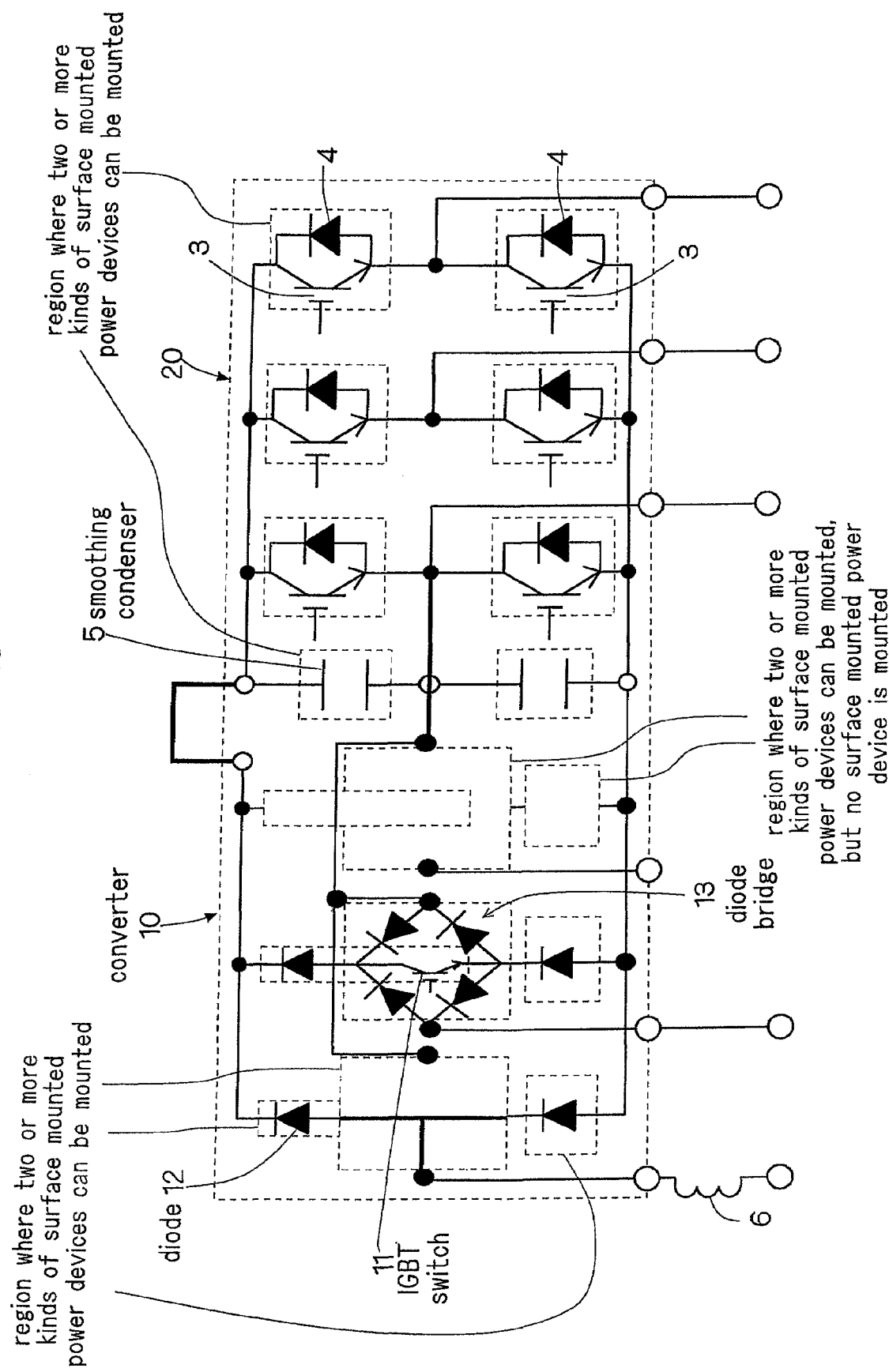
FIG. 18 is a schematic diagram of a further arrangement example of a second type of a power module.

(1) A single phase-three phase power module of FIG. 18 is constituted of 8 surface mounted diodes 12, 13 and one surface mounted IGBT switch 11 of a converter 10 on grid side, and 6 surface mounted diodes 4 and 6 surface mounted IGBT switches 3 of an inverter 20 on load side, and a pair of smoothing capacitors 5 for voltage doubling. By controlling one surface mounted IGBT 11, the harmonic component currents on grid side are reduced, and the DC link voltage is controlled to reduce the rated current of the IGBT switch 3 and diode 4 of the inverter on load side. And, the single phase-three phase power module is employed for low input voltage applications in which the IEC regulation is effective.

Figure 45:
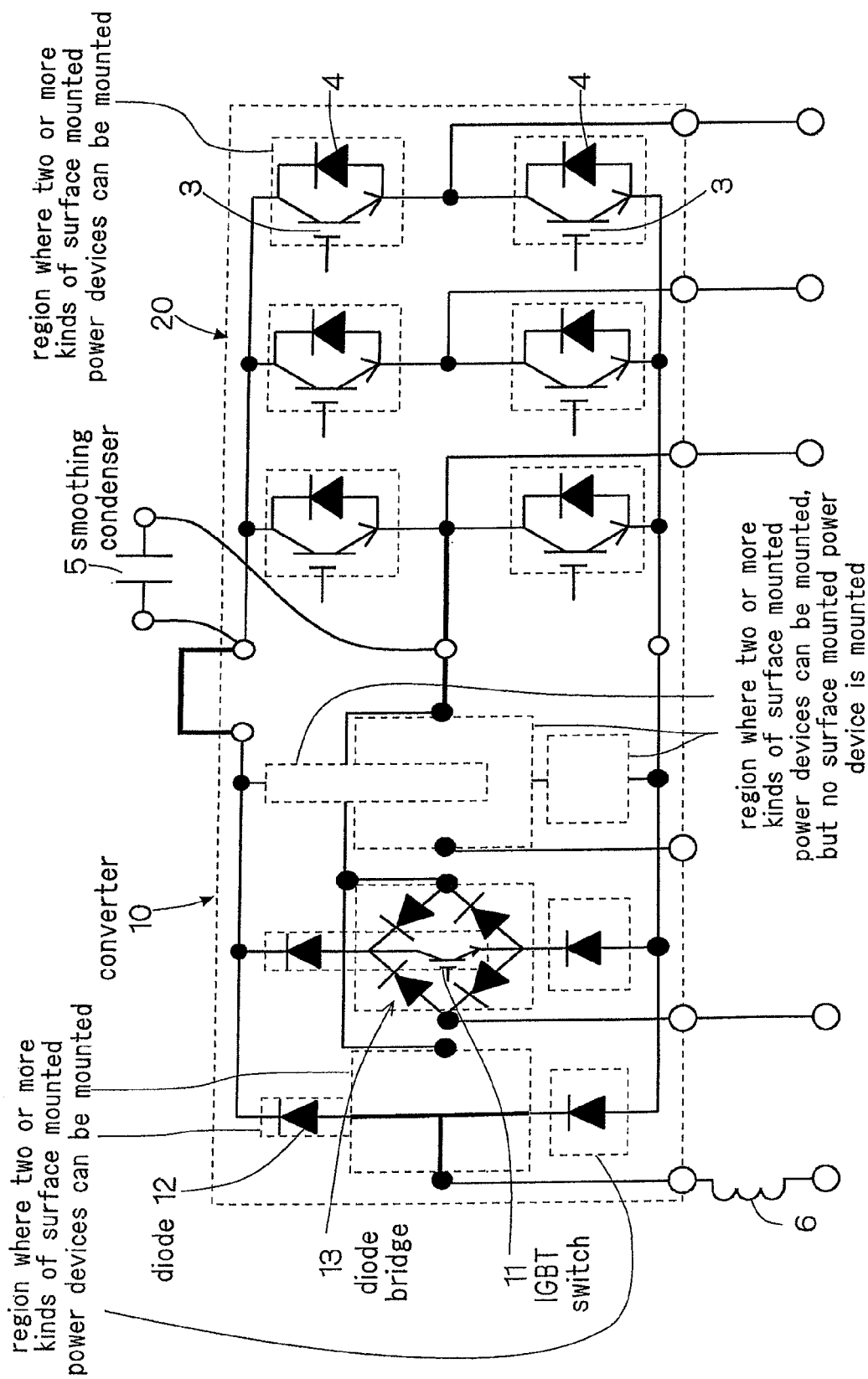
FIG. 45 is a schematic diagram of a modified example of the power module illustrated in FIG. 18.

A single phase-three phase power module of FIG. 45 is different from the single phase-three phase power module of FIG. 18 only in that the smoothing capacitor 5 is connected from outside through junction sections (lead wires). Therefore, by controlling one surface mounted IGBT 11, the harmonic component currents on grid side are reduced, and the DC link voltage is controlled to reduce the rated current of the IGBT switch 3 and diode 4 of the inverter on load side. And, the single phase-three phase power module is employed for low input voltage applications in which the IEC regulation is effective.

Figure 19:
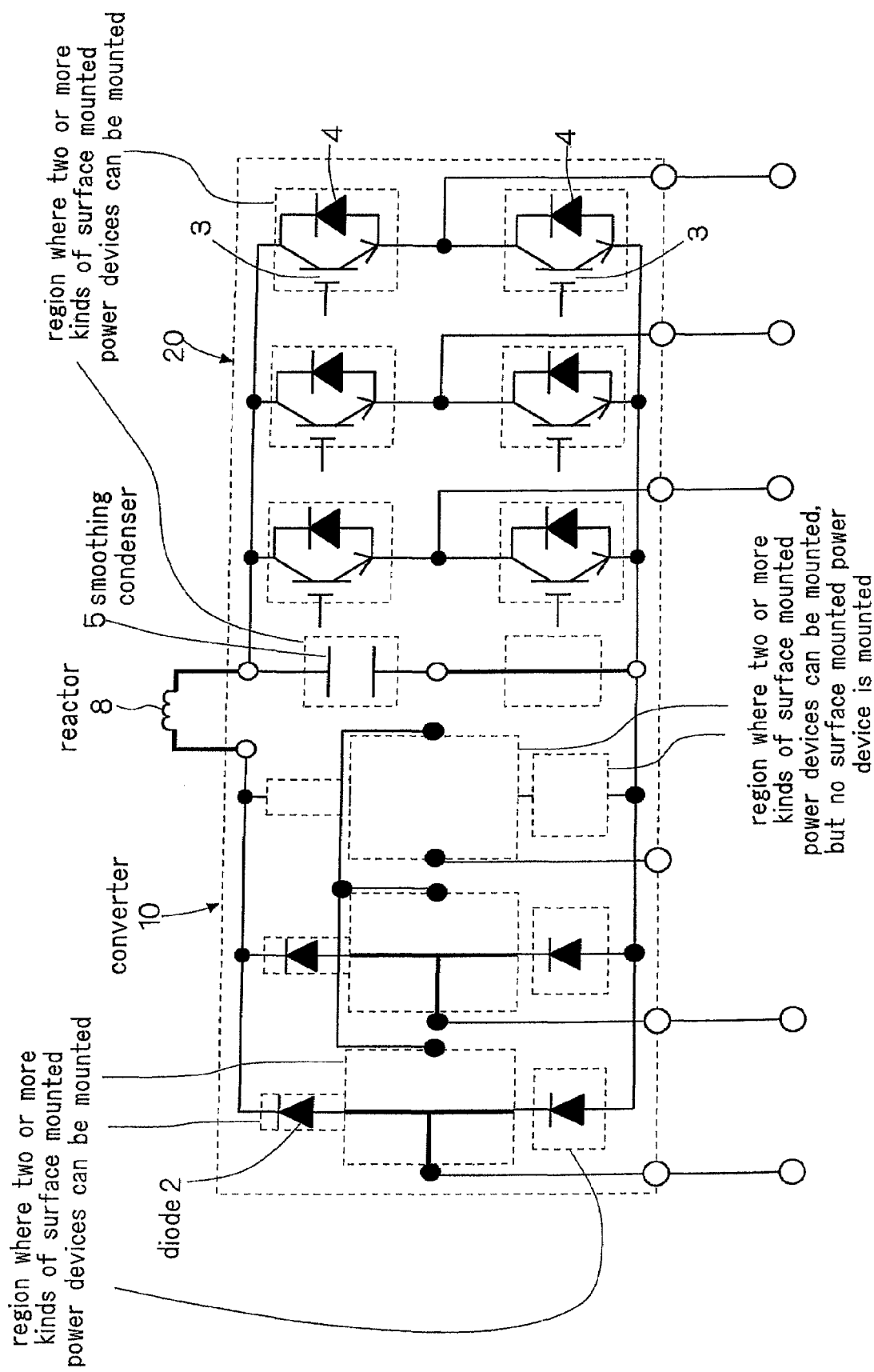
FIG. 19 is a schematic diagram of a further arrangement example of a second type of a power module.

(2) A single phase-three phase power module of FIG. 19 is constituted of 4 surface mounted diodes 12 of a converter 10 on grid side, and 6 surface mounted diodes and 6 surface mounted IGBT switches 3 of an inverter 20 on load side. Therefore, the single phase-three phase power module is employed for applications in which the IEC regulation is not effective. A reactor 8 is connected from outside between the converter 10 on grid side and the smoothing capacitor 5 instead connecting the reactor 6 on the input side of the converter 10 on grid side.

Figure 46:
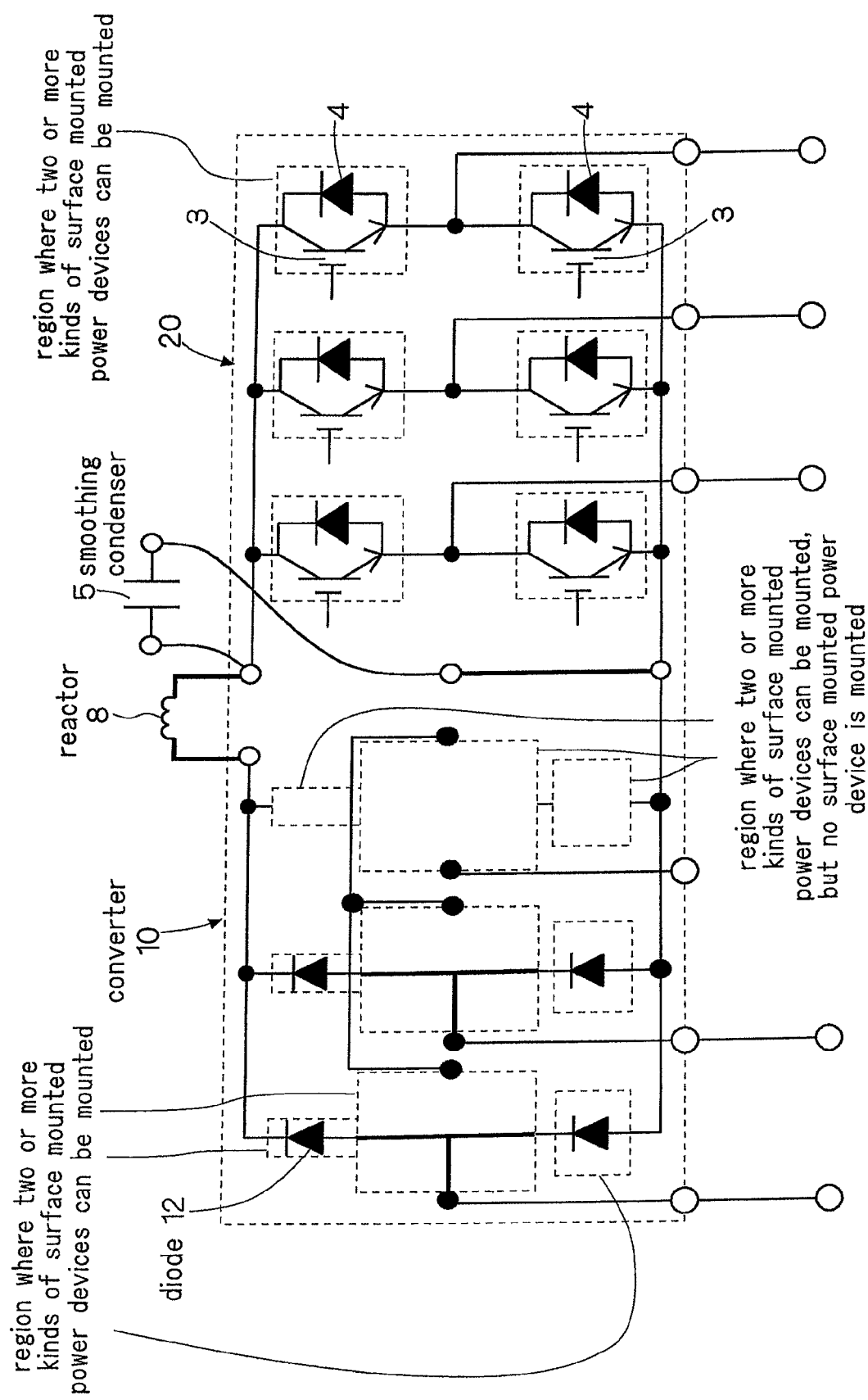
FIG. 46 is a schematic diagram of a modified example of the power module illustrated in FIG. 19.

A single phase-three phase power module of FIG. 46 is different from the single phase-three phase power module of FIG. 19 only in that the smoothing capacitor 5 is connected from outside through junction sections (lead wires). Therefore, the single phase-three phase power module is employed for applications in which the IEC regulation is not effective. A reactor 8 is connected from outside between the converter 10 on grid side and the smoothing capacitor 5 instead connecting the reactor 6 on the input side of the converter 10 on grid side.

Figure 20:
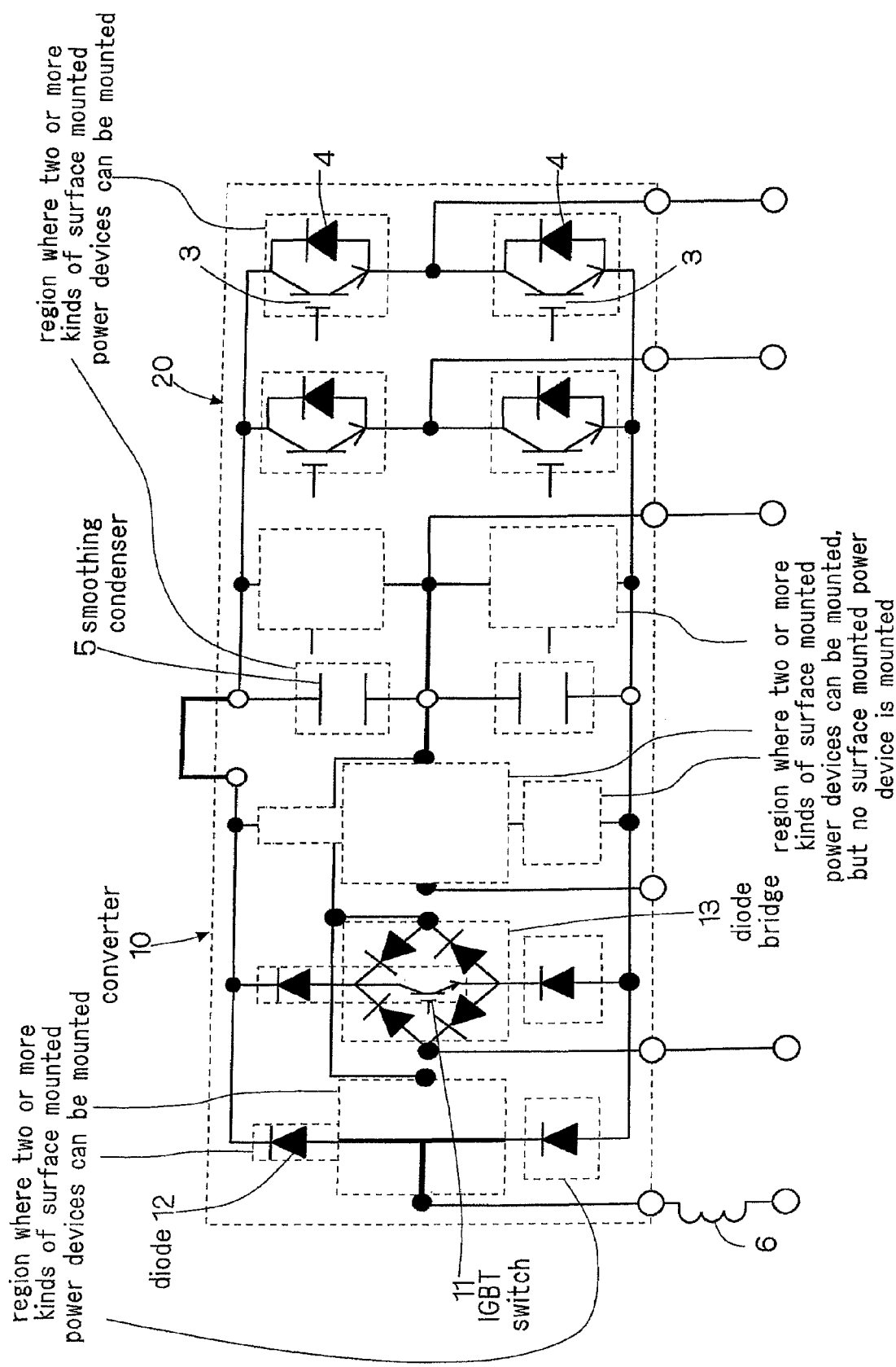
FIG. 20 is a schematic diagram of a further arrangement example of a second type of a power module.

(3) A single phase-three phase power module of FIG. 20 is constituted of 8 surface mounted diodes 12, 13 and one surface mounted IGBT switch 11 of a converter 10 on grid side, and 4 surface mounted diodes 4 and 4 surface mounted IGBT switches 3 of an inverter 20 on load side. By controlling one surface mounted IGBT 11, the harmonic component currents on grid side are reduced, and the DC link voltage is controlled to reduce the rated current of the IGBT switch 3 and diode 4 of the inverter 20 on load side. The switching loss is reduced and the efficiency is increased by reducing the total number of active switches on both sides. And, the single phase-three phase power module is employed for low input voltage applications in which the IEC regulation is effective.

Figure 47:
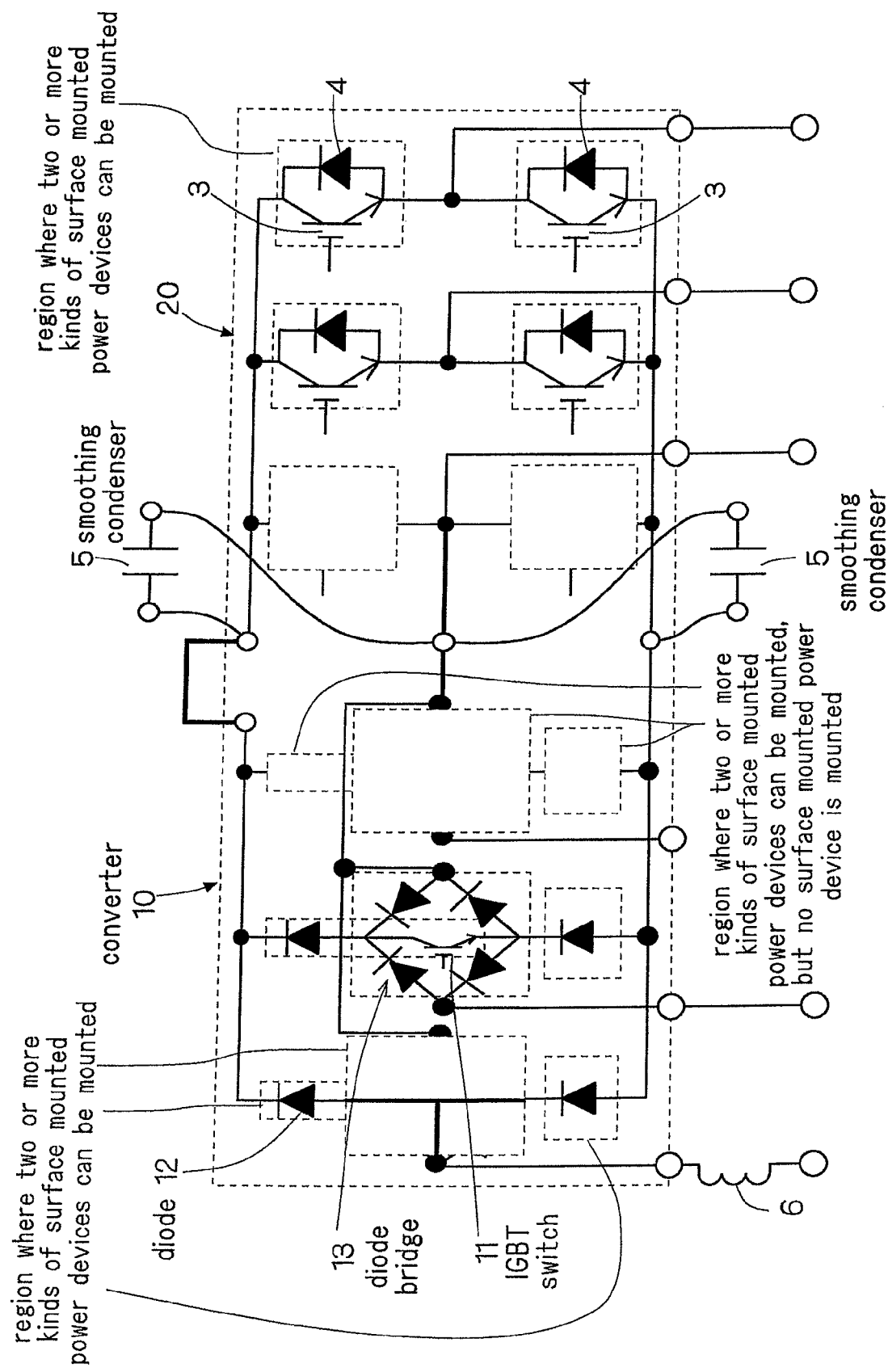
FIG. 47 is a schematic diagram of a modified example of the power module illustrated in FIG. 20.

A single phase-three phase power module of FIG. 47 is different from the single phase-three phase power module of FIG. 20 only in that the smoothing capacitor 5 is connected from outside through junction sections (lead wires). Therefore, by controlling one surface mounted IGBT 11, the harmonic component currents on grid side are reduced, and the DC link voltage is controlled to reduce the rated current of the IGBT switch 3 and diode 4 of the inverter 20 on load side. The switching loss is reduced and the efficiency is increased by reducing the total number of active switches on both sides. And, the single phase-three phase power module is employed for low input voltage applications in which the IEC regulation is effective.

Figure 21:
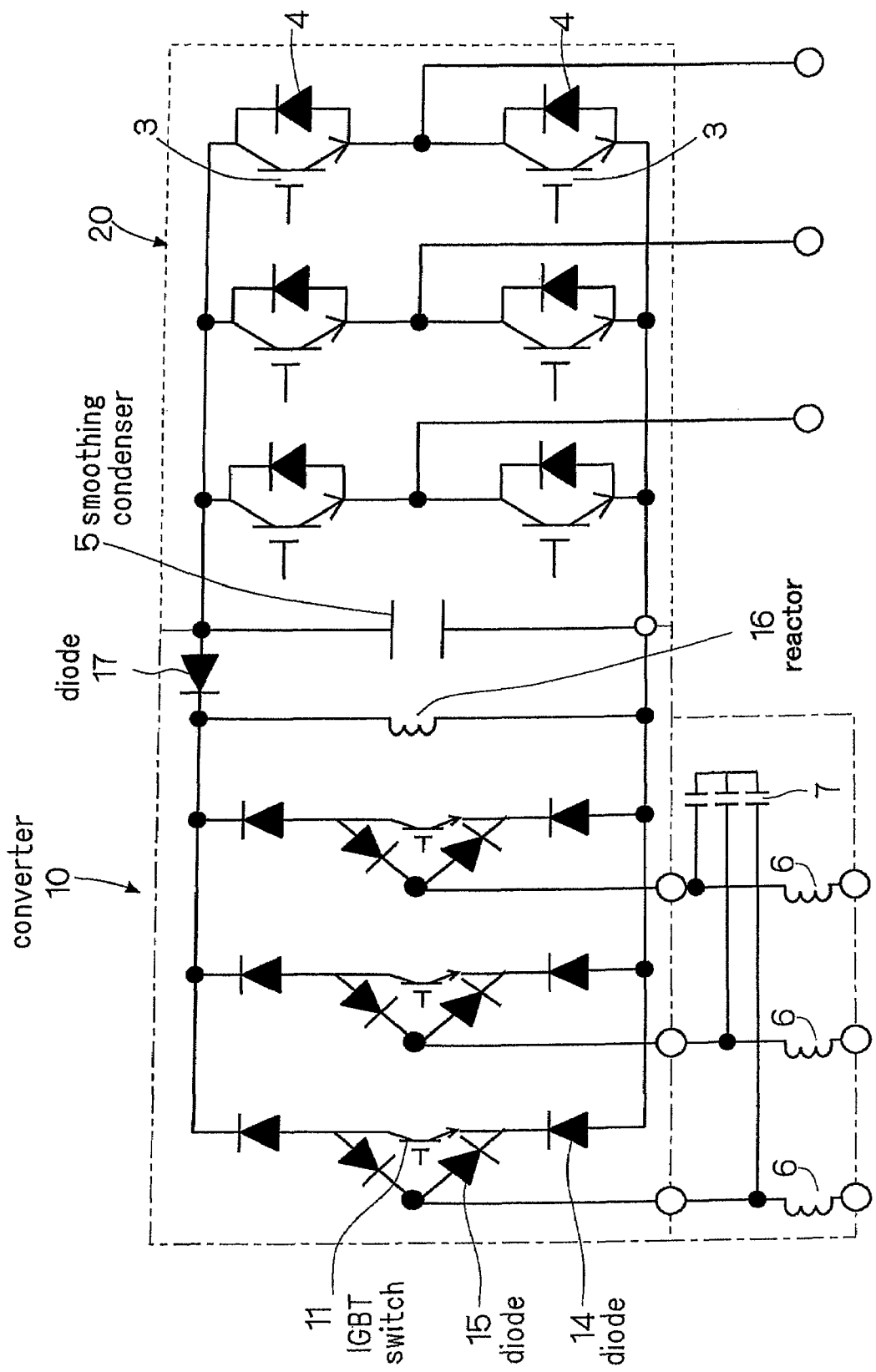
FIG. 21 is an electric circuit diagram illustrating a basic topology of a third type of a power module.

FIG. 21 illustrates a basic power conversion module for converting a three phase AC power source with a constant voltage and constant frequency into a three phase AC output power source with a variable voltage and variable frequency control system. The basic power conversion module is different from the basic power conversion module of FIG. 13 in that a pair of diodes 14 for forward connection are employed instead the diodes 12 for reverse connection, a pair of diodes 15 are provided instead the diode bridge 13, the pair of diodes 15 being serially and reversely connected between the emitter terminal, collector terminal of the IGBT switch 11, and the pair of diodes 15 being connected its connection terminal to the reactor on input side, a reactor 16 is connected in parallel to the serial circuit constituted of the surface mounted IGBT switch 11 and a pair of diodes 14 for forward connection, and a diode 17 for reverse connection is provided which is connected between the reactor 16 and the smoothing capacitor 5.

Figure 22:
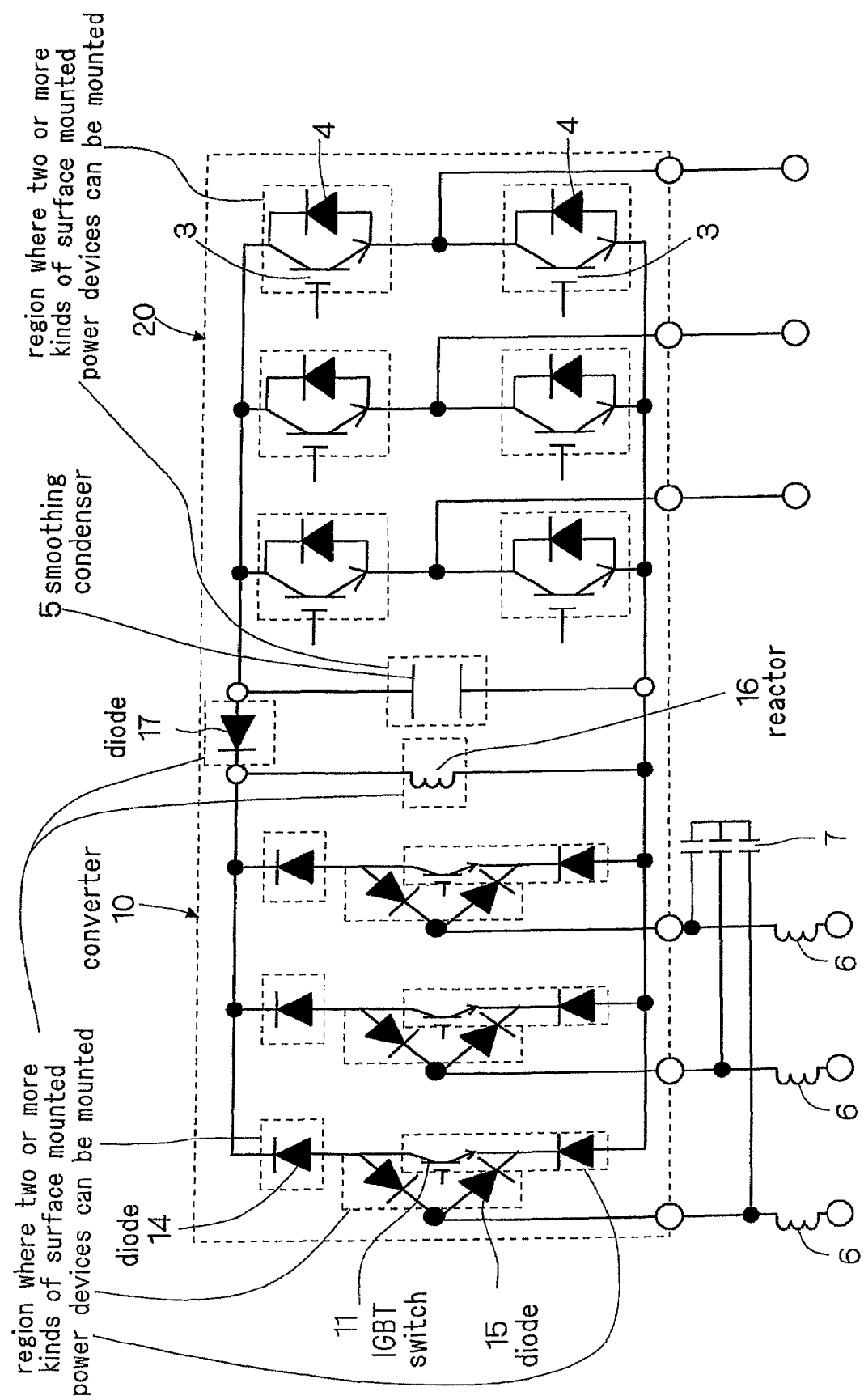
FIG. 22 is a schematic diagram of an arrangement example of a third type of a power module.

As is illustrated in FIG. 22, the proposed three phase-three phase system is integrated into one module using surface mounted IGBT devices and diode devices similar to the integrated IGBT standard module. The surface mounted IGBT device and diode device are designed according to the input and output requirements indicated in Table 3.

TABLE 3

| | Load side | |
|---|---|---|
| Power source side | 200 V (motor) | 400 V (motor) |
| 200 V (Japan) | Possible | Possible |
| 400 V (Europe and others) | Possible | Possible |

The proposed three phase-three phase power module can be modified by changing only the type of a surface mounted power device according to the requirement of the following specific applications.

(1) A three phase-three phase power module illustrated in FIG. 22 comprises 13 surface mounted diodes 14, 15 and 3 surface mounted IGBT switches 11 on grid side for constituting a back boost type of converter 10, and 6 surface mounted diodes 4 and 6 surface mounted IGBT switches 3 for an inverter 20 on load side. By controlling 3 IGBT switches 11, harmonic component currents on grid side are reduced, and the DC link voltage is controlled from zero volts to a voltage exceeding the maximum input voltage so as to assume the pulse amplitude modulation (PAM). By increasing the DC voltage within the high power region, the rated current of the IGBT switch 3 of the inverter on load side and the rated current of the diode 4 of the inverter on load side are reduced. A reactor 16 is connected in parallel to the serial circuit constituted of the surface mounted IGBT switch 11 and a pair of diodes 14 for forward connection, and a diode 17 is reversely connected between the reactor 16 and the smoothing capacitor 5. Therefore, step up-down operations can be carried out. A reactor 6 is connected in the input side, and a capacitor 7 is connected between terminals on input side.

Figure 48:
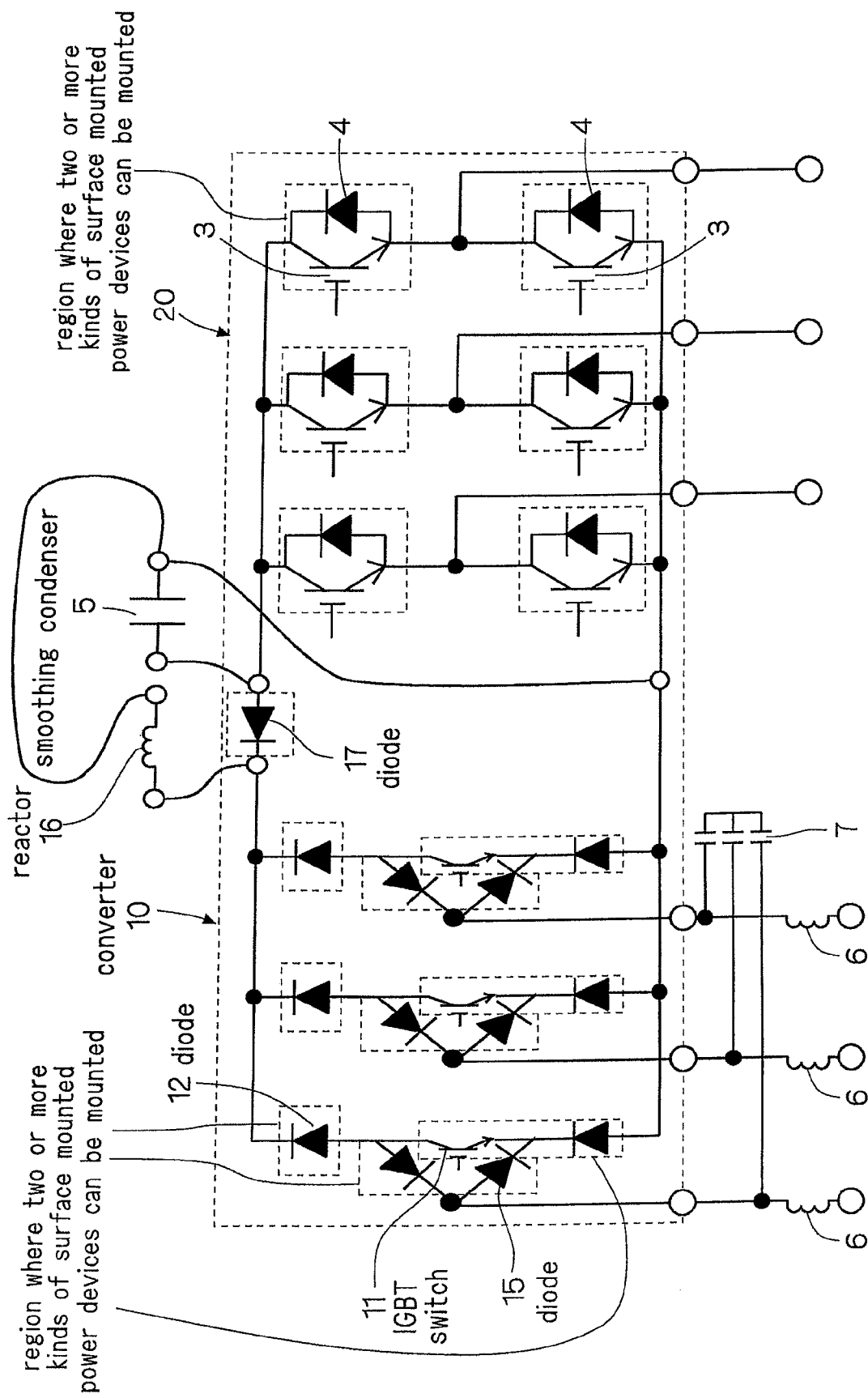
FIG. 48 is a schematic diagram of a modified example of the power module illustrated in FIG. 22.

A three phase-three phase power module of FIG. 48 is different from the three phase-three phase power module of FIG. 22 only in that the smoothing capacitor 5 and the reactor 16 are connected from outside through the junction sections (lead wires). Therefore, by controlling 3 IGBT switches 11, harmonic component currents on grid side are reduced, and the DC link voltage is controlled from zero volts to a voltage exceeding the maximum input voltage so as to assume the pulse amplitude modulation (PAM). By increasing the DC voltage within the high power region, the rated current of the IGBT switch 3 of the inverter on load side and the rated current of the diode 4 of the inverter on load side are reduced. A reactor 16 is connected in parallel to the serial circuit constituted of the surface mounted IGBT switch 11 and a pair of diodes 14 for forward connection, and a diode 17 is reversely connected between the reactor 16 and the smoothing capacitor 5. Therefore, step up-down operations can be carried out. A reactor 6 is connected in the input side, and a capacitor 7 is connected between terminals on input side.

Figure 23:
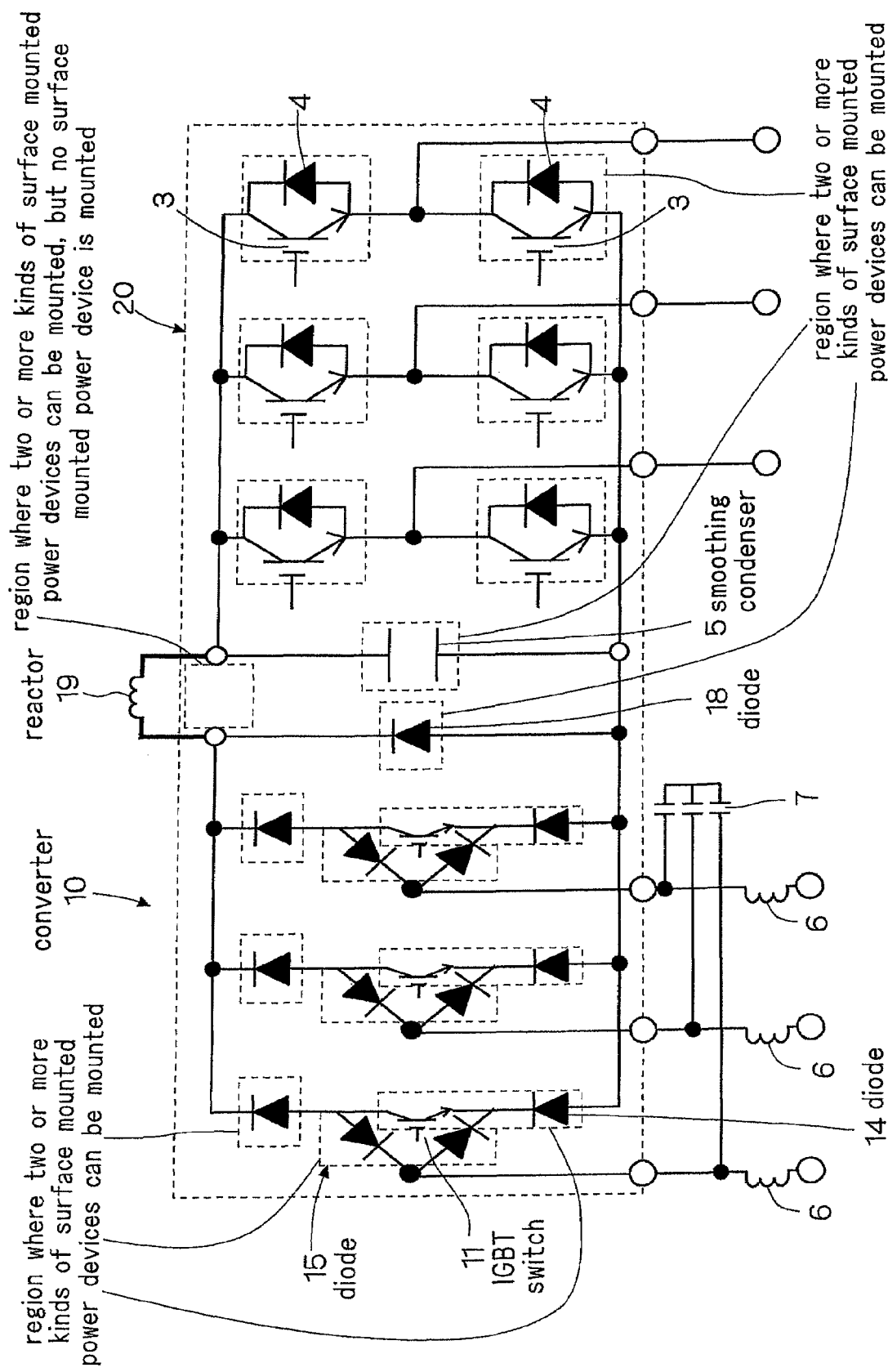
FIG. 23 is a schematic diagram of another arrangement example of a third type of a power module.

(2) A three phase-three phase power module illustrated in FIG. 23 comprises 13 surface mounted diodes 14, 15 and 3 surface mounted IGBT switches 11 on grid side for constituting a back type of converter 10, and 6 surface mounted diodes 4 and 6 surface mounted IGBT switches 3 on load side. By controlling 3 IGBT switches 11, harmonic component currents on grid side are reduced, and the DC link voltage is controlled from zero volts to a voltage exceeding the maximum input voltage so as to assume the pulse amplitude modulation (PAM), and by increasing the DC voltage within the high power region, the rated current of the IGBT switch 3 of the inverter on load side and the rated current of the diode 4 of the inverter on load side are reduced. A diode 18 is connected in parallel to the serial circuit constituted of the surface mounted IGBT switch 11 and a pair of diodes 14 for forward connection, and a reactor 19 is connected between the diode 18 and the smoothing capacitor 5. Therefore, stepping-down operation can be carried out. A reactor 6 is connected in the input side, and a capacitor 7 is connected between terminals on input side.

Figure 49:
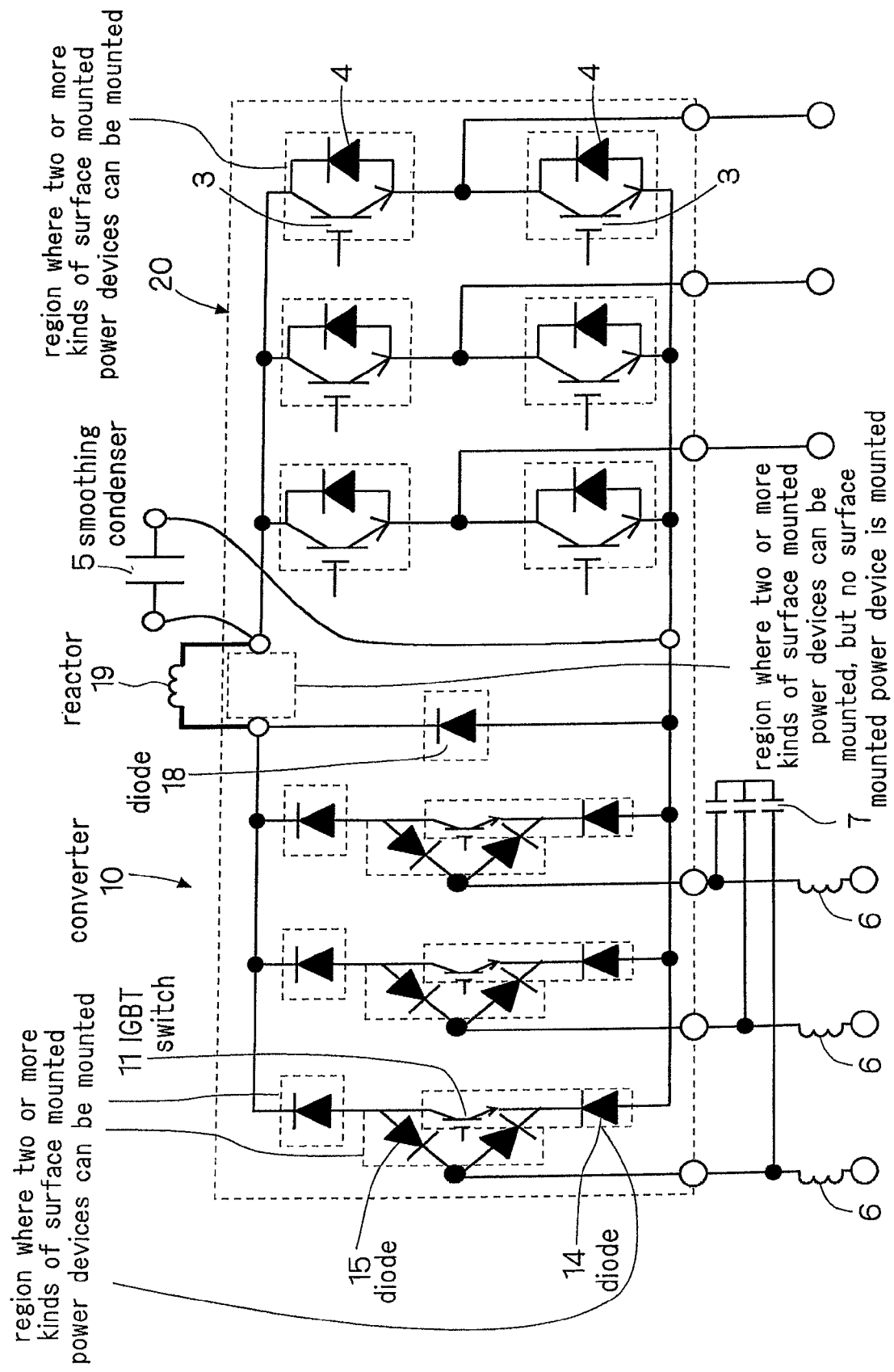
FIG. 49 is a schematic diagram of a modified example of the power module illustrated in FIG. 23.

A three phase-three phase power module of FIG. 49 is different from the three phase-three phase power module of FIG. 23 only in that the smoothing capacitor 5 is connected from outside through the junction sections (lead wires). Therefore, by controlling 3 IGBT switches 11, harmonic component currents on grid side are reduced, and the DC link voltage is controlled from zero volts to a voltage exceeding the maximum input voltage so as to assume the pulse amplitude modulation (PAM). By increasing the DC voltage within the high power region, the rated current of the IGBT switch 3 of the inverter on load side and the rated current of the diode 4 of the inverter on load side are reduced. A diode 18 is connected in parallel to the serial circuit constituted of the surface mounted IGBT switch 11 and a pair of diodes 14 for forward connection, and a reactor 19 is connected between the diode 18 and the smoothing capacitor 5. Therefore, stepping-down operation can be carried out. A reactor 6 is connected in the input side, and a capacitor 7 is connected between terminals on input side.

Figure 24:
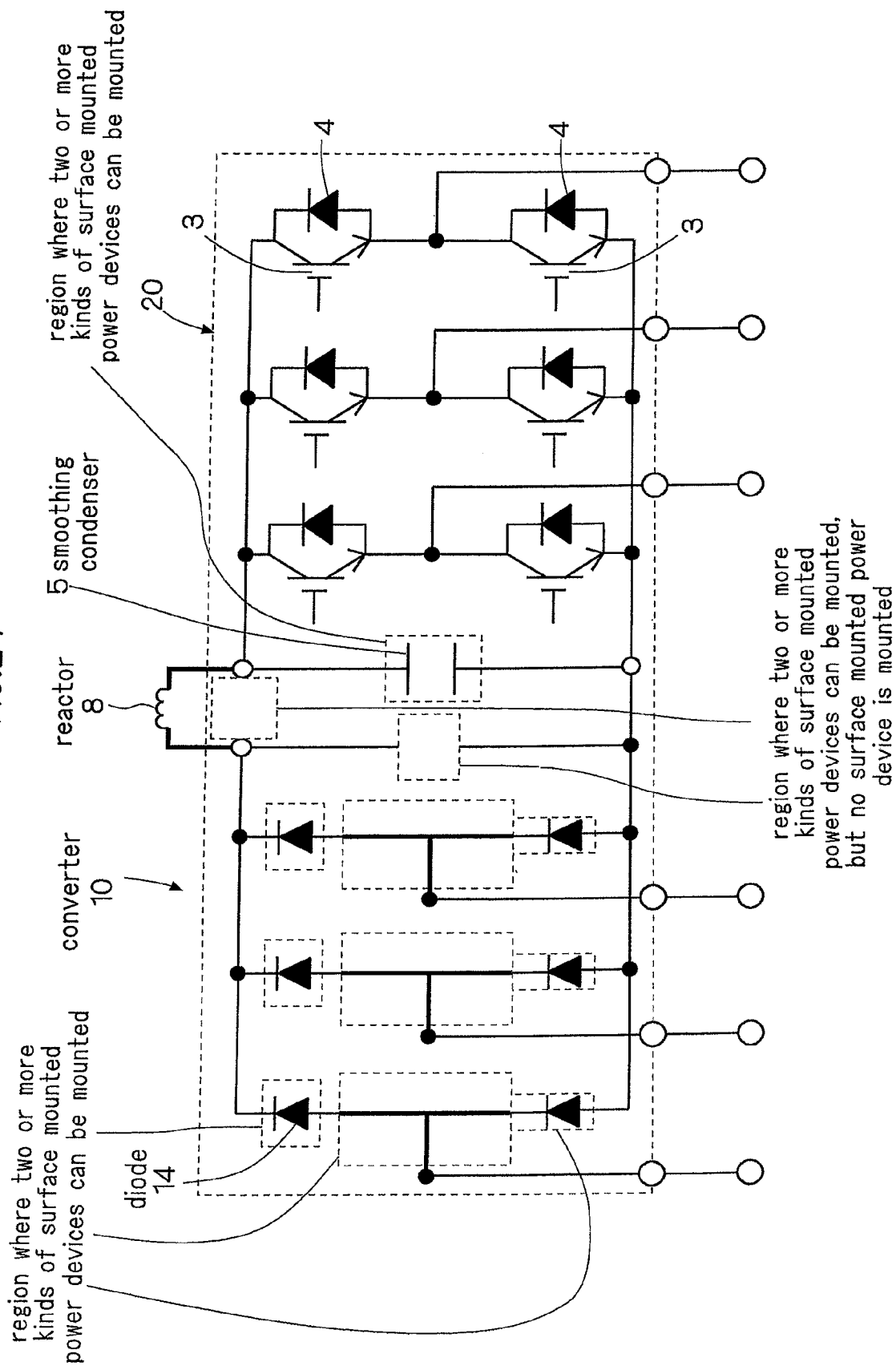
FIG. 24 is a schematic diagram of a further arrangement example of a third type of a power module.

(3) A three phase-three phase power module illustrated in FIG. 24 is constituted of 6 surface mounted diodes 14 of a converter 10 on and side, and 6 surface mounted diodes 4 on load side and 6-surface mounted IGBT switches 3 on load side. The three phase-three phase power module is employed for applications in which only efficiency is taken into consideration. A reactor 8 is connected from outside between the converter 10 on grid side and the smoothing capacitor 5, instead providing the reactor 6 on input side of the converter 10 on grid side.

Figure 50:
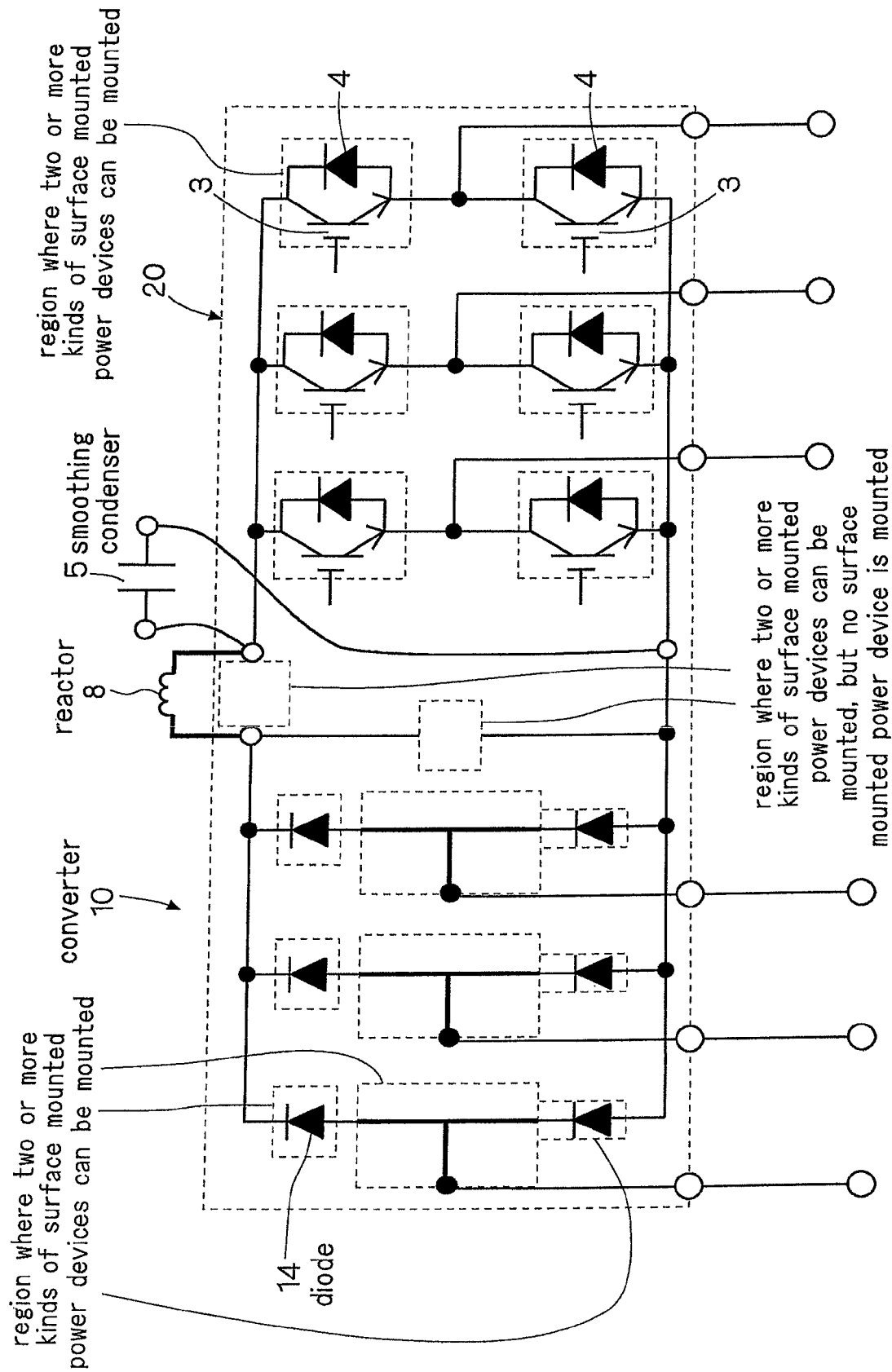
FIG. 50 is a schematic diagram of a modified example of the power module illustrated in FIG. 24.

A three phase-three phase power module of FIG. 50 is different from the three phase-three phase power module of FIG. 24 only in that the smoothing capacitor 5 is connected from outside through the junction sections (lead wires). Therefore, the three phase-three phase power module is employed for applications in which only efficiency is taken into consideration. A reactor 8 is connected from outside between the converter 10 on grid side and the smoothing capacitor 5, instead providing the reactor 6 on input side of the converter 10 on grid side.

Figure 25:
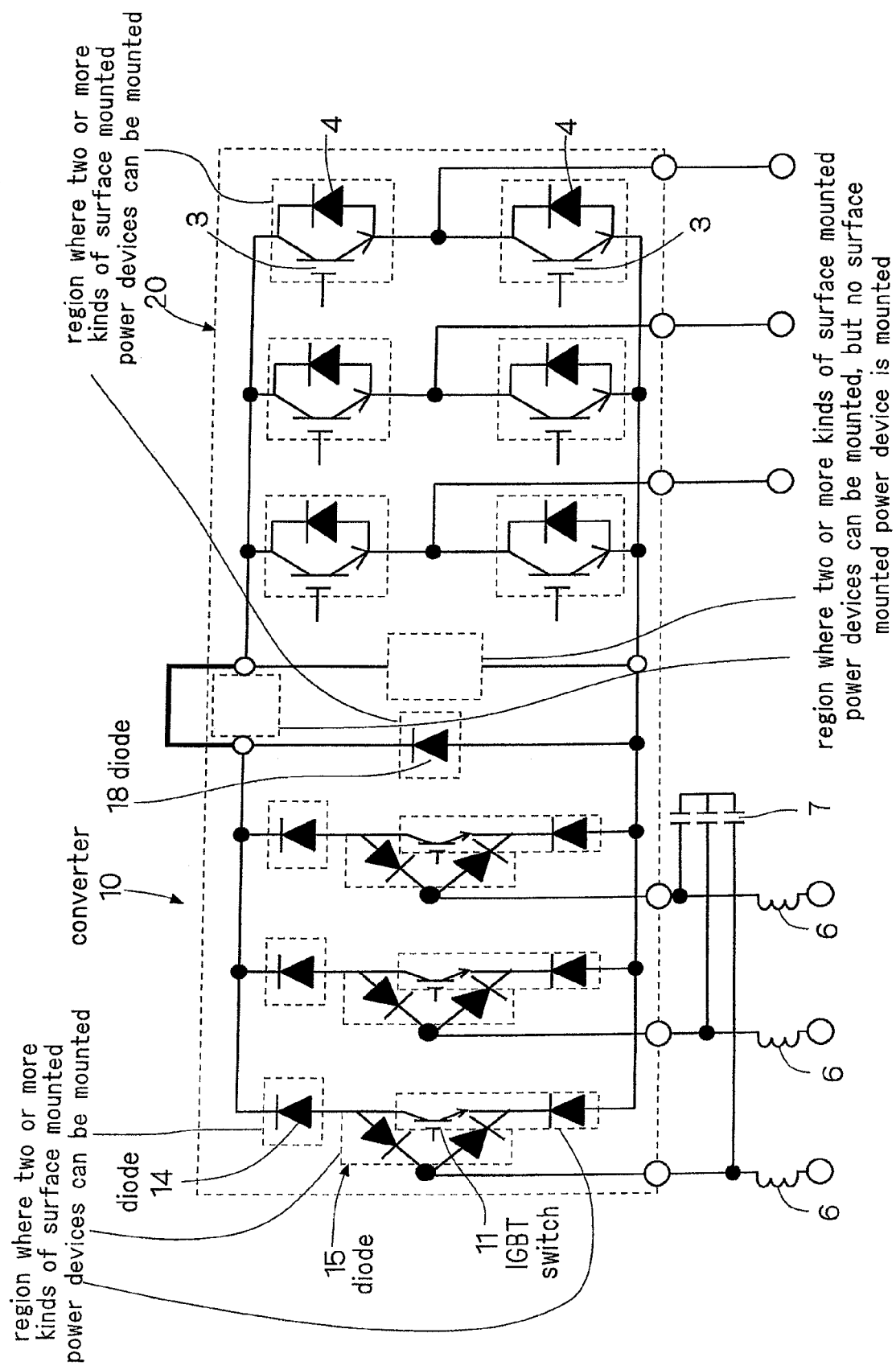
FIG. 25 is a schematic diagram of a further arrangement example of a third type of a power module.

(4) A three phase-three phase power module illustrated in FIG. 25 is an extended version of the circuit of FIG. 23. Specifically, a reactor 18 and a smoothing capacitor 5 are omitted. It is employed for fully removing a reactor and a capacitor from the circuit topology. The three phase-three phase power module is proposed for applications in which IEC regulation is effective.

The proposed three phase-three phase power module can be modified to a single phase-three phase power module by changing only the type of a surface mounted power device according to the requirement of the following specific applications.

Figure 26:
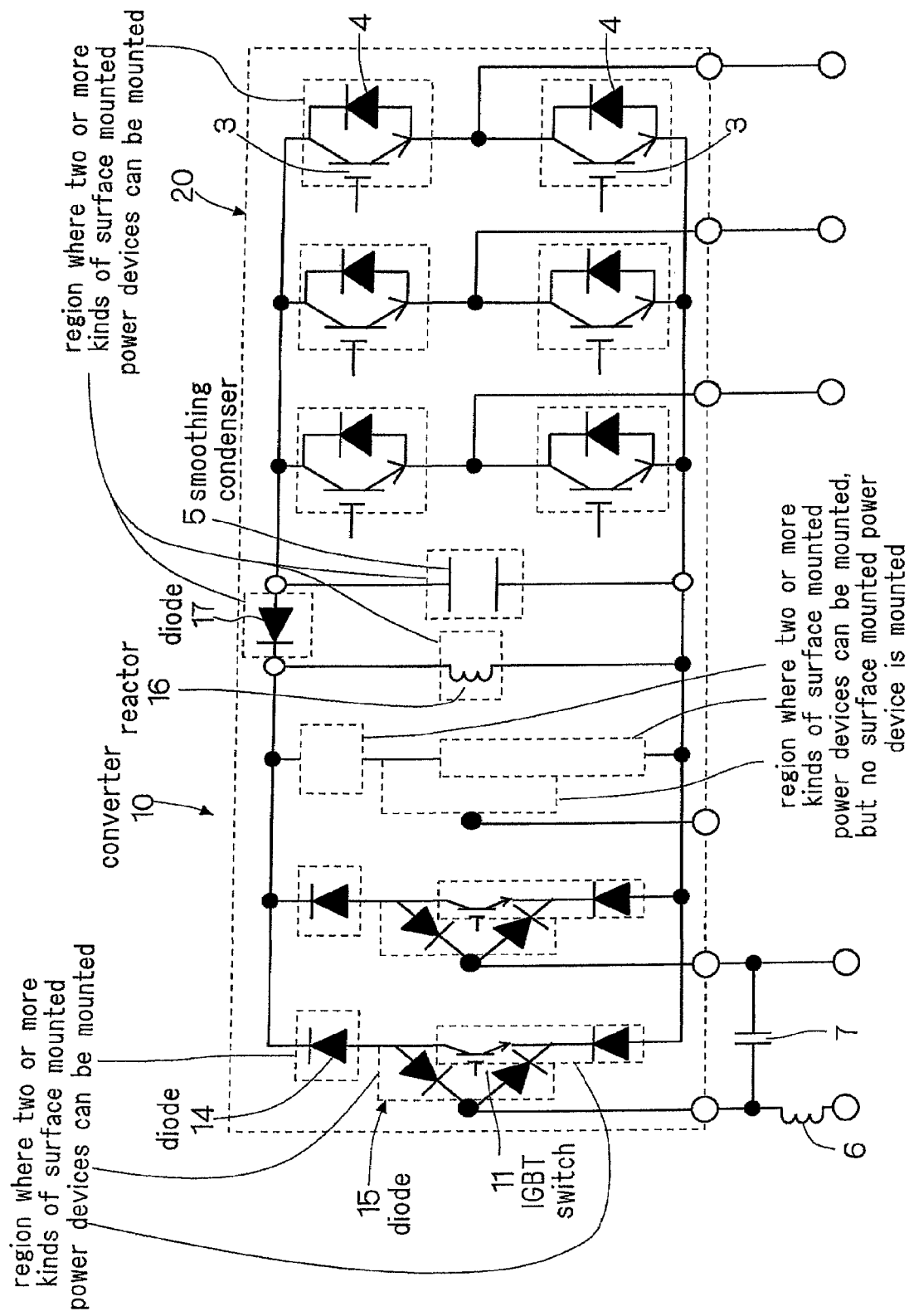
FIG. 26 is a schematic diagram of a further arrangement example of a third type of a power module.

(1) A single phase-three phase power module of FIG. 26 comprises 8 surface mounted diodes 14, 15 and 2 surface mounted IGBT switches 11 on grid side for constituting a back boost type of converter 10, and 6 surface mounted diodes 4 and 6 surface mounted IGBT switches 3 for an inverter 20 on load side. By controlling 2 IGBT switches 11, harmonic component currents on grid side are reduced, and the DC link voltage is controlled for reducing the rated current of the IGBT and the diode of the inverter on load side for applications in which IEC regulation is effective. A reactor 16 is connected in parallel to the serial circuit constituted of the surface mounted IGBT switch 11 and a pair of diodes 14 for forward connection, and a diode 17 is reversely connected between the reactor 16 and the smoothing capacitor 5. Therefore, step up-down operations can be carried out. A reactor 6 is connected in the input side, and a capacitor 7 is connected between terminals on input side.

Figure 51:
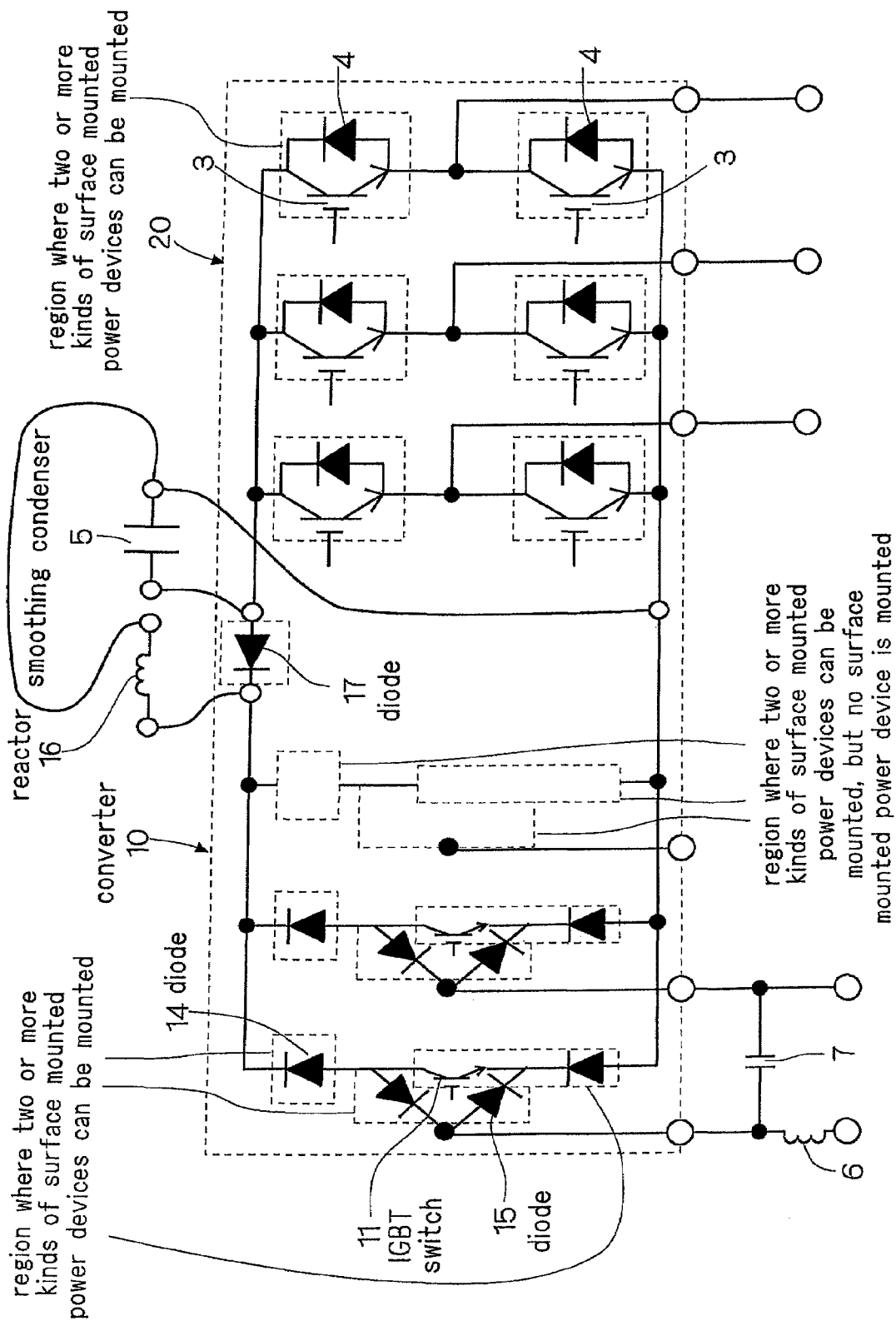
FIG. 51 is a schematic diagram of a modified example of the power module illustrated in FIG. 26.

A single phase-three phase power module of FIG. 51 is different from the single phase-three phase power module of FIG. 26 only in that the smoothing capacitor 5 and the reactor 16 are connected from outside through the junction sections (lead wires). Therefore, by controlling 2 IGBT switches 11, harmonic component currents on grid side are reduced, and the DC link voltage is controlled for reducing the rated current of the IGBT and the diode of the inverter on load side for applications in which IEC regulation is effective. A reactor 16 is connected in parallel to the serial circuit constituted of the surface mounted IGBT switch 11 and a pair of diodes 14 for forward connection, and a diode 17 is reversely connected between the reactor 16 and the smoothing capacitor 5. Therefore, step up-down operations can be carried out. A reactor 6 is connected in the input side, and a capacitor 7 is connected between terminals on input side.

Figure 27:
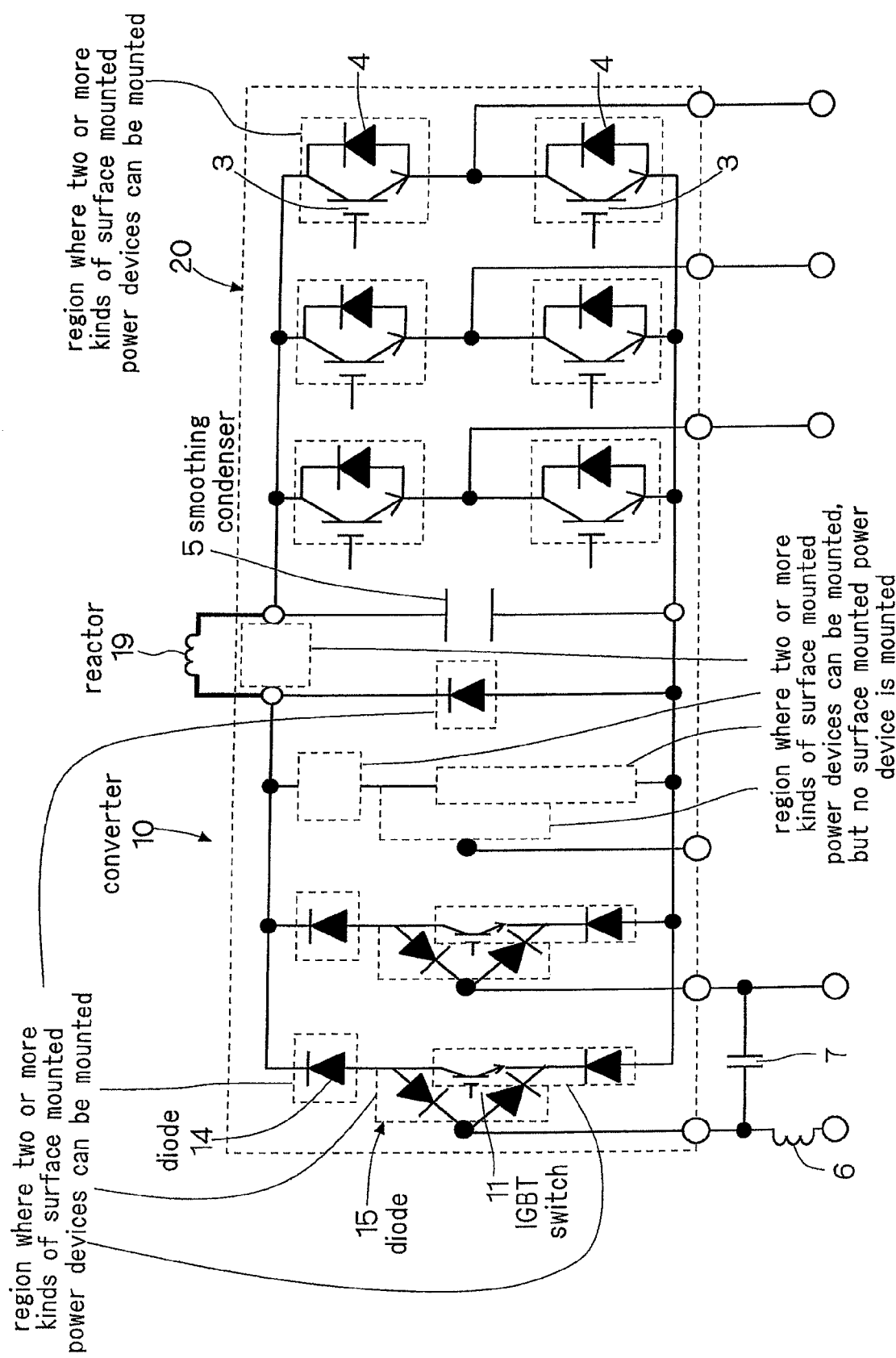
FIG. 27 is a schematic diagram of a further arrangement example of a third type of a power module.

(2) A single phase-three phase power module of FIG. 27 comprises 8 surface mounted diodes 14, 15 and 2 surface mounted IGBT switches 11 on grid side for constituting a back type of converter 10, and 6 surface mounted diodes 4 and 6 surface mounted IGBT switches 3 for an inverter 20 on load side. By controlling 2 IGBT switches 11, harmonic component currents on grid side are reduced, and the DC link voltage is controlled for reducing the rated current of the IGBT and the diode of the inverter on load side for applications in which IEC regulation is effective. A diode 18 is connected in parallel to the serial circuit constituted of the surface mounted IGBT switch 11 and a pair of diodes 14 for forward connection, and a reactor 19 is reversely connected between the diode 18 and the smoothing capacitor 5. Therefore, stepping-down operation can be carried out. A reactor 6 is connected in the input side, and a capacitor 7 is connected between terminals on input side.

Figure 52:
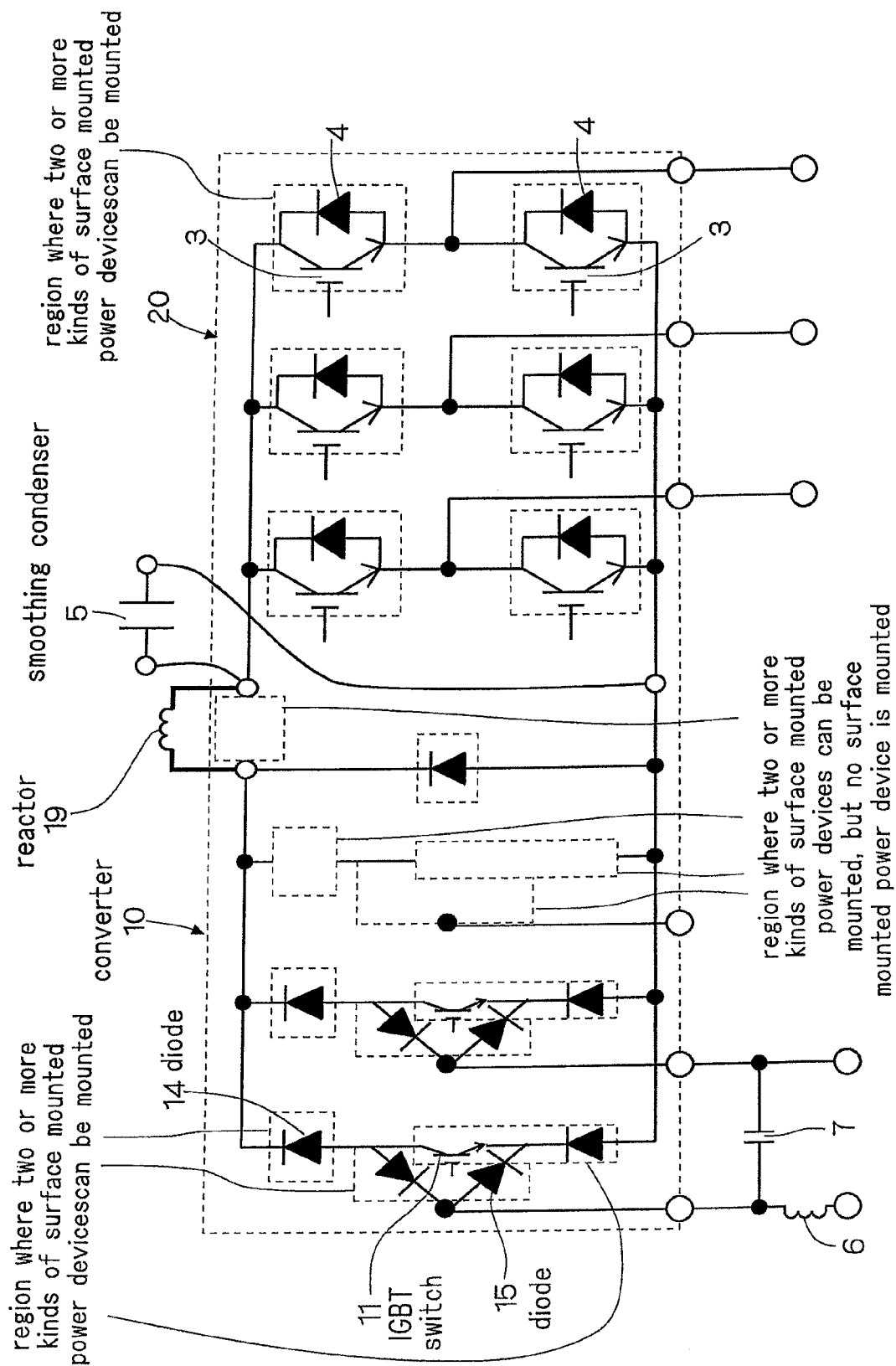
FIG. 52 is a schematic diagram of a modified example of the power module illustrated in FIG. 27.

A single phase-three phase power module of FIG. 52 is different from the single phase-three phase power module of FIG. 27 only in that the smoothing capacitor 5 is connected from outside through the junction sections (lead wires). Therefore, stepping-down operation can be carried out. A reactor 6 is connected in the input side, and a capacitor 7 is connected between terminals on input side.

Figure 28:
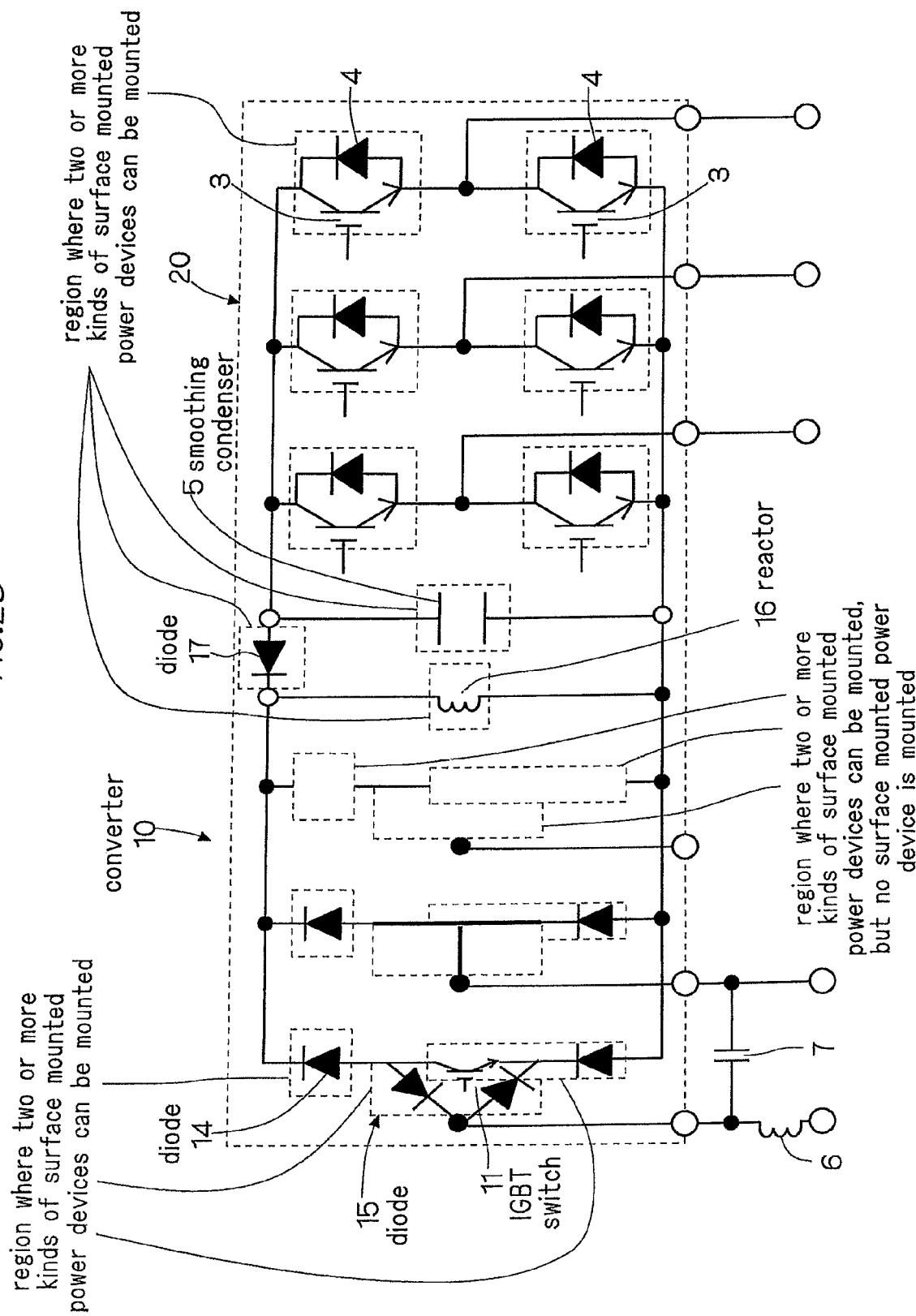
FIG. 28 is a schematic diagram of a further arrangement example of a third type of a power module.
Figure 53:
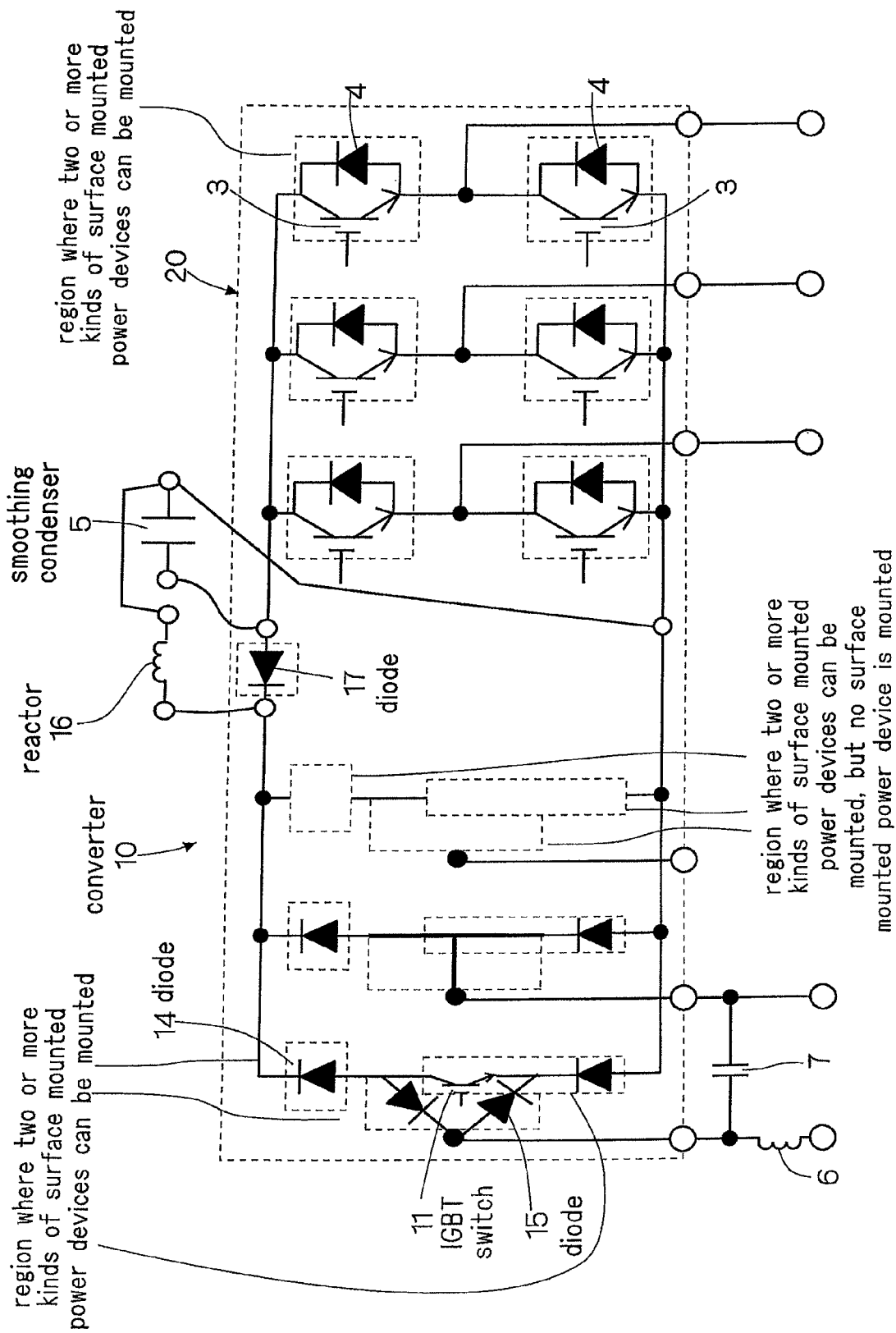
FIG. 53 is a schematic diagram of a modified example of the power module illustrated in FIG. 28.

(3) A single phase-three phase power module of FIG. 28 comprises 6 surface mounted diodes 14, 15 and one surface mounted IGBT switch 11 on grid side for constituting a back boost type of converter 10, and 6 surface mounted diodes 4 and 6 surface mounted IGBT switches 3 for an inverter 20 on load side. By controlling one IGBT switch 11, harmonic component currents on grid side are reduced, and the DC link voltage is controlled for reducing the rated current of the IGBT and the diode of the inverter on load side for applications in which IEC regulation is effective. A reactor 16 is connected in parallel to the serial circuit constituted of the surface mounted IGBT switch 11 and a pair of diodes 14 for forward connection, and a diode 17 is reversely connected between the reactor 16 and the smoothing capacitor 5. Therefore, step up-down operations can be carried out. A reactor 6 is connected in the input side, and a capacitor 7 is connected between terminals on input side. A single phase-three phase power module of FIG. 53 is different from the single phase-three phase power module of FIG. 28 only in that the smoothing capacitor 5 and the reactor 16 are connected from outside through the junction sections (lead wires). Therefore, step up-down operations can be carried out. A reactor 6 is connected in the input side, and a capacitor 7 is connected between terminals on input side.

Figure 29:
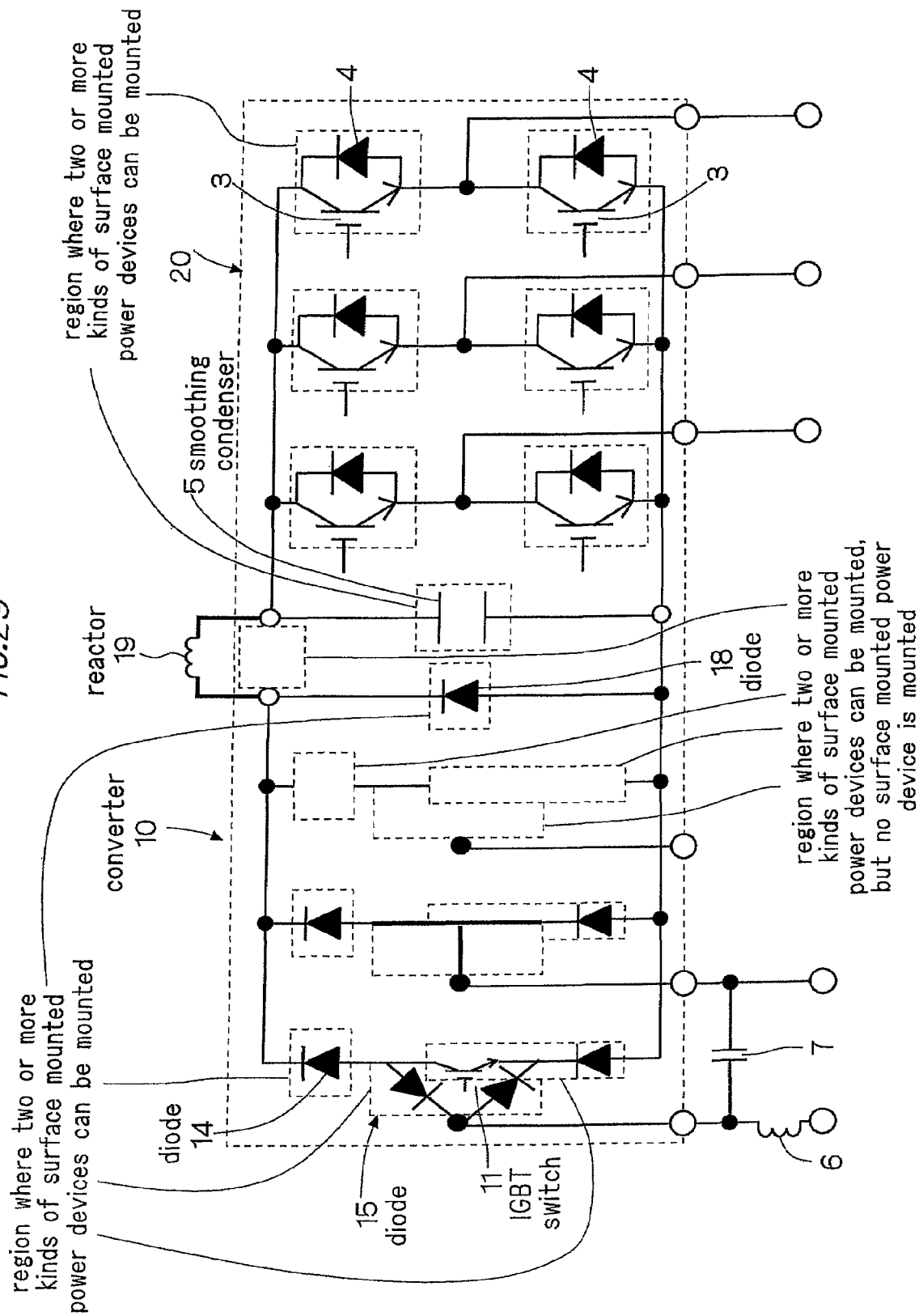
FIG. 29 is a schematic diagram of a further arrangement example of a third type of a power module.

(4) A single phase-three phase power module of FIG. 29 comprises 6 surface mounted diodes 14, 15 and one surface mounted IGBT switch 11 on grid side for constituting a back type of converter 10, and 6 surface mounted diodes 4 and 6 surface mounted IGBT switches 3 for an inverter 20 on load side. By controlling one IGBT switch 11, harmonic component currents on grid side are reduced, and the DC link voltage is controlled for reducing the rated current of the IGBT and the diode of the inverter on load side for applications in which IEC regulation is effective. A diode 18 is connected in parallel to the serial circuit constituted of the surface mounted IGBT switch 11 and a pair of diodes 14 for forward connection, and a reactor 19 is reversely connected between the diode 18 and the smoothing capacitor 5. Therefore, stepping-down operation can be carried out. A reactor 6 is connected in the input side, and a capacitor 7 is connected between terminals on input side.

Figure 54:
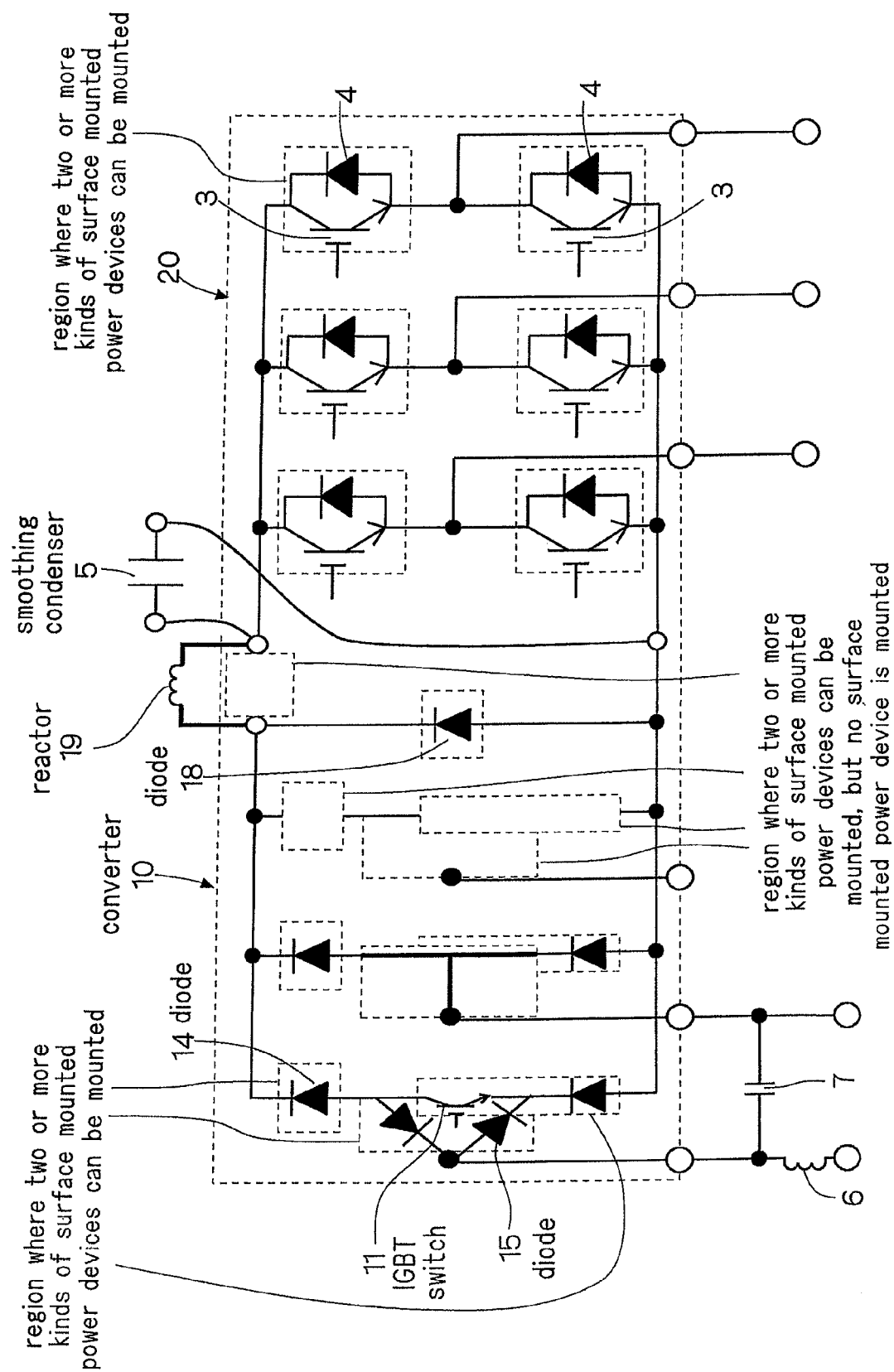
FIG. 54 is a schematic diagram of a modified example of the power module illustrated in FIG. 29.

A single phase-three phase power module of FIG. 54 is different from the single phase-three phase power module of FIG. 29 only in that the smoothing capacitor 5 is connected from outside through the junction sections (lead wires). Therefore, stepping-down operation can be carried out. A reactor 6 is connected in the input side, and a capacitor 7 is connected between terminals on input side.

Figure 30:
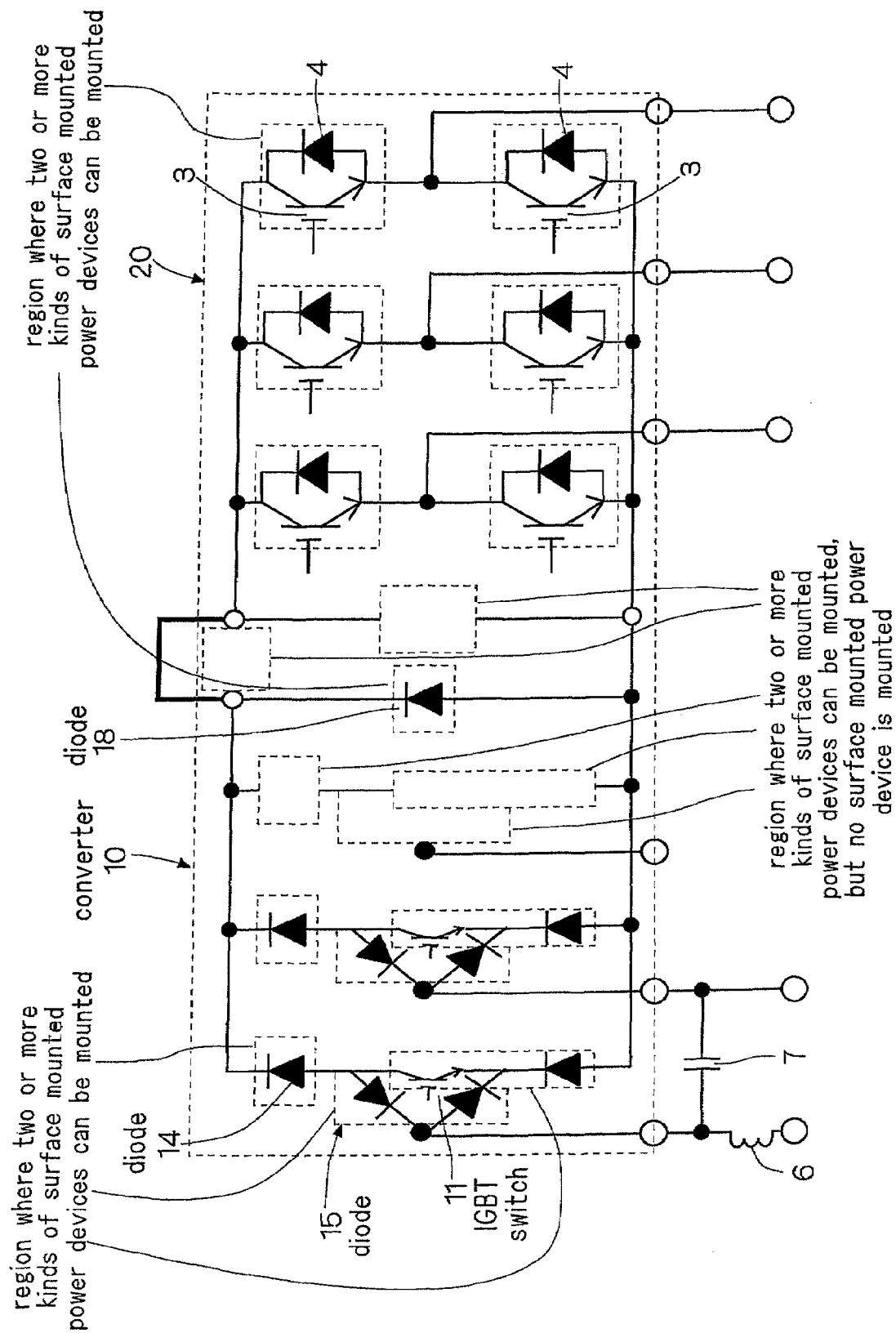
FIG. 30 is a schematic diagram of a further arrangement example of a third type of a power module.

(5) A single phase-three phase power module illustrated in FIG. 30 is an extended version of the circuit of FIG. 27. Specifically, a smoothing capacitor 5 and a reactor 19 are omitted. It is employed for fully removing a reactor and a capacitor from the circuit topology for applications in which IEC regulation is effective.

Figure 31:
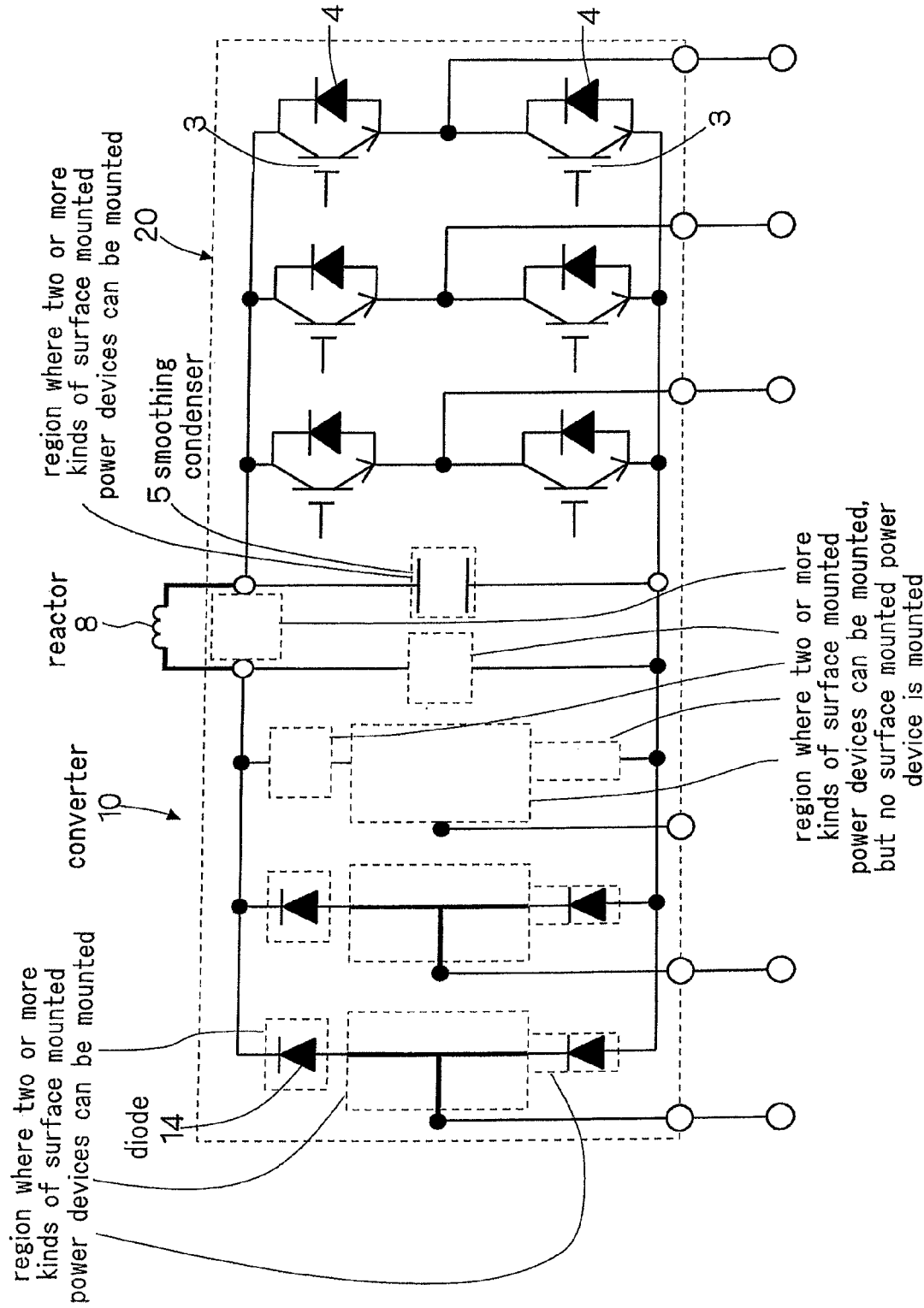
FIG. 31 is a schematic diagram of a further arrangement example of a third type of a power module.

(6) A single phase-three phase power module illustrated in FIG. 31 comprises 4 surface mounted diodes 14 for a converter 10 on grid side, and 6 surface mounted diodes 4 and 6 surface mounted IGBT switches 3 for an inverter 20 on load side. The single phase-three phase power module is employed for applications in which only efficiency is taken into consideration. A reactor 8 is connected from outside between the converter 10 on grid side and the smoothing capacitor 5, instead providing the reactor 6 in input side of the converter 10 on grid side.

The control of the converter and the control of the inverter in each of the above power modules are known from the past, therefore detailed description is omitted.

The first aspect has characteristic effect such that various power modules such as a power module for multiple phase-multiple phase conversion, a power module for single phase-multiple phase conversion, and the like, can easily be realized. The second aspect has characteristic effect such that various power modules such as a power module for three phase-three phase conversion, a power module for single phase-three phase conversion, and the like, can easily be realized.

The third aspect has characteristic effect such that various power modules such as a power module for three phase-three phase conversion, a power module for single phase-three phase conversion, and the like, can easily be realized.

The fourth aspect has characteristic effect such that various power module can also and easily be realized which can satisfy the IEC regulation for harmonic current emissions.

The fifth aspect has characteristic effect such that various power module can also and easily be realized which can satisfy the IEC regulation for harmonic current emissions.

The sixth aspect has characteristic effect such that various power modules such as a power module for three phase-three phase conversion, a power module for single phase-three phase conversion, and the like, can easily be realized.

The seventh aspect has characteristic effect such that various power module can also and easily be realized which can satisfy the IEC regulation for harmonic current emissions.

The eighth aspect has characteristic effect such that various power module can also and easily be realized which can satisfy the IEC regulation for harmonic current emissions.

The ninth aspect has characteristic effect such that various power modules such as a power module for three phase-three phase conversion, a power module for single phase-three phase conversion, and the like, can easily be realized.

The tenth aspect has characteristic effect such that harmonic components of power source are reduced by the reactor. Also, effects similar to those of the third aspect or sixth aspect can be realized.

The eleventh aspect has characteristic effect such that harmonic components of power source are reduced by the reactor. Also, effects similar to those of the ninth aspect can be realized.

The twelfth aspect has characteristic effect such that step up-down in voltage can be realized. Also, effects similar to those of the eighth aspect can be realized.

The thirteenth aspect has characteristic effect such that stepping-down in voltage can be realized. Also, effects similar to those of the eighth aspect can be realized.

The fourteenth aspect has characteristic effect such that various power modules such as a power module for multiple phase-multiple phase conversion, a power module for single phase-multiple phase conversion, and the like, can easily be realized.

The fifteenth aspect has characteristic effect such that various power modules such as a power module for three phase-three phase conversion, a power module for single phase-three phase conversion, and the like, can easily be realized.

The sixteenth aspect has characteristic effect such that various power modules such as a power module for three phase-three phase conversion, a power module for single phase-three phase conversion, and the like, can easily be realized.

The seventeenth aspect has characteristic effect such that various power modules such as a power module for three phase=three phase conversion, a power module for single phase-three phase conversion, and the like, can easily be realized.

The eighteenth aspect has characteristic effect such that various power module can also and easily be realized which can satisfy the IEC regulation for harmonic current emissions. Also, effects similar to those of the sixteenth aspect can be realized.

The nineteenth aspect has characteristic effect such that various power module can also and easily be realized which can satisfy the IEC regulation for harmonic current emissions. Also, effects similar to those of the sixteenth aspect can be realized.

The twentieth aspect has characteristic effect such that various power modules such as a power module for three phase-three phase conversion, a power module for single phase-three phase conversion, and the like, can easily be realized.

The 21st aspect has characteristic effect such that various power module can also and easily be realized which can satisfy the IEC regulation for harmonic current emissions. Also, effects similar to those of the sixteenth aspect can be realized.

The 22nd aspect has characteristic effect such that various power module can also and easily be realized which can satisfy the IEC regulation for harmonic current emissions. Also, effects similar to those of the sixteenth aspect can be realized.

The 23rd aspect has characteristic effect such that various power modules such as a power module for three phase-three phase conversion, a power module for single phase-three phase conversion, and the like, can easily be realized.

The 24th and 25th aspects have characteristic effect such that harmonic components of power source are reduced by the reactor. Also, effects similar to those of the seventeenth aspect or twentieth aspect can be realized.

The 26th aspect has characteristic effect such that harmonic components of power source are reduced by the reactor. Also, effects similar to those of the 23rd aspect can be realized.

The 27th aspect has characteristic effect such that step up-down in voltage can be realized. Also, effects similar to those of the 22nd aspect can be realized.

The 28th aspect has characteristic effect such that stepping-down in voltage can be realized. Also, effects similar to those of the 22nd aspect can be realized.

What is claimed is:

1. An AC/AC power converter configured to be mounted on a substrate, the AC/AC power converter comprising:
    a plurality of input ends;
    a plurality of output ends;
    first and second direct-current power lines;
    a multiple-phase converter including
        a first diode having its anode connected to one of said input ends and its cathode connected to said first direct-current power line,
        a second diode having its anode connected to said second direct-current power line and its cathode connected to said one of said input ends connected to the anode of said first diode, and
        a switching part selectively connecting another one of said input ends to either said first direct-current power line or said second direct-current power line,
        at least one phase of the multiple phase converter consisting only of said first diode and said second diode;
    at least one smoothing capacitor connected between said first direct-current power line and said second direct-current power line; and
    a multiple-phase inverter connected between said first and second direct-current power lines and said plurality of output ends.

2. The AC/AC power converter as set forth in claim 1, wherein
    said multiple-phase converter is a three phase converter,
    said smoothing capacitor includes two smoothing capacitors, and
    said multiple-phase inverter is a three-phase inverter.

3. The AC/AC power converter as set forth in claim 1, wherein
    said smoothing capacitor includes two smoothing capacitors connected in series between said first direct-current power line and said second direct-current power line, and
    said switching part includes
        a third diode having its cathode connected to said first direct-current power line;
        a fourth diode having its anode connected to said second direct-current power line;
        a transistor connected between cathode of said third diode and anode of said fourth diode; and
        a diode bridge establishing a connection of said another one of said plurality of input ends, a point between said two smoothing capacitors, and the emitter and collector of said transistor.

4. The AC/AC power converter as set forth in claim 3, wherein
    the point between said two smoothing capacitors and one of said plurality of output ends are connected.

5. The AC/AC power converter as set forth in claim 1, wherein
    said one of said plurality of output ends and said another one of said plurality of input ends are connected.

6. The AC/AC power converter as set forth in claim 1, wherein
    said switching part includes
        a third diode having its cathode connected to said first direct-current power line;
        a fourth diode having its anode connected to said second direct-current power line;
        a transistor connected between cathode of said third diode and anode of said fourth diode;
        a fifth diode having its anode connected to said another one of said plurality of input ends and its cathode connected between the cathode of said fourth diode and said transistor; and
        a sixth diode having its anode connected between the anode of said third diode and said transistor, and its cathode connected to said another one of said plurality of input ends.

7. The AC/AC power converter as set forth in claim 6 further comprising
    a reactor connected between said first direct-current power line and said second direct-current power line; and a seventh diode provided on said first direct-current power line and having its anode connected to said smoothing capacitor and its cathode connected to said reactor.

8. The AC/AC power converter as set forth in claim 6, further comprising a seventh diode having its anode connected to said second direct-current power line and its cathode connected to said first direct-current power line; and a reactor provided on said first direct-current power line and connected between said seventh diode and said smoothing capacitor.

9. The AC/AC power converter as set forth in claim 1, wherein said smoothing capacitor is connected outside on said substrate.

* * * * *